(12) United States Patent
Arellano et al.

(10) Patent No.: US 9,982,097 B2
(45) Date of Patent: May 29, 2018

(54) THIN FILM SELF ASSEMBLY OF TOPCOAT-FREE SILICON-CONTAINING DIBLOCK COPOLYMERS

(71) Applicant: International Business Machines Corporation, Armonk, NY (US)

(72) Inventors: Noel Arellano, Fremont, CA (US); Teddie P. Magbitang, San Jose, CA (US); Daniel P. Sanders, San Jose, CA (US); Kristin Schmidt, Mountain View, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 15/041,095

(22) Filed: Feb. 11, 2016

(65) Prior Publication Data
US 2017/0233532 A1 Aug. 17, 2017

(51) Int. Cl.
| | | |
|---|---|---|
| C08G 64/18 | (2006.01) |
| C08G 63/08 | (2006.01) |
| C09D 169/00 | (2006.01) |
| C08G 81/02 | (2006.01) |
| G03F 7/00 | (2006.01) |
| B05D 7/00 | (2006.01) |
| B05D 3/02 | (2006.01) |
| H01J 37/32 | (2006.01) |
| C09D 125/08 | (2006.01) |
| C09D 167/04 | (2006.01) |
| C09D 187/00 | (2006.01) |
| C09D 125/18 | (2006.01) |
| C08G 65/08 | (2006.01) |
| C08G 64/02 | (2006.01) |

(52) U.S. Cl.
CPC ......... *C08G 81/027* (2013.01); *B05D 3/0254* (2013.01); *B05D 7/544* (2013.01); *C08G 63/08* (2013.01); *C08G 64/0233* (2013.01); *C08G 64/18* (2013.01); *C08G 65/08* (2013.01); *C09D 125/08* (2013.01); *C09D 125/18* (2013.01); *C09D 167/04* (2013.01); *C09D 169/00* (2013.01); *C09D 187/005* (2013.01); *G03F 7/0002* (2013.01); *H01J 37/32009* (2013.01); *C08F 2438/01* (2013.01)

(58) Field of Classification Search
CPC .............................. C08G 64/18; C08G 63/08
See application file for complete search history.

(56) References Cited

U.S. PATENT DOCUMENTS

| | | |
|---|---|---|
| 3,547,861 A | 12/1970 | Anello |
| 5,071,921 A * | 12/1991 | Eichenauer ............ C08G 64/18 525/186 |
| 5,391,667 A | 2/1995 | Dellinger |
| 6,403,744 B1 | 6/2002 | Akama et al. |
| 8,778,201 B2 | 7/2014 | Asakawa et al. |
| 8,822,588 B2 | 9/2014 | Terui et al. |
| 8,900,467 B1 | 12/2014 | Chapuis et al. |
| 8,900,562 B2 | 12/2014 | Mecozzi et al. |
| 9,574,107 B2 | 2/2017 | Cheng et al. |
| 2004/0092686 A1 | 5/2004 | Feiring et al. |
| 2011/0151566 A1 | 6/2011 | Hedrick et al. |
| 2013/0266780 A1* | 10/2013 | Ellison ............... C08G 63/6952 428/201 |
| 2014/0148012 A1 | 5/2014 | Guillorn et al. |
| 2015/0018476 A1 | 1/2015 | Thompson et al. |
| 2015/0197594 A1 | 7/2015 | Xu et al. |
| 2015/0197607 A1 | 7/2015 | Montarnal et al. |
| 2016/0237307 A1 | 8/2016 | Cheng et al. |
| 2016/0244557 A1* | 8/2016 | Vora ....................... C08G 63/08 |
| 2017/0114246 A1 | 4/2017 | Arellano et al. |

OTHER PUBLICATIONS

Hexemer, et al., "A SAXS/WAXS/GISAXS Beamline with Multilayer Monochromator", J. of Physics: Conference Series 247 (2010) 012007, pp. 1-11.

J. Ilavsky, et al., "Irena: tool suite for modeling and analysis of small-angle scattering", J. Applied Crystallography, 2009, 42, 347-353.

Liu, et al., "Chemical Patterns for Directed Self-Assembly of Lamellae-Forming Block Copolymers with Density Multiplication of Features", 2013, 46, 1415-1424.

Rathore, et al., "A Photocurable, Photoluminescent, Polycarbosilane Obtained by Acyclic Diene Metathesis (ADMET) Polymerization", Macromolecules, 2009, 42, 4614-4621.

Zhou, et al., "Synthesis and properties of novel biodegradable triblock copolymers of poly(5-methyl-5-methoxycarbonyl-1,3-dioxan-2-one) and poly(ethylene glycol)", Polymer 45 (2004) 5459-5463.

* cited by examiner

*Primary Examiner* — David J Buttner
(74) *Attorney, Agent, or Firm* — Michael R. Roberts

(57) ABSTRACT

A high-chi diblock copolymer (BCP) for self-assembly comprises a first block comprising repeat units of trimethylsilyl styrene (TMSS) and styrene, and a second block comprising an aliphatic carbonate repeat unit. The blocks are linked together by a fluorinated junction group L' in which none of the fluorines of L' are covalently bound to an atomic center of the polymer backbone. A top-coat free film layer comprising the BCP, which is disposed on an underlayer and in contact with an atmosphere, is capable of forming a perpendicularly oriented lamellar domain pattern on an underlayer that is preferential or non-preferential to the domains of the block copolymer. The domain pattern can be selectively etched to provide a relief pattern comprising a remaining domain. The relief pattern having good critical dimensional uniformity compared to an otherwise identical polymer lacking the silicon.

26 Claims, 24 Drawing Sheets

Self-Assemble

Selective domain removal

Selective Domain Removal

Transfer

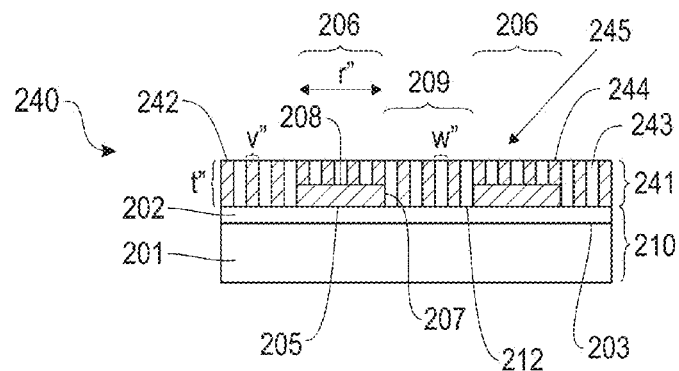
Selective Domain Removal
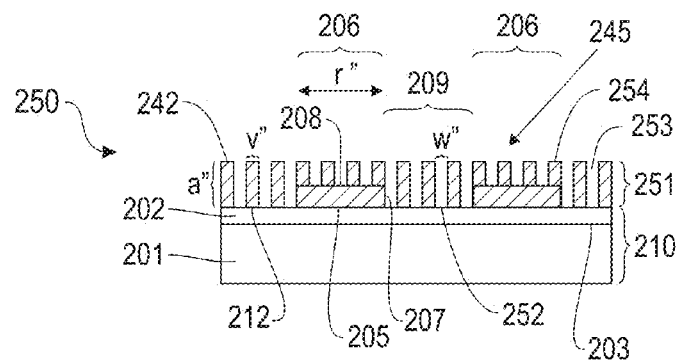
Transfer

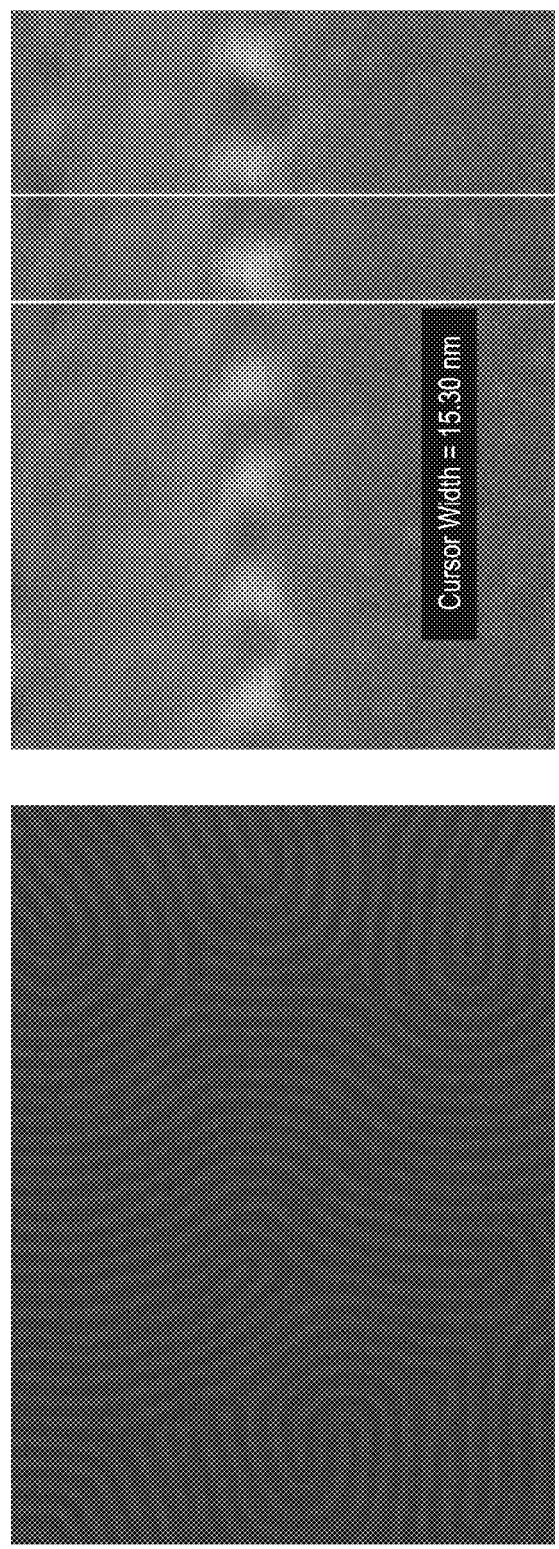

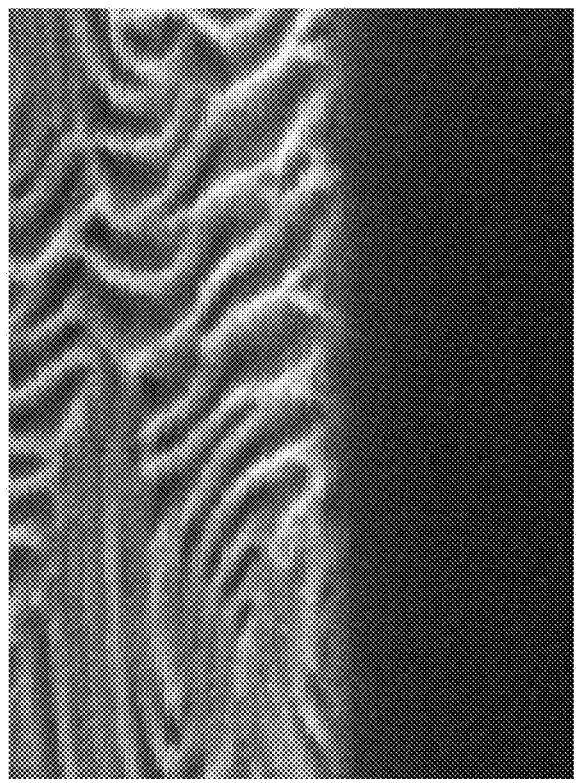
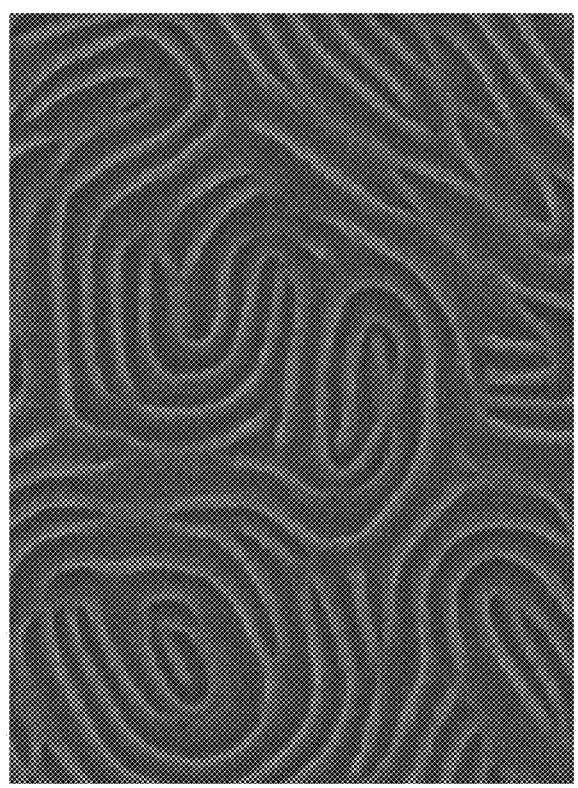
Example 70
Thin Film Ex. 65, formulation F-8, BCP-7, 0% Si
X-section SEM after O2 etch
FIG. 19C
Top Down SEM after O2 etch
FIG. 19B Example 71
Thin Film Ex. 67, formulation F-10, BCP-8, 10.4% Si Top Down SEM after O2 etch X-section SEM after O2 etch

THIN FILM SELF ASSEMBLY OF TOPCOAT-FREE SILICON-CONTAINING DIBLOCK COPOLYMERS

BACKGROUND

The present invention relates to high-chi ($\chi$) silicon-containing diblock copolymers for directed self-assembly (DSA) applications, and more specifically to high-chi ($\chi$) silicon-containing diblock copolymers comprising a fluorinated surface-active linking group (junction group) joining the polymer blocks. Thin film layers of the diblock copolymers are capable of self-assembling to form perpendicularly oriented lamellae and/or cylindrical domain patterns.

In conventional lithography, ultraviolet (UV) radiation can be exposed through a mask onto a photoresist layer coated on a substrate or layered substrate. Positive or negative photoresists are useful and these can also contain a refractory element such as silicon to enable dry development with conventional integrated circuit (IC) plasma processing. In a positive photoresist, UV radiation transmitted through a mask causes a photochemical reaction in the photoresist, such that the exposed regions are removed by a developer solution or by conventional IC plasma processing. Conversely, in negative photoresists, UV radiation transmitted through a mask causes the regions exposed to radiation to become less removable by a developer solution or by conventional IC plasma processing. An integrated circuit feature, such as a gate, via or interconnect, is then etched into the substrate or layered substrate, and the remaining photoresist is removed. When using conventional lithographic exposure processes, the dimensions of features of the integrated circuit feature are limited. Further reduction in pattern dimensions are difficult to achieve with radiation exposure due to limitations related to aberrations, focus, proximity effects, minimum achievable exposure wavelengths and maximum achievable numerical apertures. Directed self-assembly is a promising approach that has been of interest in overcoming some of the drawbacks of conventional lithography as outlined above.

Specifically, directed self-assembly of block copolymers is a method useful for generating smaller patterned features for the manufacture of microelectronic devices in which the critical dimensions (CD) of features are typically on the nano-scale, so that feature sizes from 10 nm to 50 nm can be achieved. Achieving feature sizes below 10 nm using conventional approaches for directed self-assembly of block copolymers is challenging. Directed self-assembly methods such as those based on grapho-epitaxy and chemical epitaxy of block copolymers are desirable for extending the resolution capabilities of lithographic technology.

These techniques can be employed to either enhance conventional lithographic techniques by enabling the generation of patterns with higher resolution and/or improving CD control for EUV, e-beam, deep UV or immersion lithography. The block copolymers for directed self-assembly comprise an etch resistant polymer block and a selectively etchable polymer block, which when coated, aligned and etched on a substrate give regions of high resolution patterns.

Known examples of block copolymers for directed self-assembly are ones capable of microphase segregation and comprise a block rich in carbon (such as styrene) which is resistant to plasma etch, and a block which is highly plasma etchable or removable, which can provide a high resolution pattern definition. Examples of highly etchable blocks can comprise monomers that are rich in oxygen and which do not contain refractory elements, and are capable of forming blocks which are highly etchable, such as methyl methacrylate. The plasma etch gases used in the etching process of defining the self-assembly pattern typically are those used in processes to make integrated circuits (IC). In this manner fine patterns can be created on typical IC substrates compared to conventional lithographic techniques, thus achieving pattern multiplication. However, domain patterns formed by diblock copolymers having a half-pitch <10 nm are also prone to significant etch-induced degradation of the critical dimension uniformity of the domain (e.g., poly (styrene) domain) left by the etch, which is not observed for the same domain composition at higher pitches.

In the grapho-epitaxy directed self-assembly method, a substrate is pre-patterned using conventional lithography (Ultraviolet, Deep UV, and e-beam, Extreme UV (EUV) exposure source) to form topographical features such as a line/space (L/S) or contact hole (CH) pattern. A thin layer of block copolymer for self-assembly is then disposed on the pre-pattern. In an example of L/S directed self-assembly array, the block copolymer can form self-aligned lamellar regions with a sub-lithographic pitch in the trenches between sidewalls of pre-pattern, thus enhancing pattern resolution by subdividing the space in the trench between the topographical lines into finer patterns. Similarly, features such as contact holes can be made denser by using grapho-epitaxy, in which a suitable block copolymer arranges itself by directed self-assembly within an array of pre-patterned holes or pre-patterned posts defined by conventional lithography, thus forming a denser array of regions of etchable and etch resistant domains, which when etched give rise to a denser array of contact holes. In addition, block copolymers can form a single and smaller etchable domain at the center of pre-pattern hole with proper dimension and provide potential shrink and rectification of the hole in pre-pattern. Consequently, grapho-epitaxy has the potential to offer both pattern rectification and pattern multiplication.

In chemo-epitaxy DSA methods, the self-assembly of the block copolymer occurs on a surface that has regions of differing chemical affinity but no or very slight topography to guide the self-assembly process. For example, the chemical pre-pattern could be fabricated using lithography (UV, Deep UV, e-beam, EUV) and nanofabrication process to create surfaces of different chemical affinity in a line and space (L/S) pattern. These areas may present little to no topographical difference, but do present a surface chemical pattern to direct self-assembly of block copolymer domains. This technique allows precise placement of the block copolymer domains of higher spatial frequency than the spatial frequency of the pre-pattern. The aligned block copolymer domains can be subsequently pattern transferred into an underlying layer of the substrate after plasma or wet etch processing. In addition, chemo-epitaxy has the advantage that block copolymer self-assembly can rectify variations in the surface chemistry, dimensions, and roughness of the underlying chemical pattern to yield improved line-edge roughness and CD control in the final self-assembled block copolymer domain pattern. Other types of patterns such as contact holes (CH) arrays can also be generated or rectified using chemo-epitaxy.

The ability of a BCP to phase separate depends in part on the Flory Huggins interaction parameter ($\chi$), written also as "chi" herein. PS-b-PMMA (poly(styrene-block-methyl methacrylate) has been studied extensively for directed self-assembly (DSA) applications. However, the minimum half-pitch of PS-b-PMMA is limited to about 10 nm because of the lower chi parameter between PS and PMMA. To enable further feature miniaturization, a block copolymer with a larger interaction parameter between two blocks (higher chi) is highly desirable.

For lithography applications, orientation of the block copolymer domains perpendicular to the substrate is desirable. For a conventional block copolymer such as PS-b-

PMMA in which both blocks have similar surface energies at the BCP-air interface, this can be achieved by coating and thermally annealing the block copolymer on a layer of non-preferential or neutral material that is grafted or cross-linked at the polymer-substrate interface. Due to larger difference in the interaction parameter between the domains of higher-χ block copolymers, it is important to control both BCP-air and BCP-substrate interactions. Many orientation control strategies for generating perpendicularly oriented BCP domains have been implemented with higher-χ BCPs. For example, solvent vapor annealing has been used for orientation control of polystyrene-b-polyethylene oxide (PS-b-PEO), polystyrene-b-polydimethylsiloxane (PS-b-PDMS), polystyrene-b-poly(2-vinyl pyridine) (PS-b-P2VP), polylactide-b-poly(trimethylsilylstyrene) PLA-b-PTMSS and PαMS-b-PHOST. Introducing a solvent vapor chamber and kinetics of solvent vapor annealing may complicate DSA processing. Alternatively, the combination of neutral underlayers and topcoat materials has been applied to PS-b-P2VP, PS-b-PTMSS and PLA-b-PTMSS to achieve perpendicular orientation of the polymer domains. However, the additional topcoat materials can increase the process cost and complexity.

There exists a need for a topcoat-free high-chi BCP having a half pitch less than 10 nm that self-assembles when thermally annealed, forming a perpendicularly oriented domain pattern on a range of preferential and non-preferential substrates. Additionally, there is a need for the domain pattern, when selectively etched, to produce a relief pattern of acceptable dimensional uniformity.

SUMMARY

Accordingly, a linear block copolymer is disclosed, comprising:
a first block (block A), wherein block A is a random copolymer chain comprised of about 25-55 mol % of first repeat units of structure (A-2):

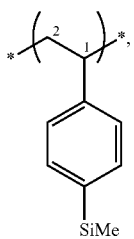

(A-2)

and
about 75-45 mol % of second repeat units of structure (A-3):

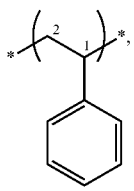

(A-3)

wherein the first repeat units and the second repeat units are covalently linked in block A;
a second block (block B) comprising covalently linked aliphatic repeat units selected from the group consisting of aliphatic carbonate repeat units, aliphatic ester repeat units, aliphatic ether repeat units, and combinations thereof; and
a divalent linking group L' (junction group) which covalently joins an end repeat unit of block A to an end repeat unit of block B;
wherein
the block copolymer has a polymer backbone that includes the atomic centers 1 and 2 of both (A-2) and (A-3), one or more atomic centers of the aliphatic repeat unit of block B, and one or more atomic centers of L',
L' comprises 1-25 fluorines, wherein none of the fluorines of L' is linked to an atomic center of the polymer backbone, and
the block copolymer is capable of self-assembly to form a domain pattern comprising phase-segregated perpendicularly oriented alternating domains, the domains comprising respective chemically distinct blocks of the block copolymer.

Also disclosed is a composition, comprising:
a solvent; and
an above-described block copolymer in contact with in the solvent;
wherein
the composition is capable of forming a film layer comprising the block copolymer, wherein the film layer is capable of self-assembling when thermally annealed, thereby forming a pattern of phase-segregated perpendicularly oriented alternating domains comprising respective chemically distinct blocks of the block copolymer.

Further disclosed is a method, comprising:
providing a first layered structure comprising an underlayer;
forming a film layer comprising an above-described block copolymer disposed on the underlayer, wherein the film layer has a top surface in contact with an atmosphere interface; and
thermally annealing the film layer, thereby forming a second layered structure comprising a self-assembled domain pattern of the block copolymer, the domain pattern comprising phase-segregated perpendicularly oriented alternating domains comprising respective chemically distinct blocks of the block copolymer and having a characteristic pitch (Lo).

Another linear block copolymer for self-assembly is disclosed, comprising:
a first block (block A), wherein block A is a random copolymer chain comprised of about 25-55 mol % of first repeat units of structure (A-2):

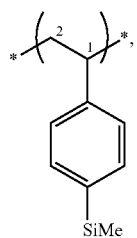

(A-2)

and
about 75-45 mol % of a second repeat units of structure (A-3):

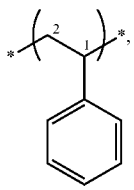

(A-3)

wherein the first repeat units and the second repeat units are covalently linked in block A;
a second block (block B) of which 90-100 mol % is aliphatic carbonate repeat units of structure (A-4):

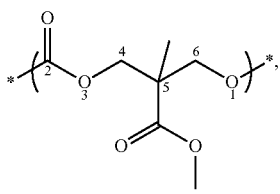

(A-4)

wherein the carbonate repeat units are covalently linked in block B; and
a divalent linking group L' (junction group) which covalently joins an end repeat unit of block A to an end repeat unit of block B;
wherein
the block copolymer has a backbone that includes the atomic centers 1 and 2 of both (A-2) and (A-3), the atomic centers 1-6 of (A-4), and one or more atomic centers of L',
L' comprises 1-25 fluorines, wherein none of the fluorines of L' is linked to an atomic center of the backbone of the block copolymer, and
the block copolymer is capable of self-assembly to form a domain pattern comprising phase-segregated perpendicularly oriented alternating domains, the domains comprising respective chemically distinct blocks of the block copolymer.

Another method is disclosed, comprising:
providing a first multi-layered structure comprising a top surface having a pre-pattern for directing self-assembly of an above-described block copolymer;
forming a film layer comprising the block copolymer disposed on the top surface of pre-pattern, the film layer comprising a top surface in contact with an atmosphere interface, and the film layer comprising a bottom surface in contact with the top surface of the pre-pattern; and
inducing the block copolymer of the film layer to self-assemble using a thermal treatment, thereby forming a second multi-layered structure comprising a domain pattern of phase-segregated perpendicularly oriented self-assembled domains of the block copolymer, the domains comprising respective chemically distinct blocks of the block copolymer, the domains disposed on the top surface of the pre-pattern.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 7A to 7E are cross-sectional layer diagrams showing a process of forming a perpendicularly oriented lamellar domain pattern with the disclosed BCPs comprising a fluorinated linking group L' using a chemo-epitaxial pre-pattern.

FIGS. 18A-18B are top-down and cross-sectional views of scanning electron micrograph (SEM) images of the etched domain pattern formed using thin film Example 55 (8 wt % silicon in block A) after selective removal of the polycarbonate domain, described in Example 69.

FIGS. 19A-19C are top-down and cross-sectional views of scanning electron micrograph (SEM) images of the etched domain pattern of thin film Example 65 (0 wt % silicon in block A) after selective removal of the polycarbonate domain, described in Example 70.

DETAILED DESCRIPTION

Figure 1:
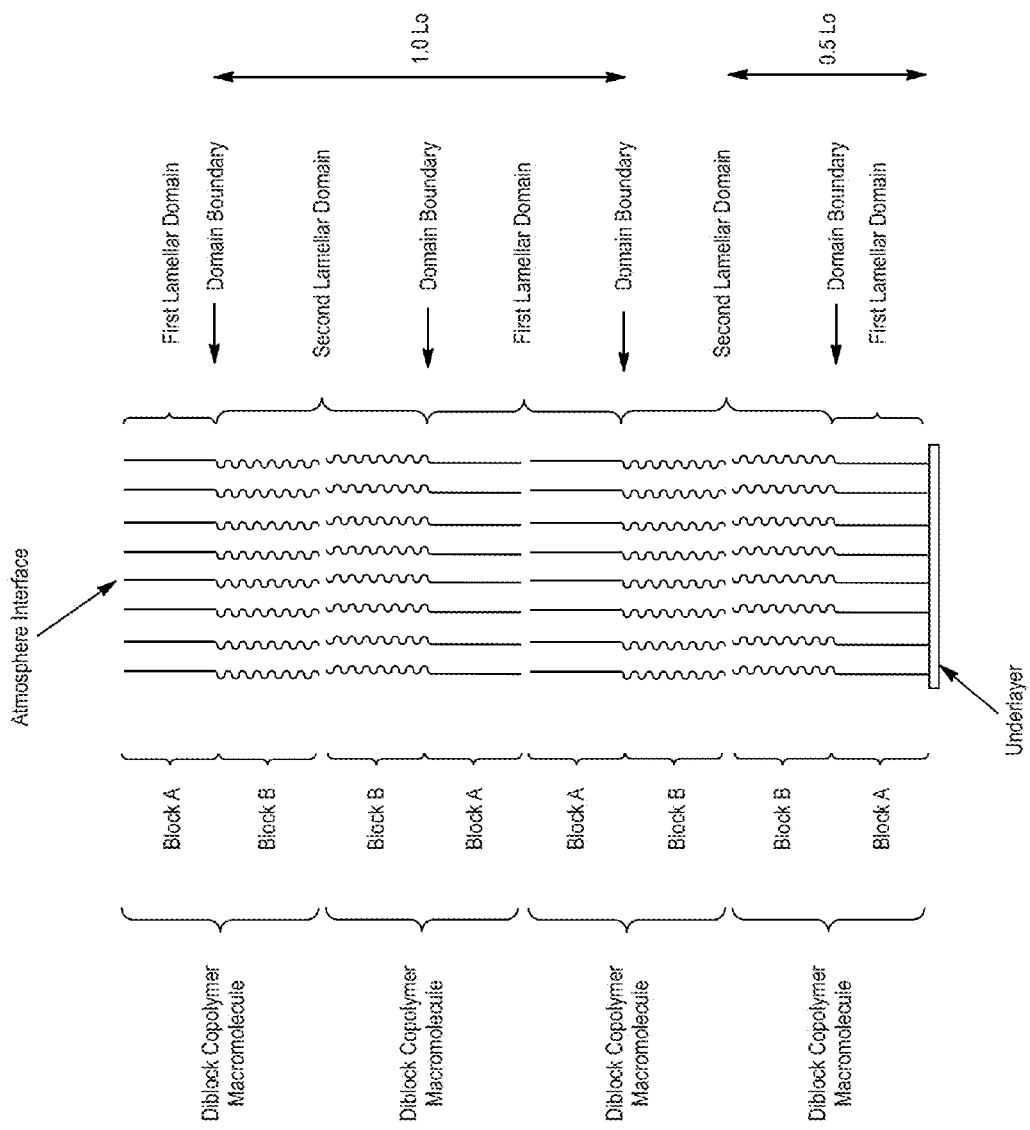
FIG. 1 is a schematic cross-sectional representation of parallel oriented lamellar domains of a self-assembled diblock copolymer. The main plane of each lamellar domain is parallel to the main plane of the underlayer surface.

Disclosed are high-chi linear AB-type block copolymers comprising a first polymer block (block A) comprising units formed by vinyl polymerization of trimethylsilyl styrene (TMSS) and styrene (Sty), and a second block (block B). Block A can comprise about 25-60 mol % TMSS and about 75-40 mol % styrene, more particularly about 25-55 mol % TMSS and about 75-45 mol % styrene. Block B can comprise an aliphatic carbonate repeat unit (e.g., derived from a cyclic carbonate monomer such as MTC-Me, described below), an aliphatic ester repeat unit (e.g., those derived from a cyclic ester monomer such as D,L-lactide), and/or an aliphatic ether repeat unit (e.g., those derived from a cyclic ether monomer such as a glycidyl ether). In a preferred embodiment, block B comprises an aliphatic carbonate repeat unit formed by ring opening polymerization of cyclic carbonate monomer MTC-Me. Block A is joined to block B by a fluorinated linking group L' (junction group). None of the fluorines of L' is linked directly to an atomic center of the block copolymer backbone. Also disclosed are methods of preparing perpendicularly oriented lamellar domain patterns in a lithographic process by self-assembly of the disclosed block copolymers. Domain patterns having a pitch greater than about 4 nm, preferably between 4 nm and 28 nm, can be selectively etched to form relief patterns having good critical dimension uniformity.

Self-assembly

The following discussion is directed to diblock copolymers (A-B) but can be applied to block copolymers having additional blocks unless otherwise stated. Diblock copolymers comprise a first block A and a second block B.

An "SA material" is a material capable of self-assembling into compositionally different phase-segregated domains. Self-assembly (SA) refers to a process in which the SA material undergoes phase-segregation to produce a pattern of immiscible solid phase domains under suitable conditions. Self-assembly can be spontaneous upon formation of the SA layer and/or be induced by thermally treating (i.e., annealing) an SA layer comprising an SA material at an elevated temperature for a suitable period of time. Herein, the SA material is a disclosed BCP.

Herein, a surface and/or an atmosphere interface is said to be "non-preferential to", or "non-preferentially wetted by", the domains of a material for self-assembly (SA material) if each domain of the self-assembled SA material has contact with the surface and/or the atmosphere interface after self-assembly. Otherwise, the surface and/or atmosphere interface is said to be "preferential to", or "preferentially wetted by", one of the domains of the self-assembled SA material. For example, an underlayer surface is preferential to a first domain of a block copolymer if after self-assembly of the block copolymer the first domain has contact with the underlayer surface and a second domain has substantially no contact with the underlayer surface. It should be understood that a given underlayer surface can be non-preferential to the domains of a disclosed block copolymer comprising the L' group, and be preferential to one domain of an otherwise identical self-assembled block copolymer in which all fluorines of L' are replaced by hydrogen. That is, the fluorinated L' group allows both block A and block B to wet an underlayer surface and the atmosphere interface that would otherwise be wetted only by block A or only by block B if the fluorines of L' were replaced by hydrogens.

Herein, a "high-chi" (high-$\chi$) BCP is one in which adjacent blocks have a Flory-Huggins interaction parameter chi ($\chi$) greater than that for a poly(styrene)-b-poly(methyl methacrylate) diblock copolymer (PS-b-PMMA) that self-assembles to form the same domain morphology (i.e., lamellae, cylinders, and so on). The higher the chi parameter, the poorer the miscibility of the different BCP blocks with one another, and the sharper the phase boundaries separating the phase domains containing the different blocks after self-assembly of the BCP. The atmosphere interface is generally preferential to one domain of a high-chi BCP lacking a suitable L' group. When a suitable L' group is present, the atmosphere interface can be non-preferential to the domains of the BCP.

When thermally annealed, a film layer comprising a disclosed BCP can form perpendicularly oriented domain patterns without employing a separate surface active agent in the BCP film layer for orientation control, without utilizing an underlayer having a chemo-epitaxial or graphoepitaxial pre-pattern for orientation control, and without applying a topcoat on the BCP film layer prior to self-assembly. Perpendicularly oriented line patterns can be obtained without solvent annealing, without thermo-solvent annealing (i.e., a combination of thermal and solvent vapor annealing), without electric field alignment, and without external field alignment of the film layer. Film layers comprising a disclosed high-chi BCP in contact with an atmosphere are capable of forming perpendicularly oriented line patterns having a characteristic pitch (Lo) greater than 4 nm, preferably between 4 nm and 28 nm, and more preferably between 4 nm and 20 nm.

Herein, "non-fluorinated" means the chemical formula of a referenced material contains no fluorine. The referenced material can be a polymer, a sub-structure of a polymer such as a repeat unit, functional group, linking group, and so on. A material is "fluorinated" if the chemical formula of the material contains one or more fluorine groups. A material described as containing one or more "fluorines", "fluorine groups", or "fluoride groups" herein means the material has a chemical structure in which one or more monovalent fluorine atoms are covalently bound to carbon(s) of the chemical structure.

Herein, a block copolymer for self-assembly comprises two blocks that are immiscible with one another. Self-assembly of the block copolymer occurs by phase-segregation of the blocks to form a pattern of solid phase domains. Depending on the volume fraction of the blocks, the domain morphology can be lamellar, spherical, cylindrical, and/or bicontinuous cubical. As an example, self-assembly of a diblock copolymer can produce a domain pattern comprising a first lamellar domain containing substantially a first block A of the diblock copolymer and a second lamellar domain containing substantially a second block B of the diblock copolymer. L' can be immiscible with each domain (i.e., L' can reside at the interface of the domains after self-assembly).

The block copolymer has a polymer backbone. Herein, the polymer backbone consists of the covalently linked atomic centers that represent the shortest path of covalent bonds from a first repeat unit at a first end of the block copolymer chain to a last repeat unit at an opposing end of the block copolymer chain, including atomic centers of the linking group L' joining blocks A and B. The block copolymer backbone can include carbon atomic centers (backbone carbons), oxygen atomic centers (backbone oxygens), nitrogen atomic centers (backbone nitrogens), silicon atomic centers (backbone silicons), and so on.

As an example, the block copolymer HBP-1 exemplifies a non-fluorinated linking group L'.

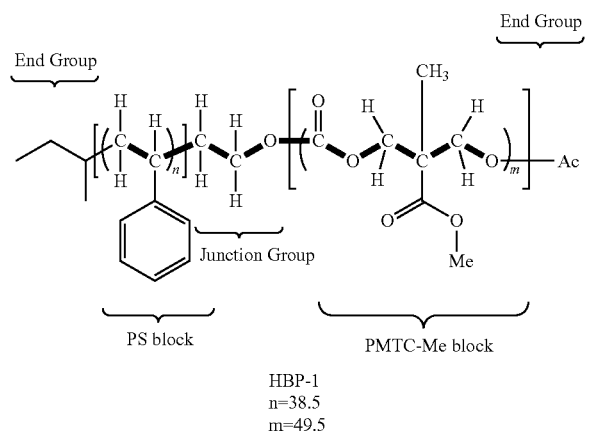

HBP-1
n=38.5
m=49.5

HBP-1 is used as a comparative polymer in the examples further below. HBP-1 has a poly(styrene) (PS) block and a polycarbonate block (PMTC-Me block, derived from ring opening polymerization of MTC-Me). These blocks are linked by an ethylene oxide linking group (junction group). The polymer backbone carbons and backbone oxygens of HBP-1 are shown in bold font linked by bold bonds. The carbons and oxygen of the linking group (junction group) of HBP-1 are atomic centers of the block copolymer backbone. The hydrogens of the linking group are not backbone atoms.

As another example, diblock polymer BCP-2 shown below exemplifies a "linear junction group", meaning each fluorine of the junction group is bonded to a carbon of the block copolymer backbone. The carbons and oxygens of the polymer backbone of BCP-2 are shown in bold font linked by bold bonds. The fluorine groups of the linear junction group are linked to carbons of the polymer backbone. The fluorines, hydrogens, oxygen of the carbonyl group, and methyl carbons of the junction group are not backbone atomic centers of BCP-2.

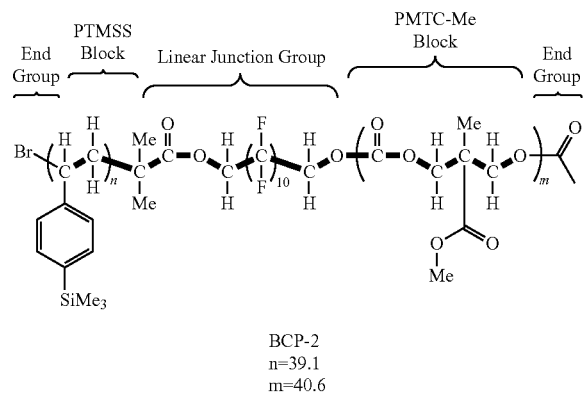

BCP-2
n=39.1
m=40.6

As another example, diblock polymer BCP-1 shown below illustrates a "perpendicular junction group", meaning each fluorine of the junction group is located on a side chain pendent to the block copolymer backbone. That is, none of the fluorines of the junction group is linked to an atomic center of the polymer backbone. The backbone carbons and oxygens of BCP-1 are shown in bold font linked with bold bonds. The fluorine groups of the junction group are linked to a pendent ester side chain. The hydrogens, oxygens of the carbonyl groups, methyl carbons, and the atomic centers of the fluorinated ester side chain are not atomic centers of BCP-1 polymer backbone.

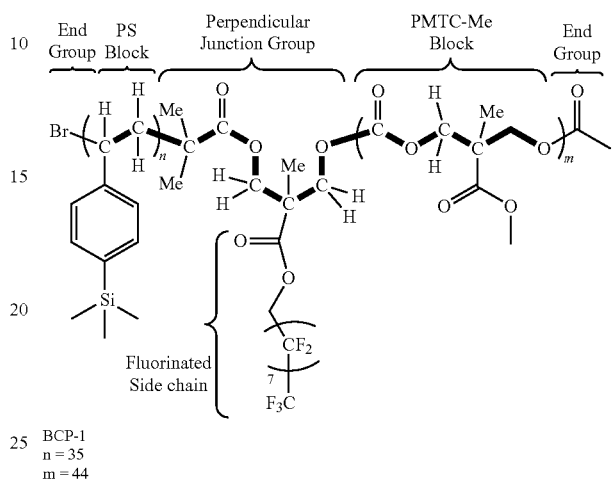

BCP-1
n = 35
m = 44

Herein, an "SA layer" is a layer comprising an SA material. The SA layer is disposed on a top surface of a substrate. The SA layer can comprise one or more of the disclosed BCPs for self-assembly. The SA layer can further comprise additives (e.g., surfactants, auxiliary polymers, thermal acid generators, photo-acid generators) with the proviso that the additives do not adversely affect phase-segregation and orientation of the BCP domains. It should be understood that an SA layer containing only a disclosed BCP is capable of forming perpendicularly oriented lamellar and/or cylindrical domains when the top (e.g., atmosphere) and/or bottom (e.g. underlayer) interfaces of the SA layer are non-preferential to the domains, or preferential to one of the domains, of an otherwise identical self-assembled block copolymer in which all fluorines of L' are replaced by hydrogen. In an embodiment, the SA layer consists of a disclosed BCP.

Herein, any material of the top surface of the substrate that has contact with the bottom of the SA layer is referred to generally as "underlayer material". A layer comprising underlayer material is an "underlayer". The underlayer surface can influence self-assembly of an SA material of the SA layer. Each domain of a self-assembled disclosed BCP containing an L' group can wet the underlayer surface.

Herein, an "atmosphere" is a gas, which can include air and/or one or more other gases at any suitable pressure in contact with the top surface of the SA layer. Preferably, the atmosphere is air. Air is composed of about 21% oxygen ($O_2$) and 78% nitrogen ($N_2$) by volume. In an embodiment, the atmosphere excludes organic gases comprising a C—H bond.

The substrate is the layered structure on which the SA layer is disposed. The substrate has a main plane, which is parallel to the bottom-most layer of the substrate (e.g., a silicon wafer). The substrate can comprise one or more layers of materials arranged in a stack, more specifically materials used in the fabrication of semiconductor devices. As non-limiting examples, the substrate can include a bottom layer (e.g., silicon wafer, metal foil), hard mask layer, dielectric layer, metal oxide layer, silicon oxide layer, silicon nitride, titanium nitride, hafnium oxide, anti-reflection layer (ARC), and/or an underlayer for self-assembly. The SA layer is disposed on the top surface of the substrate, which is typically the top surface of the underlayer. When a resist pattern is formed on the substrate, the substrate includes the resist pattern. In this instance, the SA layer can be disposed in the trenches of the resist pattern and optionally on the top surface of the resist features.

Optionally, the top surface of the substrate can comprise a "grapho-epitaxial pre-pattern" or a "chemo-epitaxial pre-pattern" for directing self-assembly. Each of these pre-patterns can be composed of topographical features (e.g., a resist pattern). A grapho-epitaxial pre-pattern influences self-assembly by the topography and surface properties of the pre-pattern. A chemo-epitaxial pre-pattern can influence self-assembly predominantly by way of the surface properties of different regions of the pre-pattern. No sharp dimensional limits exist between these two pre-pattern categories because the extent of topographical influence on self-assembly is also dependent on the thickness of the SA layer in relation to the underlying relief surface, as well as the annealing conditions (time and temperature) used for self-assembly. In general, when grapho-epitaxial pre-patterns are used, the thickness of the SA layer is less than or equal to the height of the topographical features of the pre-pattern. When chemo-epitaxial pre-patterns are used, the SA layer thickness is greater than any height of the underlying topographical features of the pre-pattern. That is, the SA layer is disposed on the top-most and bottom-most surfaces of the chemical pre-pattern.

The term "interface" refers to a contact boundary between two substantially immiscible phases. Each phase can, independently, be a solid, a liquid, or a gas.

A lamellar or cylindrical domain can be oriented parallel (FIG. 1) or perpendicular (FIG. 2) to the main plane of a reference layer (e.g., the main plane of the SA layer, underlayer, bottom layer of the substrate, or another layer). A lamellar domain has a parallel orientation when the main plane or plate of the lamella is oriented parallel to the main plane of the reference layer. A lamellar domain has a perpendicular orientation when the main plane or plate of the lamella is oriented perpendicular to the main plane of the reference layer. A cylindrical domain has a parallel orientation when the cylinder axis is oriented parallel to the main plane of the reference layer. A cylindrical domain has a perpendicular orientation when the cylinder axis is oriented perpendicular to the main plane of the reference layer.

Perpendicular orientation of lamellar domains is desirable for forming high resolution line patterns by selective etching of a given lamellar domain. Parallel orientation is not desirable for forming high resolution line patterns.

The term "disposed" refers to a layer in contact with a surface of another layer. "Disposing" and "applying" refer to forming a layer so that it is in contact with a surface of another layer, without limitation as to the method employed unless otherwise stated, with the proviso that the desirable characteristics of the disposed or applied layer are obtained, such as uniformity and thickness.

The term "casting" refers to forming a layer of a material by disposing on a surface a solution of the material dissolved in a solvent, and removing the solvent.

Herein, "symmetrical" wetting means the underlayer surface and the atmosphere interface are wetted by the same domain(s) of the self-assembled SA material. "Non-symmetrical" wetting means the underlayer surface and the atmosphere interface are wetted by different domain(s) of the self-assembled SA material.

For typical SA materials (e.g., PS-b-PMMA lacking an L' group) that are thermally annealed for self-assembly, the underlayer surface and the atmosphere interface must be non-preferential to the self-assembled domains in order to achieve perpendicularly oriented lamellar domains, when no other means of influencing orientation are available during self-assembly (e.g., incorporating a separate surface active agent in the SA layer, using a chemical or topographical pre-pattern, applying a topcoat to the SA layer before self-assembly, solvent vapor annealing, thermo-solvent annealing). For these SA materials, when only one interface is non-preferential to the SA material, the lamellar domains tend to orient parallel to the underlayer surface, forming an island/hole morphology having 0.5Lo ("L nought") step height. "Step height" refers to height difference relative to the surrounding SA material. Lo is the characteristic pitch (bulk periodicity) of the domains of the self-assembled SA material. The islands and holes of parallel oriented lamellar domains are detectable in atomic force microscopy (AFM) height images.

The higher the chi parameter of the block copolymer, the smaller the potential Lo of the domain pattern because higher chi allows smaller molecular weight blocks to phase-segregate cleanly. Higher chi can also cause greater mismatch in wetting properties of the underlayer and atmosphere interface with respect to the block copolymer domains. For a typical high-chi block copolymer lacking the L' group (e.g., poly(styrene)-b-poly(trimethylene carbonate) (PS-b-PTMC)) only one domain (e.g., the PS domain) of the self-assembled BCP is capable of "wetting" the atmosphere interface, resulting in morphological structures (i.e., lamellae, cylinders, and so on) having a parallel orientation with respect to the main plane of the SA layer (or the main plane of the bottom layer of the substrate).

The following discussion is focused on lamellar domain patterns formed by self-assembly of a diblock copolymer, but is applicable to other block copolymers (e.g., triblock copolymers) and other domain morphologies (e.g., cylindrical domains). It should be understood that the layer diagrams are intended for illustration purposes and are not drawn to scale or meant to be limiting with respect to the possible structures that can be produced using the below-described processes.

Parallel oriented lamellae are illustrated in the layer diagram of FIG. 1. For typical block copolymers lacking a disclosed L' group, if only the underlayer surface is non-preferential to the domains, both domains initially wet the underlayer surface with 0.5Lo perpendicular lamellae, but eventually form parallel morphology due to the atmosphere (e.g., air) being preferentially wetted by one domain. The resulting island/holes comprising parallel lamellae have 0.5Lo step height. FIG. 1 shows parallel morphology without the islands and holes. The main plate of each lamella is parallel to the main plane of the underlayer surface. In this example, the underlayer and atmosphere interface are preferentially wetted by the domain containing block A. The first lamellar domain comprises block A, and the second lamellar domain comprises block B. The bulk periodicity Lo of the domains is indicated by 1.0Lo (1.0 times Lo). The individual diblock copolymer macromolecules, domain boundaries, and 0.5Lo are also indicated. It should be understood that within a given lamellar domain (e.g., the second lamellar domain) blocks from different polymer macromolecules (e.g., B blocks) can be arranged end-to-end (shown) and/or interwoven (not shown). Each block can have a backbone that is rigid, non-rigid, or of intermediate rigidity. Each block can have any suitable coiling, rotational and/or flexural capability.

Figure 2:
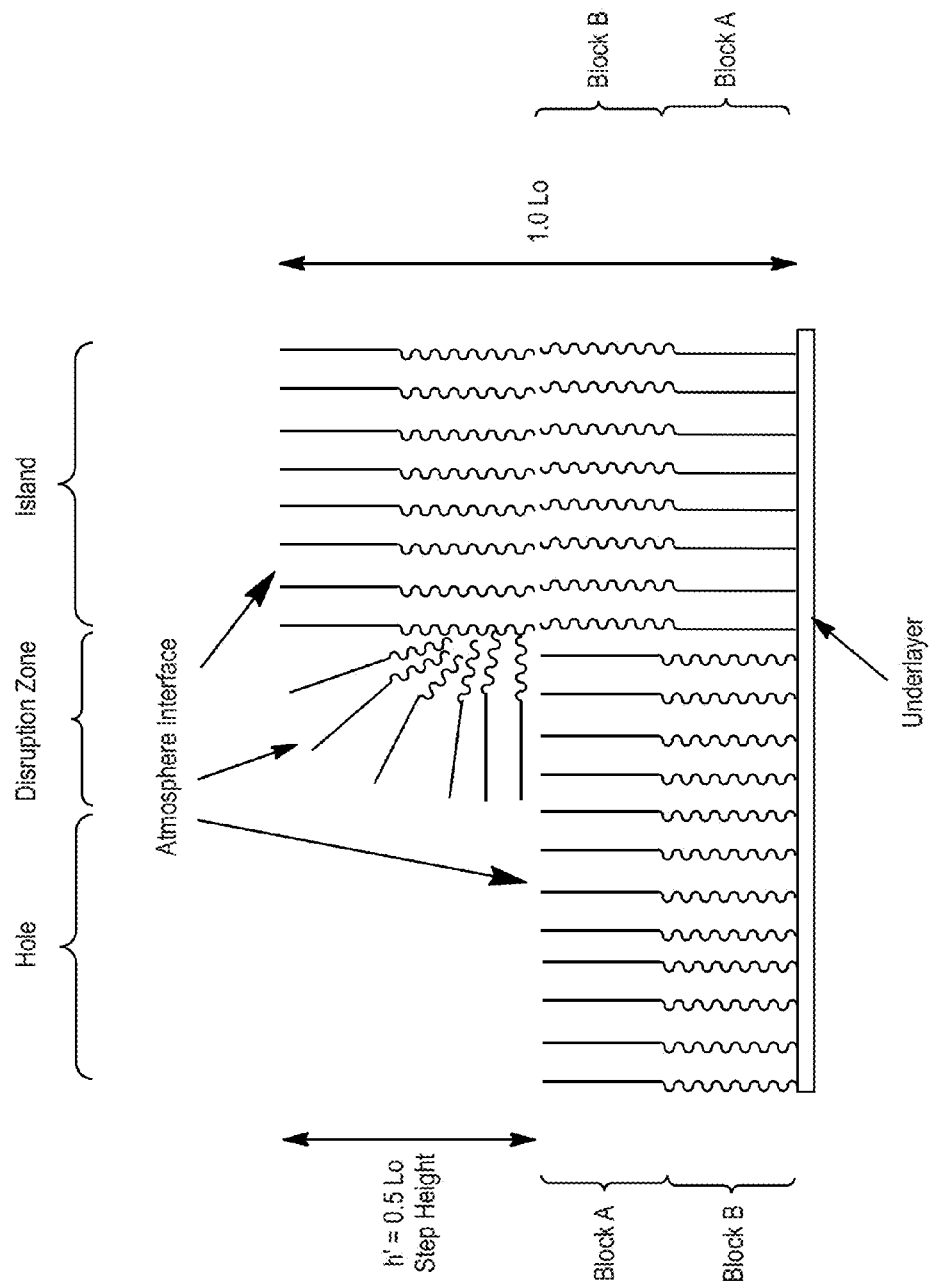
FIG. 2 is a schematic cross-sectional representation of parallel oriented lamellar domains of a self-assembled BCP when the self-assembled layer has islands and holes.

The layer diagram of FIG. 2 illustrates islands and holes formed by a typical high-chi BCP when a planar underlayer is non-preferential to the domains of the BCP and the atmosphere is preferential to one domain of the BCP. The underlayer surface is in contact with each of the domains containing block A and block B, but only the block A domain has contact with the atmosphere. The non-preferential wetting properties of the underlayer surface cause disruptions in the parallel oriented lamellar domains, resulting in the formation of islands and holes having a step height h' by AFM of about 0.5Lo. It should be understood that block A phase-segregates to retain contact with the atmosphere. The disruption zone (the boundary of the hole and the island) can have perpendicular lamellae (not shown).

Figure 3:
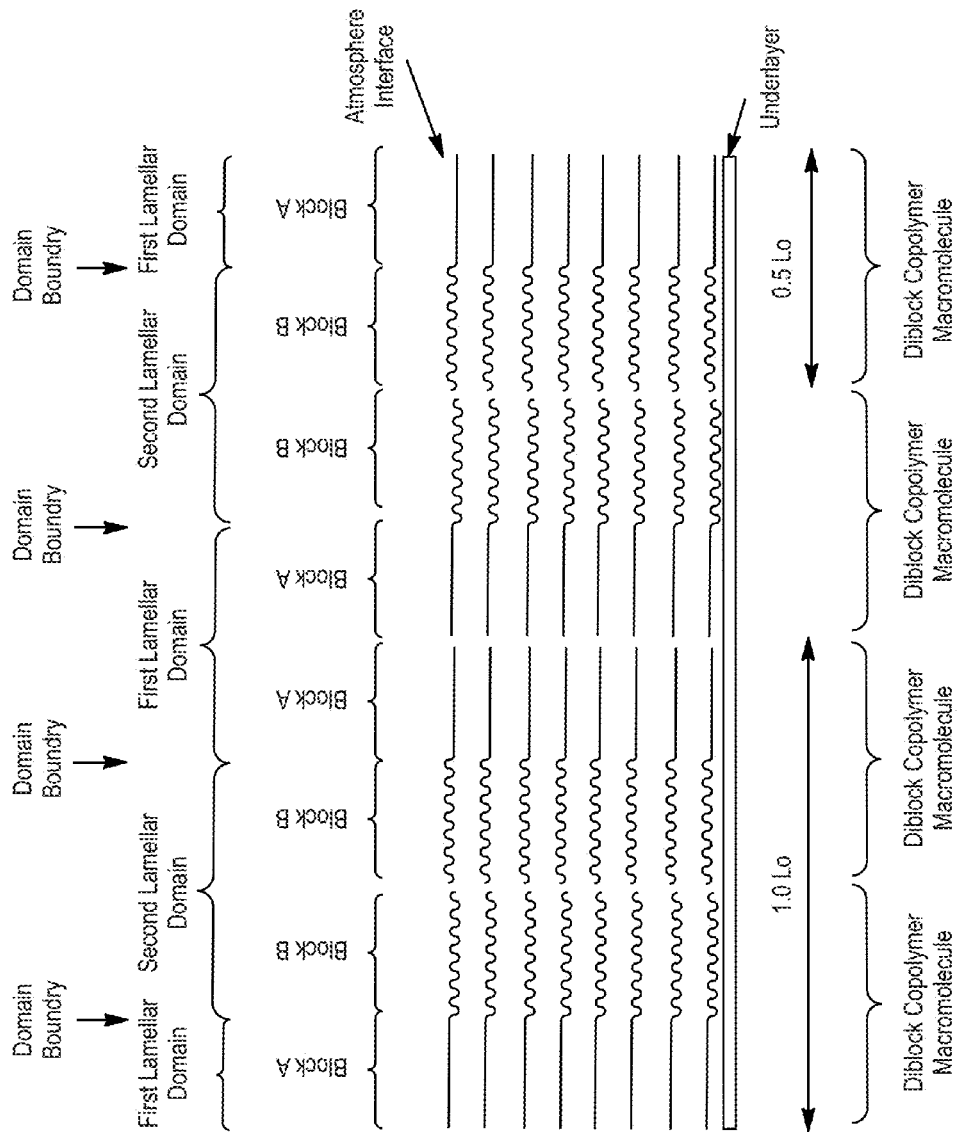
FIG. 3 is a schematic cross-sectional representation of perpendicularly oriented lamellar domains of a self-assembled BCP in which the atmosphere interface and underlayer are non-preferentially wetting to the BCP domains.

FIG. 3 illustrates perpendicularly oriented lamellar domains of a typical self-assembled low-chi BCP when the planar underlayer and the atmosphere interface are both non-preferential to the BCP domains. The main planes of the lamellae are oriented perpendicular to the plane of the underlayer surface, and also to the main plane of the SA layer. The lamellae of each domain are in contact with the atmosphere and underlayer surface. The bulk periodicity, Lo, is indicated, as well as 0.5Lo. In this example, the underlayer surface has contact with block A and block B of the self-assembled diblock copolymer.

Figure 4:
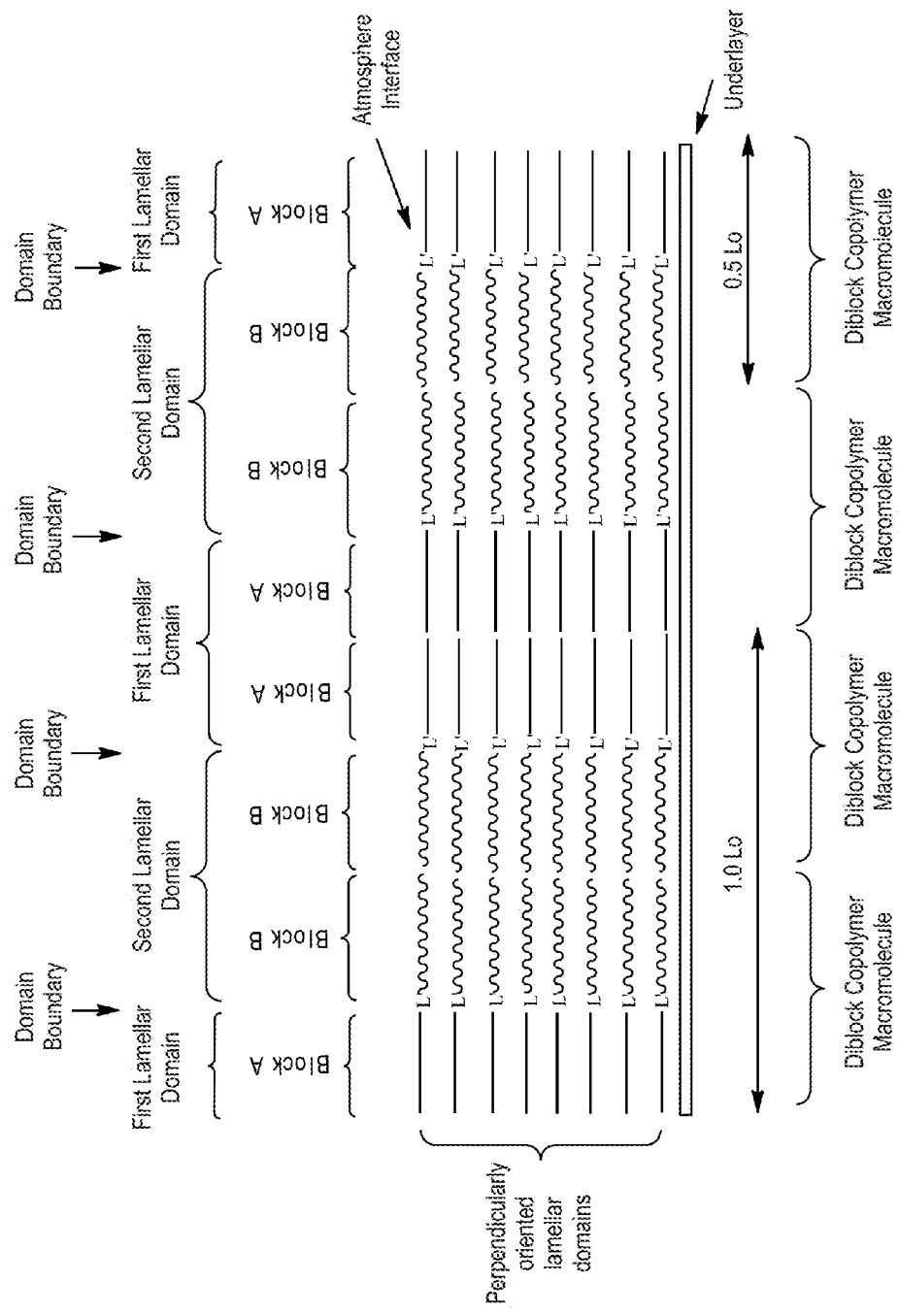
FIG. 4 is a schematic cross-sectional representation of perpendicularly oriented lamellar domains formed with the disclosed BCPs comprising a fluorinated linking group L'. The atmosphere interface and underlayer can be preferentially wetting to one domain of an otherwise identical self-assembled BCP wherein all fluorines of L' are replaced by hydrogen.

Without being bound by theory, FIG. 4 illustrates a non-limiting schematic cross-sectional representation of perpendicularly oriented lamellar domain pattern. The domain pattern is formed using a disclosed silicon-containing high-chi BCP comprising a suitable L' group. The underlayer surface and the atmosphere interface are both preferential to one of the domains of an otherwise identical self-assembled BCP in which all fluorines of L' are replaced by hydrogen. In this example, the atmosphere interface is preferential to the domain of lower surface energy (e.g., P(TMSS-r-Sty) domain, block A), whereas the underlayer is preferential to the domain of higher surface energy (e.g., polycarbonate domain). Nevertheless, self-assembly of the BCP comprising the L' group generates a perpendicularly oriented lamellar domain pattern. Without being bound by theory, each domain is believed to be in contact with the atmosphere interface and underlayer, with linking group L' residing at the boundary of the two domains as shown.

The specific structural units formed by self-assembly of the block copolymer are determined by the volume ratio of the first block to the second block. The volume of a given block means the volume occupied by the block, which depends on molecular mass of the block. For example, when the volume ratio of the first block A to the second block B is greater than about 80:20, the block copolymer can form an ordered array of spheres composed of the second block in a matrix composed of the first block. When the volume ratio of the first block to the second block is in a range of about 20:80 to about 10:90, the block copolymer can form an ordered array of spheres of the first block in a matrix composed of the second block. When the volume ratio of the first block to the second block is in a range of about 20:80 to about 40:60, the block copolymer can form an ordered array of cylinders composed of the first block in a matrix composed of the second block. When the volume ratio of the first block to the second block is about 40:60 to about 60:40, the block copolymer can form alternating lamellae (i.e., an array of lamellae composed of the first block alternating with lamellae composed of the second block). As an example, a poly(styrene)-b-poly(methyl methacrylate) block copolymer (PS-b-PMMA) comprising 20% or less by volume of the polystyrene (PS) block can self-assemble to form PS spheres in a poly(methyl methacrylate) (PMMA) matrix. As another example, a PS-b-PMMA block copolymer comprising about 20% to about 40% PS by volume can self-assemble to form PS cylinders in a PMMA matrix. The volume ratio between the first block and the second block can be adjusted by controlling the average molecular weight of each block.

More specifically, the volume ratio of the first block to the second block can be about 15:85 to about 85:15, based on the average total volume of the block copolymer macromolecule. For alternating lamellae formation, the volume ratio of the first block to the second block is preferably 45:55 to 55:45, and more preferably 48:52 to 52:48. For cylinder formation, the volume ratio of the first block to second block is preferably about 74:26 to about 63:37, and more preferably about 72:28 to about 65:35.

One of the blocks of the block copolymer can be selectively removed (e.g., by etching techniques) relative to the other block to form structural features composed of the remaining block using known dry and/or wet etching techniques. The structural features can have any suitable form such as, for example, a line pattern, a hole pattern, and/or other patterns.

The disclosed high-chi BCP preferably has a chemical structure favoring formation of lamellar domains or cylindrical domains during self-assembly. That is, the volume fractions of the blocks of the block copolymer are preferably in a range favorable to formation of lamellar domains or cylindrical domains. The SA layer can be formed on an underlayer surface that is preferential to or non-preferential to the domains of an otherwise identical self-assembled BCP in which all fluorines of L' are replaced by hydrogen. Preferably, the SA layer has a top surface in contact with an atmosphere. The atmosphere interface is always considered a preferential interface with respect to the domains of a high-chi BCP lacking the disclosed L' group.

The lamellar domain patterns can have a bulk periodicity (i.e., characteristic pitch (Lo)) greater than 4 nm, preferably between 4 nm and 80 nm, which is useful for producing line features having a half-pitch between 2 nm and 40 nm, respectively. More particularly, the lamellar domain pattern can have a half pitch between 2 nm and 20 nm, a half pitch between 2 nm and 15 nm, a half pitch between 2 nm and 10 nm, and even more particularly a half pitch between 2 nm and 9 nm.

Block Copolymers

Herein, random copolymers are indicated by "-co-", or "-r-" in the name. Block copolymers are indicated by "-b-" or "-block-" in the name. Alternating block copolymers are indicated by "-alt-" in the name. Herein, the block copolymers can be represented also by "-L'-" between named blocks of the block copolymer, indicating that the blocks are joined by the disclosed L' group.

The disclosed block copolymers (BCPs) are linear diblock copolymers having a structure according to formula (A-1):

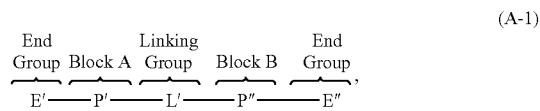

(A-1)

wherein
  the block copolymer has a backbone,
  P' represents a first polymer block (block A), wherein block A is a divalent random copolymer chain containing, based on total moles of repeat units of block A, about 25-60 mol % of a first ethylenic repeat unit having structure (A-2):

(A-2)

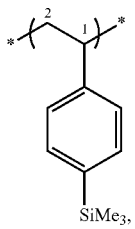

wherein carbons 1 and 2 of (A-2) are atomic centers of the polymer backbone, and
about 75-40 mol % of a second ethylenic repeat unit having structure (A-3):

(A-3)

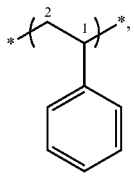

wherein carbons 1 and 2 of (A-3) are atomic centers of the backbone,
P''' represents a second polymer block (block B) comprising a repeat unit selected from the group consisting of aliphatic carbonate, aliphatic ester, aliphatic ether, and combinations thereof,
E' is a monovalent first end group linked to a peripheral end repeat unit of P',
E''' is a monovalent second end group linked a peripheral end repeat unit of P''', and
L' is a divalent fluorinated linking group that joins an end repeat unit of P' to an end repeat unit of P''', wherein L' comprises 1-25 fluorines, and each of the fluorines of L' is linked to a carbon of a monovalent side chain pendent to the backbone, wherein no atomic center of the side chain is an atomic center of the backbone.

Herein, an atomic center (e.g., carbon 1 or carbon 2 of (A-2) and (A-3)) shown linked to a bond with an asterisk (a starred bond) indicates the atomic center is covalently linked to another undefined portion of the chemical structure represented by the asterisk (e.g., the asterisk can be an atomic center of another repeat unit or an end group).

The sum of the mol % of the first repeat units (A-2) plus the mol % of the second repeat units (A-3) of block A is preferably in a range of about 90-100 mol %, more preferably 95-100 mol %, or most preferably 98-100 mol %. In an embodiment, the sum of the mol % of the first repeat units (A-2) plus the mol % of the second repeat units (A-3) of block A is 100 mol % (i.e., any impurities of block A are below detection limit).

Exemplary aliphatic carbonate repeat units, which can be prepared by ring opening polymerization (ROP) of cyclic carbonate monomers, are shown in Scheme 1.

Scheme 1

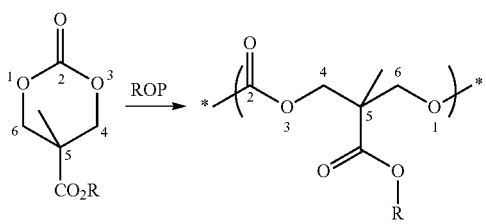

R = Me, Et, 2-propyl, Bz

The numbered atomic centers of the cyclic carbonate monomer become atomic centers of the polymer backbone after the ring opening reaction.

An exemplary aliphatic ester repeat unit, which can be prepared by ring opening polymerization (ROP) of cyclic ester monomer lactide, is shown in Scheme 2.

Scheme 2

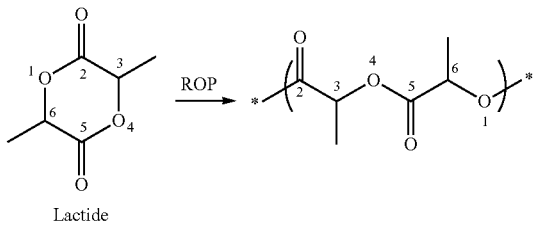

Lactide

The numbered atomic centers of the cyclic ester monomer become atomic centers of the polymer backbone after the ring opening reaction. The lactide can be present as D-lactide, L-lactide, or D,L-lactide.

Exemplary aliphatic ether repeat units, which can be prepared by ring opening polymerization (ROP) of cyclic ether monomers, are shown in Scheme 3.

Scheme 3

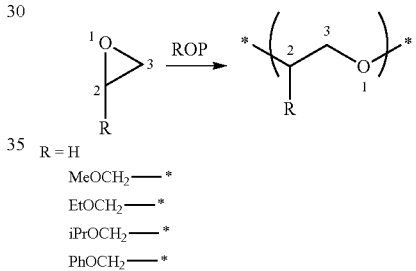

R = H
MeOCH$_2$——*
EtOCH$_2$——*
iPrOCH$_2$——*
PhOCH$_2$——*

In a preferred embodiment, block B comprises, based on total moles of repeat units of block B, 90-100 mol % of an aliphatic carbonate repeat unit of structure (A-4):

(A-4)

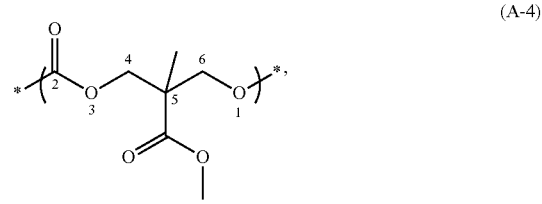

wherein carbons and oxygens labeled 1-6 of (A-4) are atomic centers of the polymer backbone.

A top-coat free thin film layer comprising the block copolymer, which is disposed on a substrate, is capable of self-assembly to form a perpendicularly oriented lamellar or cylindrical domain pattern having a bulk periodicity (Lo) of between about 4 nm and about 28 nm (half-pitch between about 2 nm and about 14 nm). The etch selectivity and critical dimension uniformity of the domain pattern can be substantially improved relative to a domain pattern formed by an otherwise identical block copolymer of comparable half-pitch but that is lacking silicon.

P' is preferably formed by a vinyl polymerization of a mixture containing trimethylsilyl styrene (TMSS) and styrene (Sty). Hence, the first ethylenic repeat unit (A-2) is also referred to herein as the "TMSS unit", and the second ethylenic repeat unit (A-3) is referred to as the "styrene unit". The polymer backbone carbons of the TMSS unit and styrene unit are labeled 1 and 2 in the above structures.

Carbonate repeat unit (A-4) is also referred to herein as the "MTC-Me unit". Carbonate repeat unit (A-4) is preferably formed by a ring opening polymerization (ROP) of cyclic carbonate monomer MTC-Me, which has the structure

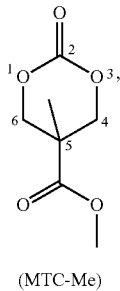

(MTC-Me)

wherein numbered atomic centers become atomic centers of the block copolymer backbone after the ring opening polymerization of MTC-Me.

Each of the repeat units of P' and P''' is an independent moiety that can be stereospecific or non-stereospecific. E', E'', and/or L' are also independent moieties that can be stereospecific or non-stereospecific.

P''' can be a homopolymer or a copolymer chain comprising carbonate repeat unit (A-4). Optionally, P''' can comprise another aliphatic carbonate repeat unit and/or an aliphatic ester repeat unit. In an embodiment, P''' is a homopolymer chain of the MTC-Me unit, referred to herein as "PMTC-Me":

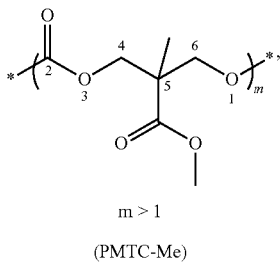

m > 1

(PMTC-Me)

The carbons and oxygens numbered 1-6 of PMTC-Me are atomic centers of the block copolymer backbone.

Block A and block B are covalently joined by respective end repeat units to divalent linking group L' (also referred to herein as a junction group). L' is a low surface energy group comprising 1-25 fluorines, which are located on a side chain pendent to the block copolymer backbone. For example, L' can have a structure according to formula (A-5):

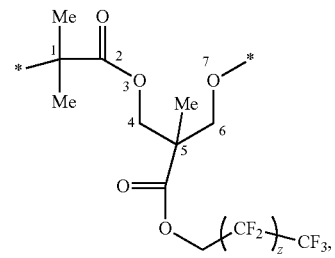

(A-5)

wherein
z is a positive integer having a value of 0 to 11, and numbered atomic centers of (A-5) are atomic centers of the backbone of the block copolymer.

In an embodiment, L' has the structure (A-5), wherein z is 7. In another embodiment, L' has the structure (A-5), wherein z is 9. These L' groups are shown below.

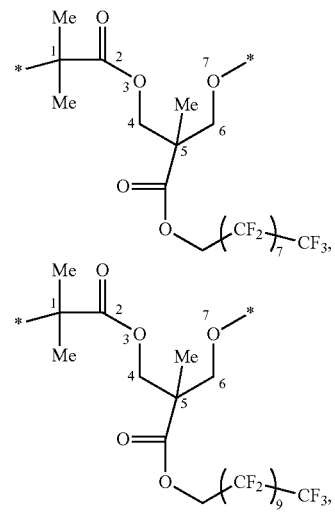

Carbons 1, 2, and 4-6 and oxygens 3 and 7 of the above structures are atomic centers of the block copolymer backbone. The carbons linked to the fluorines of the ester side chain are not atomic centers of the block copolymer backbone.

Other L' groups can have a structure according to formula (A-6):

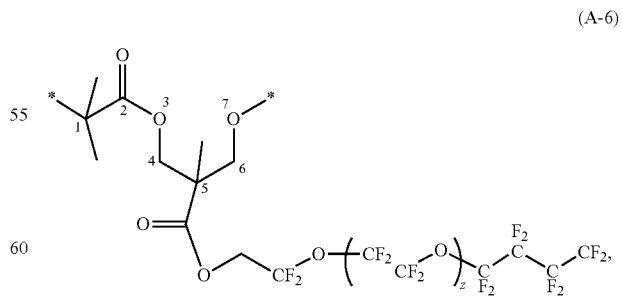

(A-6)

wherein
z is a positive integer having a value of 1 to 7, and the numbered atomic centers of (A-6) are atomic centers of the backbone of the block copolymer.

The disclosed block copolymers are linear polymers, meaning the block copolymers have one polymer branch rather than intersecting polymer branches, and the one polymer branch has two peripheral dangling ends (i.e., the polymer backbone is not a macrocycle). Preferably, L' is a non-charged group. L' provides orientation control of phase-segregated domains formed during self-assembly of the block copolymer. L' has a lower surface energy than each block of the block copolymer. More particularly, L' has a surface energy of 0 to 30 mN/m.

End groups E' and E" can be any suitable end groups. For example, E' and/or E" can be a hydrogen, a halide (e.g., fluoride, chloride, bromide, iodide), an alcohol hydroxyl group, a hydrocarbyl group (e.g., methyl, ethyl, benzyl, phenyl), an acyl group (e.g., acetyl, propionyl, benzoyl), an alkoxy group (e.g., methoxy, ethoxy), or another carbon bearing group.

In an embodiment, block A is a random copolymer chain consisting essentially of TMSS units and styrene units, referred to as P(TMSS-r-Sty), and block B is a homopolymer of MTC-Me (PMTC-Me). That is, the BCP has a structure according to formula (A-7):

L' is a divalent fluorinated linking group comprising 1-25 fluorines, wherein each of the fluorines of L' is linked to a respective carbon of a side chain pendent to the block copolymer backbone, and L' is linked to carbon 2 of a TMSS unit or carbon 2 of a styrene unit.

In another embodiment, block A consists of TMSS units and styrene units. More specifically, L' can comprise 1, 2, 3, 4, 5, 6, 7, 8, 9, 10, 11, 12, 13, 14, 15, 16, 17, 18, 19, 20, 21, 22, 23, 24, or 25 fluorines. Preferably, L' comprises 10-25 fluorines. In an embodiment, L' comprises 15-25 fluorines. In a specific embodiment, L' comprises 17 fluorines.

A thin film layer (5-100 nm thickness) of the disclosed BCP, which is disposed on an underlayer of a multi-layered substrate and has a top surface in contact with an atmosphere, is capable of self-assembling to form a phase-segregated domain pattern. The domain pattern comprises a first domain comprising a first block (block A), and a second domain comprising a second block (block B) of the block copolymer. The first and second domains preferably comprise a lamellar or cylindrical morphology.

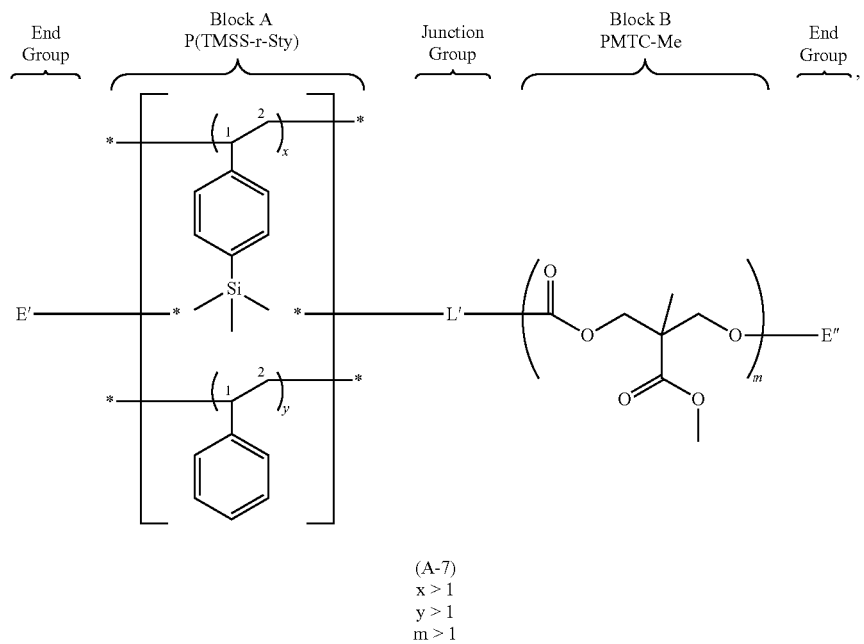

(A-7)
x > 1
y > 1
m > 1 wherein
the block copolymer has a polymer backbone,
subscripts x, y, and m are independent numbers representing average degree of polymerization of respective repeat units enclosed in parentheses, and each of x, y, and z has a value greater than 0,
block A is enclosed by square brackets, wherein vertical stacking of the TMSS units and styrene units within the square brackets indicates a random polymer chain composed of x TMSS units and y styrene units,
block B is a polycarbonate homopolymer PMTC-Me,
E' is a monovalent first end group covalently linked to carbon 1 of a TMSS unit or to carbon 1 of a styrene unit,
E" is a monovalent second end group covalently linked to a peripheral end repeat unit of block B, and The BCP has a block-to-block Flory Huggins interaction parameter (chi parameter) that is higher than the chi parameter of poly(styrene)-b-poly(methyl methacrylate) (PS-b-PMMA)).

The BCP can have a number average molecular weight (Mn) of 5000 to 50000, more preferably 5000 to 40000, and most preferably 7000 to 40000 based on gel permeation chromatography (GPC) of the BCP.

Block A can comprise the TMSS unit and the styrene unit in a TMSS:Sty molar ratio range of 25:75 to 60:40, more preferably 35:65 to 60:40, and most preferably 50:50 to 60:40 based on the $^1$H NMR analysis of the BCP.

Block B can comprise 10-150 MTC-Me units, more preferably 10-100 MTC-Me units, and most preferably 10-80 MTC-Me units.

The BCPs can have a number average molecular weight (Mn) of about 1500 to about 100000, more particularly 4000 to about 50,000, and even more particularly about 4000 to about 40000. The BCPs can have a polydispersity index (PDI) generally from 1.0 to 3.0, more particularly 1.0 to 2.0, and even more particularly 1.0 to 1.5.

In the examples further below, the number average molecular weight (Mn) of the BCP is in a range of 10,000 to 40,000.

Herein, block A of the BCP is the low surface energy block (e.g., poly(trimethylsilyl styrene-r-styrene) block, also referred to as P(TMSS-r-Sty)), and block B is the high surface energy block (e.g., polycarbonate). In the examples further below, the number average molecular weight (Mn) of the low surface energy block A is in the range of 6800 to 14200, and the high surface energy block B (PMTC-Me) is in the range of 7000 to 16400.

Preparation of the Block Copolymers for Self-assembly

The BCP can be produced using any suitable polymerization technique, including but not limited to free radical polymerization, anionic polymerization, cationic polymerization, atom transfer radical polymerization (ATRP), nitroxide mediated polymerization (NMP), reversible addition-fragmentation chain transfer (RAFT) polymerization, and/or ring opening polymerizations.

In a preferred embodiment, block B is prepared by a ring opening polymerization (ROP) of MTC-Me using a ROP polymeric initiator (ROP macroinitiator).

Initiators for ring opening polymerizations generally include nucleophilic groups such as alcohols, primary amines, secondary amines, and thiols. The ROP polymeric initiator comprises i) block A of the block copolymer and ii) an L' precursor group comprising a nucleophilic group (e.g., an alcohol group) capable of initiating a ROP of a MTC-Me.

The ROP polymeric initiator can be produced using any suitable polymerization technique, including but not limited to free radical polymerization, anionic polymerization, cationic polymerization, atom transfer radical polymerization (ATRP), nitroxide mediated polymerization (NMP), and/or reversible addition-fragmentation chain transfer (RAFT) polymerization.

Scheme 4 illustrates the formation of ROP macroinitiator PSI-5 of Example 7 further below using ATRP-1 (an ATRP initiator containing an L' precursor group), catalyst CuBr/PMDETA, and monomers TMSS and styrene.

Scheme 4

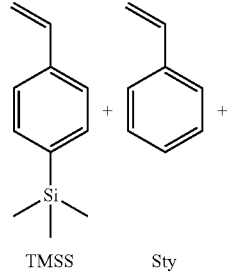

TMSS    Sty

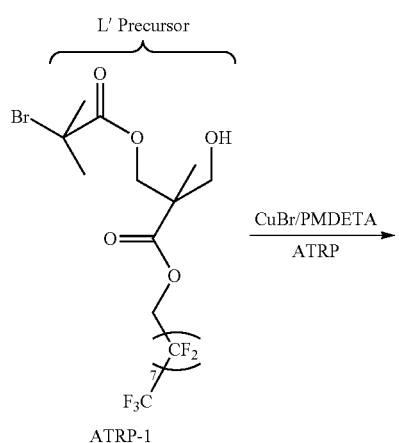

ATRP-1

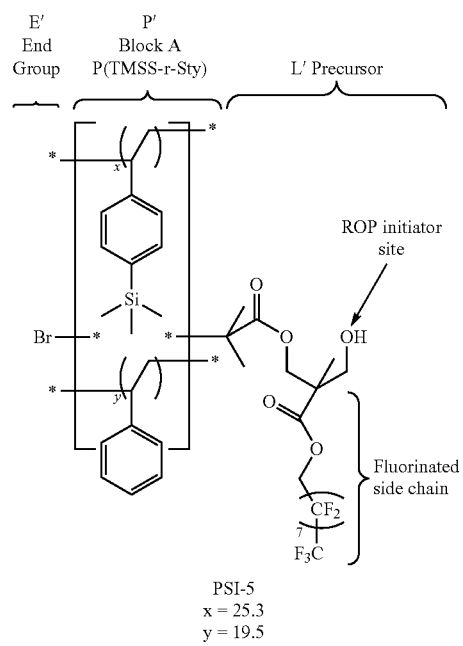

PSI-5
x = 25.3
y = 19.5

Other ATRP initiators (L' precursor compounds) include those of Scheme 5.

Scheme 5

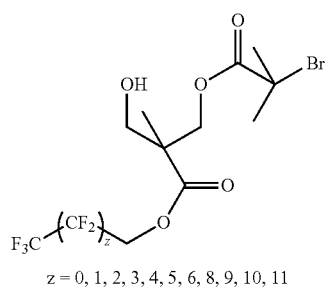

z = 0, 1, 2, 3, 4, 5, 6, 8, 9, 10, 11

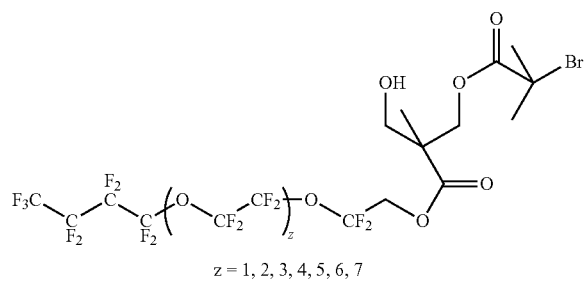

z = 1, 2, 3, 4, 5, 6, 7

The above ATRP initiator compounds can be prepared by the reaction of the corresponding fluorinated mono alcohol with 2-bromo-isobutyryl bromide, as shown in the examples further below.

Exemplary non-limiting ROP macroinitiators, which can be prepared by ATRP, include those shown in Scheme 6.

Scheme 6

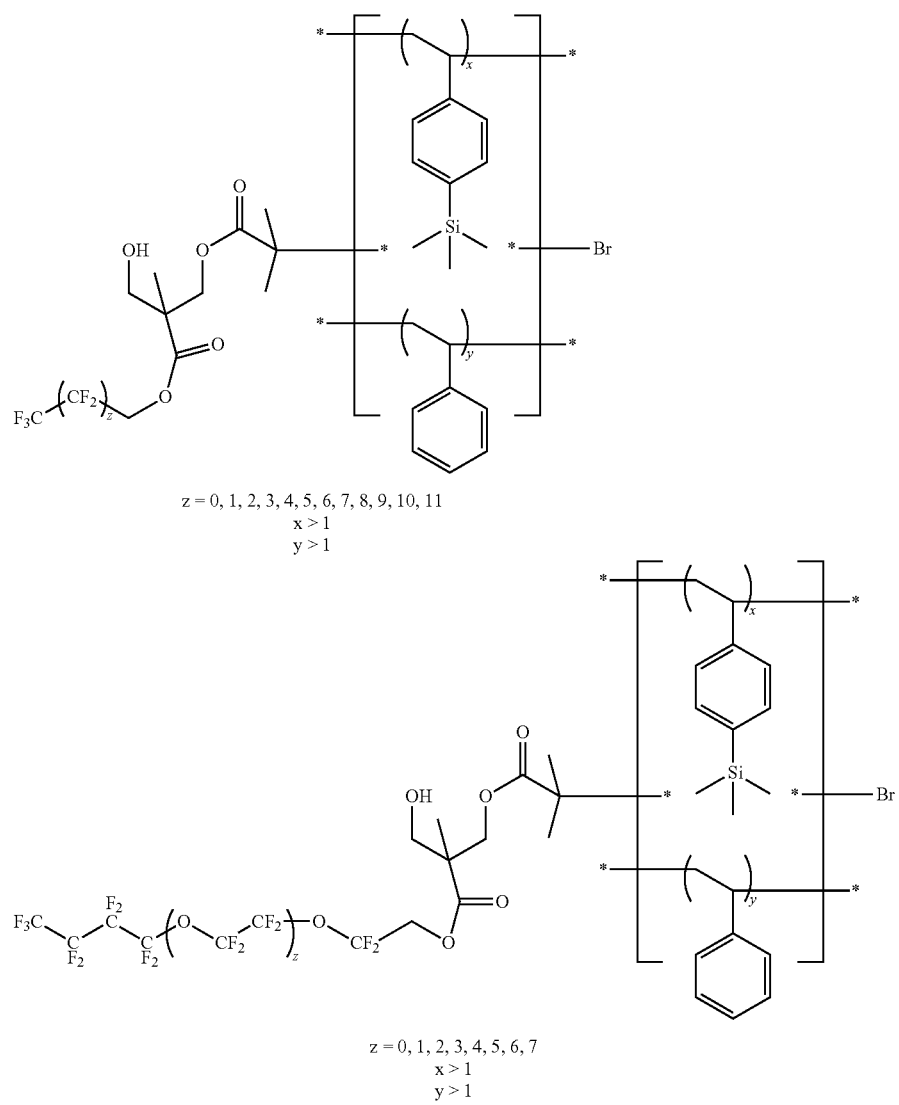

Other ROP macroinitiators can be prepared by anionic polymerization of a vinyl polymerizable monomer as illustrated in Scheme 7. The reaction utilizes a fluorinated diphenylethylene as a chain terminating agent of the polymerization. The resulting polymeric anion is treated with ethylene oxide and a protonic acid to form the ROP macroinitiator. The alcohol hydroxy group of the resulting polymer is an initiating site for ring opening polymerization of MTC-Me. In Scheme 7, z and k are positive integers.

Scheme 7

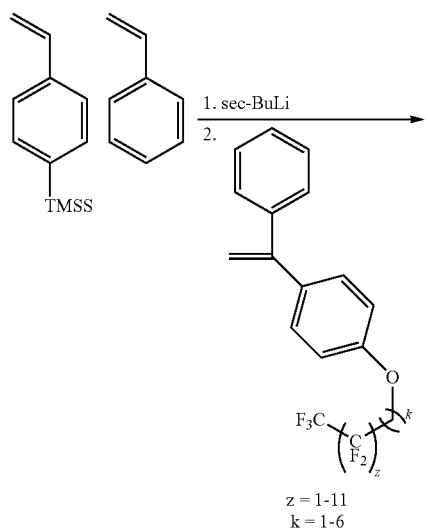

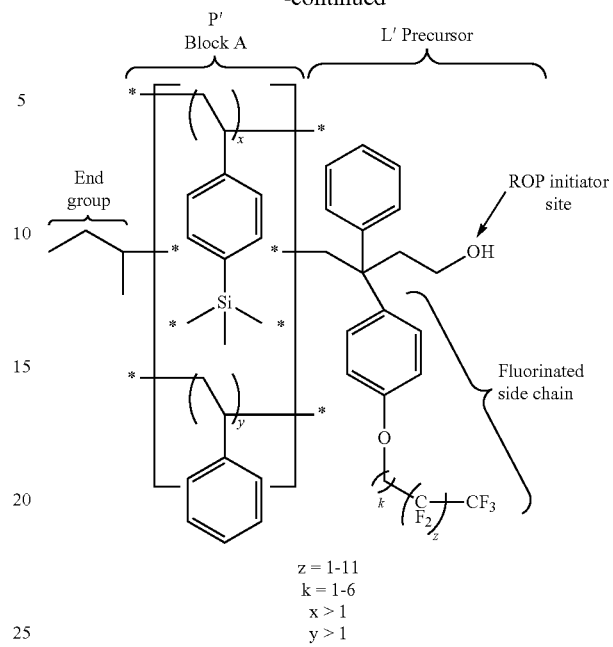

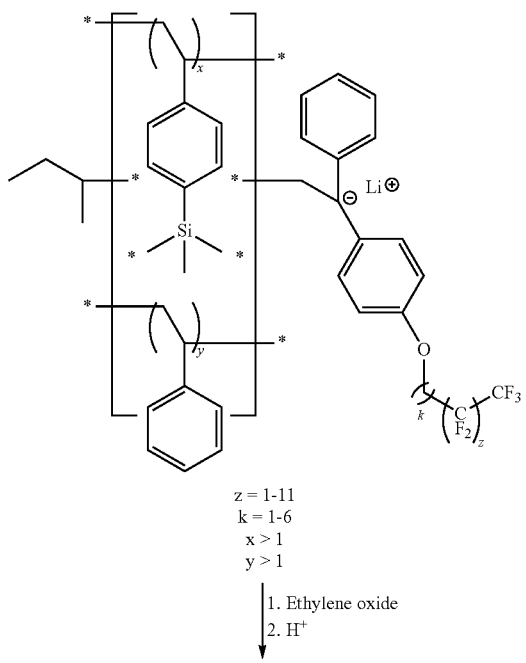

The number average molecular weight Mn of the ROP macroinitiator can be about 500 to about 50,000, more specifically about 1000 to about 35,000.

The ROP reaction mixture comprises MTC-Me, a ROP catalyst, a solvent, and a ROP macroinitiator. The ROP catalyst can be a base or acid catalyst (e.g., 1,8-diazabicyclo[5.4.0]undec-7-ene (DBU), diphenyl phosphate).

Scheme 8 illustrates the preparation of a block copolymer BCP-4 using ROP polymeric initiator PSI-5, cyclic carbonate monomer MTC-Me, and ROP base catalyst (DBU). Following the ROP, the initial block copolymer is end-capped with an acetyl group using acetyl chloride (AcCl)/triethylamine (TEA).

Scheme 8

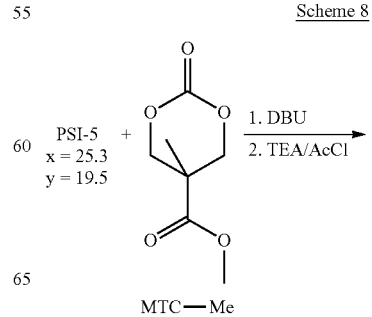

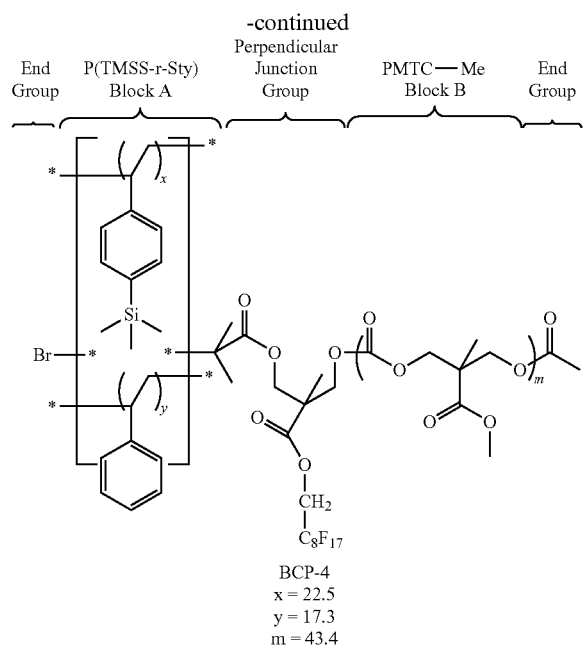

BCP-4
x = 22.5
y = 17.3
m = 43.4

The initial block copolymer formed can be endcapped using any suitable end group, with the proviso the endcap group does not adversely affect self-assembly. The bromide end group can be removed using known standard techniques if desired.

The following methods of preparing and purifying a diblock copolymer comprising a carbonate and/or ester repeat units provide a block copolymer that is substantially free of any polycarbonate/polyester homopolymer and/or polycarbonate/polyester random copolymer that is not linked to block A.

Ring Opening Polymerizations (ROP)

The following is a general description of methods, conditions and materials for ring opening polymerizations of cyclic carbonates and cyclic esters.

The ring-opening polymerization can be performed at a temperature that is about ambient temperature or higher, 15° C. to 100° C., and more specifically ambient temperature. Reaction times vary with solvent, temperature, agitation rate, pressure, and equipment, but in general the polymerizations are complete within about 1 hour to about 48 hours.

The ROP reaction is preferably performed with a solvent. Exemplary solvents include dichloromethane, chloroform, benzene, toluene, xylene, chlorobenzene, dichlorobenzene, benzotrifluoride, petroleum ether, acetonitrile, pentane, hexane, heptane, 2,2,4-trimethylpentane, cyclohexane, diethyl ether, t-butyl methyl ether, diisopropyl ether, dioxane, tetrahydrofuran, or a combination comprising one of the foregoing solvents. When a solvent is present, a suitable monomer concentration is about 0.1 to 5 moles per liter, and more particularly about 0.2 to 4 moles per liter.

The ROP polymerizations are conducted using an inert dry atmosphere, such as nitrogen or argon, and at a pressure of from 100 to 500 MPa (1 to 5 atm), more typically at a pressure of 100 to 200 MPa (1 to 2 atm). At the completion of the reaction, the solvent can be removed using reduced pressure.

ROP Catalysts

No restriction is placed on the ROP catalyst. Less preferred catalysts for the ROP polymerization include metal oxides such as tetramethoxy zirconium, tetra-iso-propoxy zirconium, tetra-iso-butoxy zirconium, tetra-n-butoxy zirconium, tetra-t-butoxy zirconium, triethoxy aluminum, tri-n-propoxy aluminum, tri-iso-propoxy aluminum, tri-n-butoxy aluminum, tri-iso-butoxy aluminum, tri-sec-butoxy aluminum, mono-sec-butoxy-di-iso-propoxy aluminum, ethyl acetoacetate aluminum diisopropylate, aluminum tris(ethyl acetoacetate), tetraethoxy titanium, tetra-iso-propoxy titanium, tetra-n-propoxy titanium, tetra-n-butoxy titanium, tetra-sec-butoxy titanium, tetra-t-butoxy titanium, tri-iso-propoxy gallium, tri-iso-propoxy antimony, tri-iso-butoxy antimony, trimethoxy boron, triethoxy boron, tri-iso-propoxy boron, tri-n-propoxy boron, tri-iso-butoxy boron, tri-n-butoxy boron, tri-sec-butoxy boron, tri-t-butoxy boron, tri-iso-propoxy gallium, tetramethoxy germanium, tetraethoxy germanium, tetra-iso-propoxy germanium, tetra-n-propoxy germanium, tetra-iso-butoxy germanium, tetra-n-butoxy germanium, tetra-sec-butoxy germanium and tetra-t-butoxy germanium; halogenated compounds such as antimony pentachloride, zinc chloride, lithium bromide, tin(IV) chloride, cadmium chloride and boron trifluoride diethyl ether; alkyl aluminum such as trimethyl aluminum, triethyl aluminum, diethyl aluminum chloride, ethyl aluminum dichloride and tri-iso-butyl aluminum; alkyl zinc such as dimethyl zinc, diethyl zinc and diisopropyl zinc; tertiary amines such as triallylamine, triethylamine, tri-n-octylamine and benzyldimethylamine; heteropolyacids such as phosphotungstic acid, phosphomolybdic acid, silicotungstic acid and alkali metal salts thereof; zirconium compounds such as zirconium acid chloride, zirconium octanoate, zirconium stearate and zirconium nitrate. More particularly, the zirconium catalyst can be zirconium octanoate, tetraalkoxy zirconium or a trialkoxy aluminum compound.

More preferred ROP catalysts are organocatalysts whose chemical formulas contain no metal. Base organocatalysts for ROPs of cyclic carbonyl monomers include tertiary amines such as triallylamine, triethylamine, tri-n-octylamine and benzyldimethylamine 4-dimethylaminopyridine, phosphines, N-heterocyclic carbenes (NHC), bifunctional aminothioureas, phosphazenes, amidines, and guanidines.

Other ROP catalysts include thiourea organocatalysts N-(3,5-trifluoromethyl)phenyl-N'-cyclohexyl-thiourea (TU):

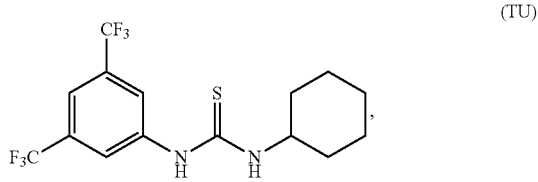 [SMILES: FC(F)(F)c1cc(NC(=S)NC2CCCCC2)cc(C(F)(F)F)c1]

and bis-thiourea

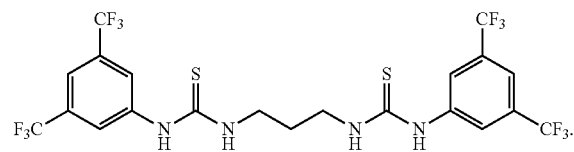 [SMILES: FC(F)(F)c1cc(NC(=S)NCCCNC(=S)Nc2cc(C(F)(F)F)cc(C(F)(F)F)c2)cc(C(F)(F)F)c1]

Other ROP organocatalysts comprise at least one 1,1,1,3,3,3-hexafluoropropan-2-ol-2-yl (HFA) group. Singly-donating hydrogen bond catalysts have the formula (E-1):

$$R^2\text{—}C(CF_3)_2OH \qquad (E\text{-}1),$$

wherein R² represents a hydrogen or a monovalent radical having from 1 to 20 carbons, for example an alkyl group, substituted alkyl group, cycloalkyl group, substituted cycloalkyl group, heterocycloalkyl group, substituted heterocycloalklyl group, aryl group, substituted aryl group, or a combination thereof. Exemplary singly-donating hydrogen bonding catalysts are listed in Scheme 9.

Scheme 9

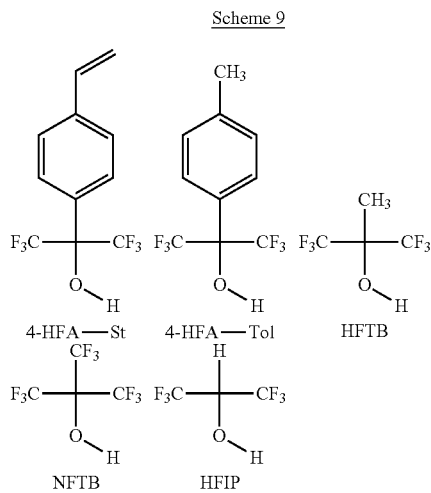

Doubly-donating hydrogen bonding catalysts have two HFA groups, represented by the general formula (E-2):

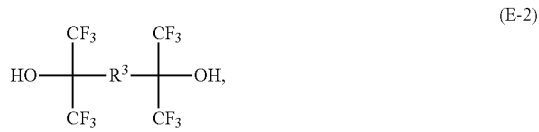

wherein R³ is a divalent radical bridging group containing from 1 to 20 carbons, such as an alkylene group, a substituted alkylene group, a cycloalkylene group, substituted cycloalkylene group, a heterocycloalkylene group, substituted heterocycloalkylene group, an arylene group, a substituted arylene group, or a combination thereof. Representative double hydrogen bonding catalysts of formula (E-2) include those listed in Scheme 10. In a specific embodiment, R² is an arylene or substituted arylene group, and the HFA groups occupy positions meta to each other on the aromatic ring.

Scheme 10

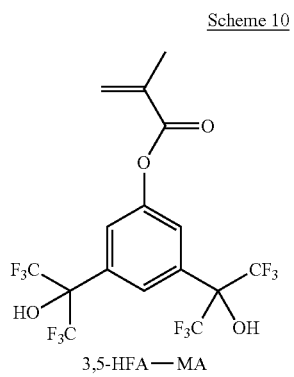

3,5-HFA—MA

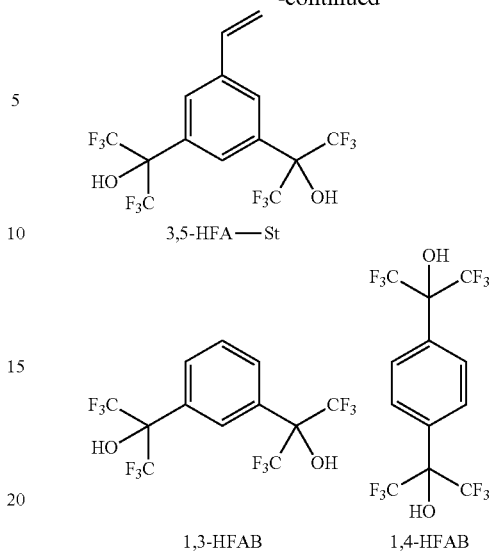

Preferred hydrogen bonding catalysts include 4-HFA-St, 4-HFA-Tol, HFTB, NFTB, HPIP, 3,5-HFA-MA, 3,5-HFA-St, 1,3-HFAB, 1,4-HFAB, and combinations thereof.

The HFA catalyst can be bound to a support. In one embodiment, the support comprises a polymer, a crosslinked polymer bead, an inorganic particle, or a metallic particle. HFA-containing polymers can be formed by known methods including direct polymerization of an HFA-containing monomer (for example, the methacrylate monomer 3,5-HFA-MA or the styryl monomer 3,5-HFA-St). Functional groups in HFA-containing monomers that can undergo direct polymerization (or polymerization with a comonomer) include acrylate, methacrylate, alpha, alpha, alpha-trifluoromethacrylate, alpha-halomethacrylate, acrylamido, methacrylamido, norbornene, vinyl, vinyl ether, and other groups known in the art. Examples of linking groups include $C_1$-$C_{12}$ alkyl groups, $C_1$-$C_{12}$ heteroalkyl groups, ether groups, thioether groups, amino groups, ester groups, amide groups, and combinations thereof. Also contemplated are catalysts comprising charged HFA-containing groups bound by ionic association to oppositely charged sites on a polymer or a support surface.

Other ROP catalysts include acid organocatalysts (e.g., diphenylphosphate (DPP), triflic acid, and the like).

The ROP reaction mixture comprises at least one ROP catalyst and, when appropriate, several ROP catalysts together. The ROP catalyst is added in a proportion of 1/20 to 1/40,000 moles relative to the cyclic carbonyl monomers, and preferably in a proportion of 1/1,000 to 1/20,000 moles relative to the cyclic carbonyl monomers.

ROP Accelerators

The ROP polymerization can be conducted in the presence of an optional accelerator, in particular a nitrogen base. Exemplary nitrogen base accelerators are listed below and include pyridine (Py), N,N-dimethylaminocyclohexane (Me₂NCy), 4-N,N-dimethylaminopyridine (DMAP), trans 1,2-bis(dimethylamino)cyclohexane (TMCHD), 1,8-diazabicyclo[5.4.0]undec-7-ene (DBU), 1,5,7-triazabicyclo[4.4.0]dec-5-ene (TBD), 7-methyl-1,5,7-triazabicyclo[4.4.0]dec-5-ene (MTBD), (−)-sparteine, (Sp) 1,3-bis(2-propyl)-4,5-dimethylimidazol-2-ylidene (Im-1), 1,3-bis(2,4,6-trimethylphenyl)imidazol-2-ylidene (Im-2), 1,3-bis(2,6-di-i-propylphenyl(imidazol-2-ylidene) (Im-3), 1,3-bis(1- adamantyl)imidazol-2-ylidene (Im-4), 1,3-di-i-propylimidazol-2-ylidene (Im-5), 1,3-di-t-butylimidazol-2-ylidene (Im-6), 1,3-bis(2,4,6-trimethylphenyl)-4,5-dihydroimidazol-2-ylidene (Im-7), 1,3-bis(2,6-di-i-propylphenyl)-4,5-dihydroimidazol-2-ylidene, 1,3-bis(2,6-di-i-propylphenyl)-4,5-dihydroimidazol-2-ylidene (Im-8) or a combination thereof, shown in Scheme 11.

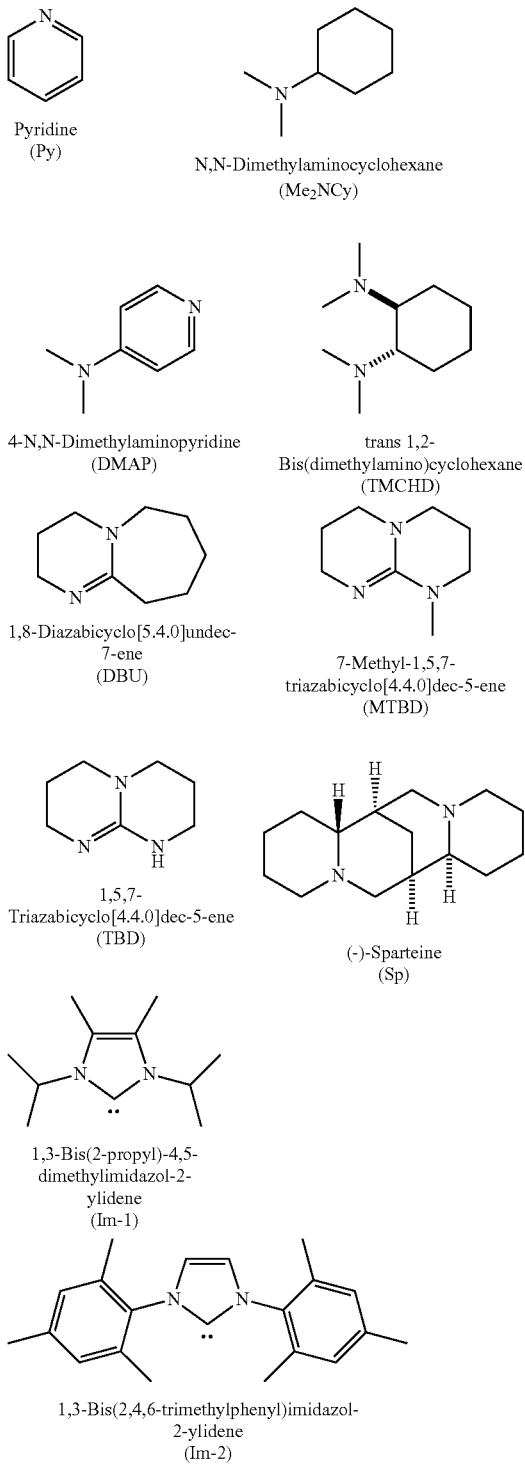

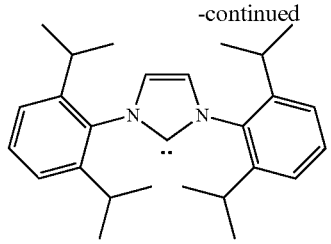

1,3-Bis(2,6-di-i-propylphenyl)(imidazol-2-ylidene
(Im-3)

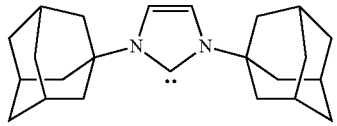

1,3-Bis(1-adamantyl)imidazol-2-yliden)
(Im-4)

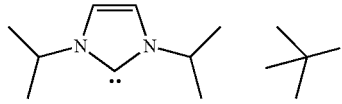

1,3-Di-i-propylimidazol-2-ylidene (Im-5)    1,3-Di-t-butylimidazol-2-ylidene (Im-6)

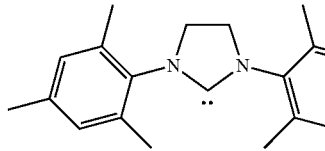

1,3-Bis(2,4,6-trimethylphenyl)-4,5-dihydroimidazol-2-ylidene
(Im-7)

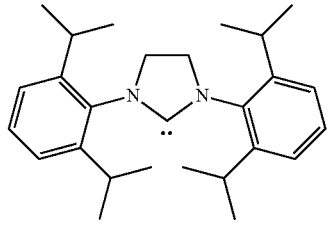

1,3-Bis(2,6-di-i-propylphenyl)-4,5-dihydroimidazol-2-ylidene
(Im-8)

In an embodiment, the accelerator has two or three nitrogens, each capable of participating as a Lewis base, as for example in the structure (−)-sparteine. Stronger bases generally improve the polymerization rate.

The catalyst and the accelerator can be the same material. For example, some ring opening polymerizations can be conducted using 1,8-diazabicyclo[5.4.0]undec-7-ene (DBU) alone, with no another catalyst or accelerator present.

The catalyst is preferably present in an amount of about 0.2 to 20 mol %, 0.5 to 10 mol %, 1 to 5 mol %, or 1 to 2.5 mol %, based on total moles of cyclic carbonyl monomer.

The nitrogen base accelerator, when used, is preferably present in an amount of 0.1 to 5.0 mol %, 0.1 to 2.5 mol %, 0.1 to 1.0 mol %, or 0.2 to 0.5 mol %, based on total moles of cyclic carbonyl monomer. As stated above, in some instances the catalyst and the nitrogen base accelerator can be the same compound, depending on the particular cyclic carbonyl monomer.

The amount of ROP initiator is calculated based on the equivalent molecular weight per nucleophilic initiator group in the nucleophilic initiator. The initiator groups are preferably present in an amount of 0.001 to 10.0 mol %, 0.1 to 2.5 mol %, 0.1 to 1.0 mol %, and 0.2 to 0.5 mol %, based on total moles of cyclic carbonyl monomer. For example, if the molecular weight of the initiator is 100 g/mole and the initiator has 2 hydroxyl groups for initiating the ROP, the equivalent molecular weight per hydroxyl group is 50 g/mole. If the polymerization calls for 5 mol % hydroxyl groups per mole of monomer, the amount of initiator is 0.05×50=2.5 g per mole of monomer.

In a specific embodiment, the catalyst is present in an amount of about 0.2 to 20 mol %, the nitrogen base accelerator is present in an amount of 0.1 to 5.0 mol %, and the nucleophilic initiator groups of the initiator are present in an amount of 0.1 to 5.0 mol % based on the equivalent molecular weight per nucleophilic initiator group of the initiator.

The catalysts can be removed by selective precipitation or in the case of the solid supported catalysts, simply by filtration. The block copolymer can comprise residual catalyst in an amount of 0 wt % (weight percent) or more, based on total weight of the block copolymer and the residual catalyst. The amount of residual catalyst can also be less than 20 wt %, less than 15 wt %, less than 10 wt %, less than 5 wt %, less than 1 wt %, or most specifically less than 0.5 wt % based on the total weight of the block copolymer and the residual catalyst.

Endcap Agents

An endcap agent can prevent further chain growth and stabilize the reactive end groups from unwanted side reactions, such as chain scission. Endcap agents include, for example, compounds for converting terminal hydroxyl groups to esters, such as acid anhydrides (e.g., acetic anhydride), acid chlorides (acetyl chloride), and/or active esters (e.g., p-nitrophenyl esters). Other endcap agents include alkyl and aryl isocyanates, which form carbamates (urethanes) with terminal hydroxy groups. Other endcap agents include alkylating agents capable of forming alkyl ethers, aromatic ethers including benzyl ethers, silyl ethers, acetals, ketals, and the like. Still other endcap agents include perhalogenated (e.g., perfluorinated) derivatives of any of the foregoing endcap agents. In an embodiment, the endcap agent is acetic anhydride, which converts reactive hydroxy end groups to acetate ester groups.

The following sections describe different methods of purifying the diblock polymer.

Method 1

This method utilizes a solvent mixture to fractionate an initial diblock copolymer formed when the ROP is conducted for a duration time corresponding to about 50% to 100%, more particularly about 85% to 100% consumption of a cyclic carbonate monomer and/or a cyclic ester monomer. For a given set of reaction conditions (e.g., temperature, solvent, type of atmosphere, relative molar amounts, and other reaction parameters), the consumption of the cyclic carbonate monomer and/or cyclic ester monomer can be monitored using any suitable analytical technique (e.g., proton nuclear magnetic resonance ($^1$H NMR)).

The ROP produces an initial block copolymer containing a living end group (e.g., hydroxy group), which is a nucleophilic group capable of undergoing further chain growth and/or initiating a ROP of a different cyclic carbonyl monomer. Preferably, the active living end group is deactivated by addition of an endcapping agent to the reaction mixture, thereby terminating the polymerization and forming an endcapped initial block copolymer containing a protected nucleophilic end group. The endcapped initial block copolymer is not capable of initiating a ROP. As an example, a polycarbonate formed by ROP of a cyclic carbonate monomer has a living end containing a nucleophilic hydroxy group, which can be deactivated by addition of a suitable acylating agent (e.g., acetyl chloride, acetic anhydride) to form a protected hydroxy group (e.g., as an acetyl ester) as described above.

The isolated initial block copolymer or the endcapped initial block copolymer ("crude block copolymer") can contain polymeric impurities derived from the cyclic carbonyl monomer that are not covalently linked to the polymeric initiator. Polymeric impurities can include polycarbonate and/or polyester homopolymer initiated by traces of water, cyclic polycarbonate and/or polyester formed by backbiting of the living hydroxy end group on the polycarbonate and/or polyester backbone of the initial block copolymer. These impurities can adversely affect the self-assembly properties of the initial block copolymer.

The polymeric impurities can be removed by the following fractionation process. A first solution is prepared containing the initial block copolymer dissolved in a minimal amount of a solvent (e.g., THF) capable of dissolving each block of the block copolymer. The first solution contains the initial block copolymer at a concentration of about 20 wt % based on total weight of the first solution. The first solution is then added to an excess amount (about 200 to 400 times the amount of crude polymer by weight) of a solvent mixture comprising a first solvent and a second solvent in a volume ratio of about 40:60 to about 60:40, respectively, wherein the first solvent is a non-solvent for the first block and the second block, and the second solvent is a non-solvent for the first block and a solvent for the second block. In an embodiment, the first solvent is MeOH and the second solvent is acetonitrile. The solvent mixture selectively dissolves the polymeric impurities, allowing the final block copolymer to precipitate as a solid that can be substantially free of the polymeric impurities. The fractionation procedure can be repeated one or more times as necessary to form the block copolymer used for self-assembly applications.

Method 2

In a second method, a trial ROP is performed using the given set of reaction conditions that includes the ROP polymeric initiator. The amount of consumed cyclic carbonyl monomer is monitored (e.g., % consumption) as a function of ROP duration time t as in Method 1, allowing the ROP to proceed to 85% to 100% consumption of the cyclic carbonyl monomer. A graph is plotted of the percent consumption of the cyclic carbonate as a function of ROP duration time t in minutes.

From the scatter plot of the collected data points, a second order polynomial function F(t) (i.e., a trendline) can be fitted to the plotted points, wherein F(t) expresses the amount of consumed cyclic carbonyl monomer as a function of ROP duration time t. The $R^2$ (R-squared) coefficient for F(t) preferably has a value of about 0.85 to 1.0, more preferably 0.9 to 1.0.

Using the expression of F(t), a time $t_1$ corresponding to 50% consumption of the cyclic carbonyl monomer can be calculated.

The first derivative of F(t), denoted F'(t), is then calculated for each measurement time t.

The value of F'(t) at 50% cyclic monomer conversion is then determined. Using the value of F'($t_1$) at 50% cyclic monomer conversion, ROP duration times $t_2$ and $t_3$ are determined corresponding to a slope change of −10% and −20% relative to the slope at 50% consumption of cyclic carbonyl monomer.

The ROP is then conducted using the given reaction conditions, stopping the ROP at duration time (t'), wherein $t_1 \le t' \le t_3$, and more preferably $t_2 \le t' \le t_3$. Using these modified reaction conditions, a block copolymer for self-assembly can be obtained directly that is free of, or substantially free of, polymer impurities that do not comprise a block derived from the polymeric initiator. Optionally, the block copolymer can be further treated with the solvent mixture as described above under Method 1 to remove any remaining polymeric impurities.

Method 3

In Method 3, the mathematical expression for F'(t) is obtained as described above under Method 2. The value of F'(t) is then calculated for each ROP duration time t. Using the values of F'(t), the change in F'(t) between adjacent ROP duration times is calculated for each ROP duration times greater than 0. For example, the change in F'(t) at duration time $t_n$, denoted as F'($t_n$), is equal to F'($t_n$)−F'($t_{n-1}$), where n is a positive integer and $t_n$>0.

A second order polynomial trendline D(t) is obtained for a scatter plot of F'(t) as a function of t having the shape of an inverted parabola. D(t) has a first derivative D'(t) equal to zero at some ROP duration time t">0 that is less than the duration time corresponding to 100% consumption of the cyclic carbonyl monomer.

The ROP is repeated using the given reaction conditions, terminating the ROP at 0.8t" to about t". The resulting final block copolymer can be free of, or substantially free of, polymer impurities that do not comprise a block derived from the polymeric initiator. Optionally, the block copolymer can be further treated with the solvent mixture as described above under Method 1 to remove any polymeric impurities present.

Cyclic Carbonyl Monomers

Exemplary cyclic carbonyl monomers include cyclic carbonate compounds of Scheme 12, which can be used, for example, to form a polycarbonate block of the initial block copolymer.

Scheme 12

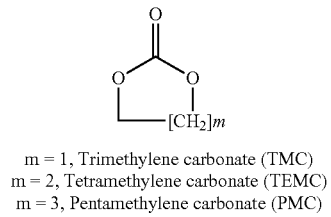

m = 1, Trimethylene carbonate (TMC)
m = 2, Tetramethylene carbonate (TEMC)
m = 3, Pentamethylene carbonate (PMC)

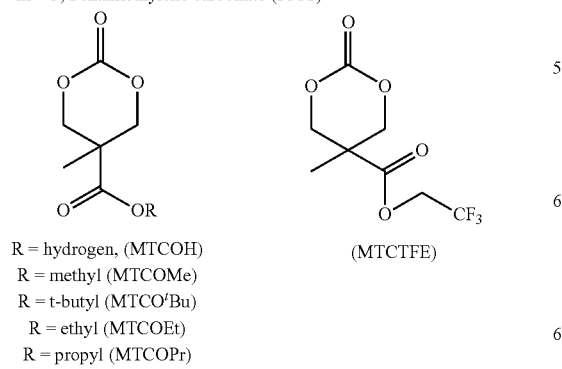

R = hydrogen, (MTCOH)
R = methyl (MTCOMe)
R = t-butyl (MTCO$^t$Bu)
R = ethyl (MTCOEt)
R = propyl (MTCOPr)

(MTCTFE)

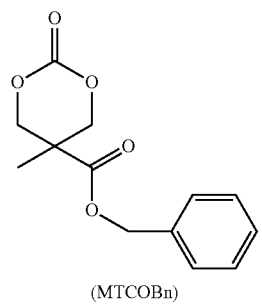

(MTCOBn)

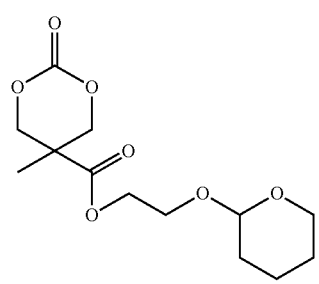

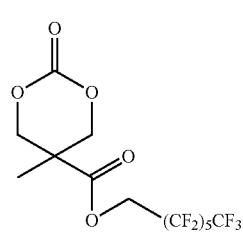 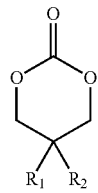

$R_1 = R_2$ = Methyl
$R_1$ = Methyl, $R_2$ = H
$R_1 = R_2$ = Ethyl
$R_1$ = Ethyl, $R_2$ = H

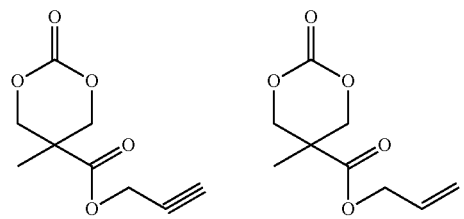

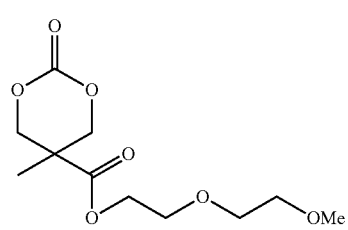

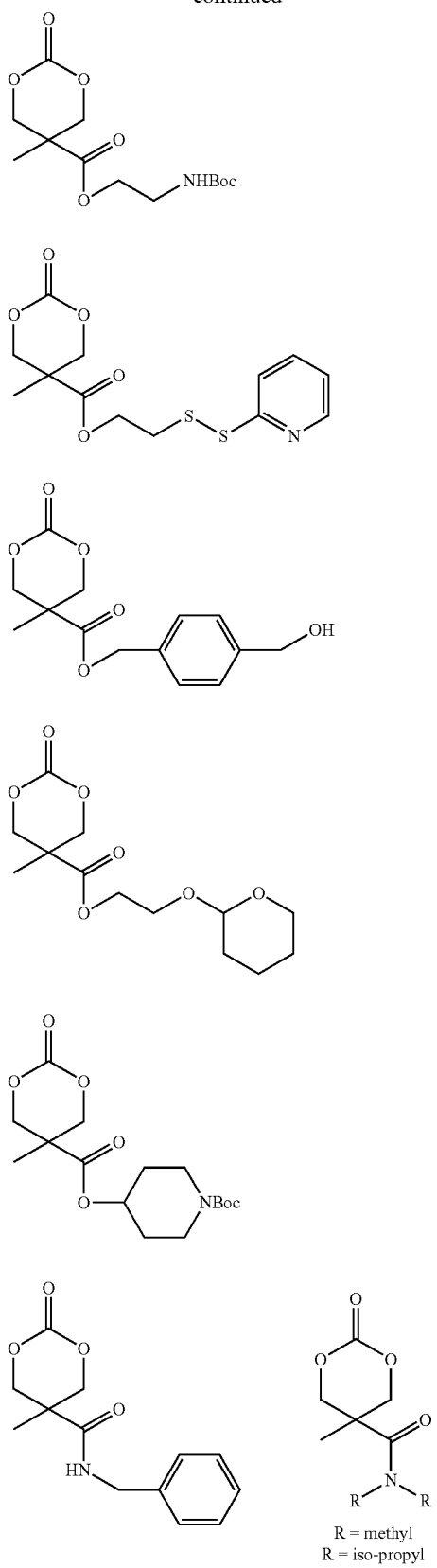
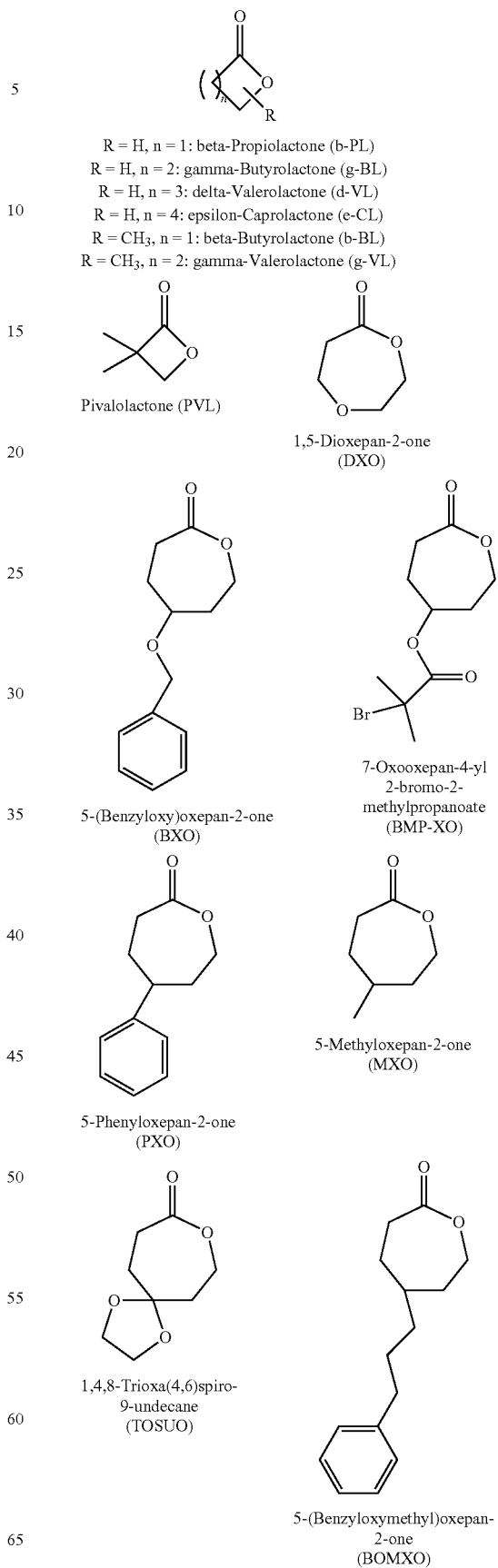
Other cyclic carbonyl monomers include cyclic esters (lactones), such as the compounds of Scheme 13.

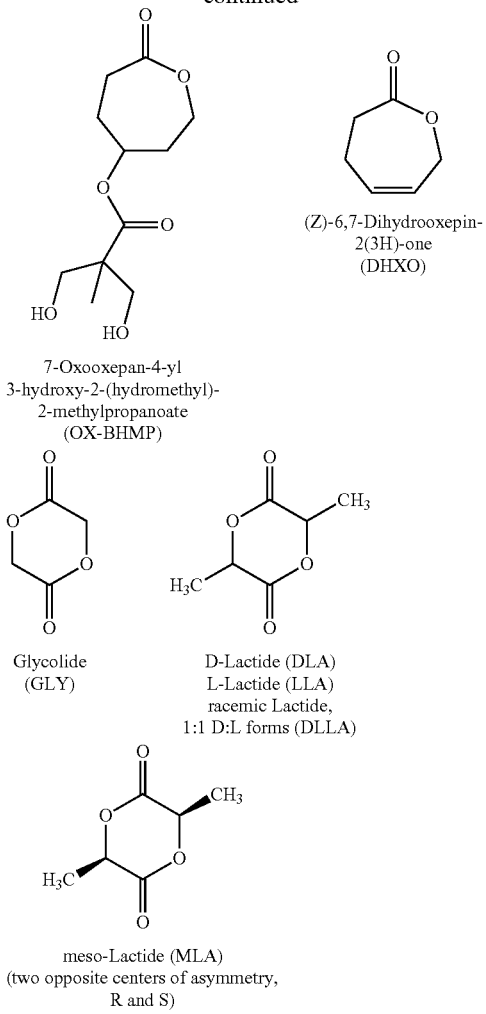

The above cyclic carbonyl monomers can be purified by recrystallization from a solvent such as ethyl acetate or by other known methods of purification, with particular attention being paid to removing as much water as possible from the monomer.

Underlayer Materials

Herein, an underlayer is any layer having contact with the bottom of the SA layer. As non-limiting examples, an underlayer can be a non-preferential or preferential layer with respect to the SA material, a backfill layer, resist layer, surface modified resist layer, substrate layer, surface modified substrate layer, or etched substrate layer. Underlayer material is any material having contact with the bottom of the SA layer. The underlayer material can comprise organic material, inorganic material, organometallic material, or a combination of the foregoing materials. Preferably, the underlayer material is non-preferential to the domains a block copolymer comprising the L' group. The underlayer can be preferential or non-preferential to the domains of an otherwise identical self-assembled block copolymer in which all fluorines of L' are replaced by hydrogen.

Underlayer materials include homopolymers, random copolymers, and block copolymers. The underlayer materials can be used singularly or in combination.

The underlayer material can comprise an alcohol hydroxyl group. These materials include hydroxyl-terminated polymers (e.g., hydroxyl-terminated poly(styrene), hydroxyl-terminated poly(styrene-co-methyl methacrylate and blends of hydroxyl-terminated poly(styrene), hydroxyl-terminated poly(methyl methacrylate), and poly(styrene-b-methyl methacrylate)) and hydroxyl-functionalized polymers (e.g., poly(styrene-co-methyl methacrylate-co-2-hydroxyethyl methacrylate)).

Other underlayer materials include polymers comprising reactive groups such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly (styrene-co-methyl methacrylate-co-vinyl benzocyclobutane), and poly(alpha-methyl styrene-co-methyl methacrylate)). The reactive polymers can react as a result of thermal or photochemical treatment either alone or in conjunction with an additional crosslinking agent. In particular, a catalytic species such as a strongly acidic species can be used to facilitate reaction. The strongly acidic species can be directly incorporated into the underlayer material or the solution comprising the underlayer material. Alternatively, a thermal acid generator or photoacid generator molecule can be used to generate an acidic species as a result of thermal or photochemical treatment, respectively.

Other non-limiting examples of underlayer materials include materials used in anti-reflection coatings (ARC) layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (e.g., optical properties, surface energy, etch resistance). The polymer components also typically contain a plurality of reactive sites distributed along the polymer for reaction with a crosslinking component.

More specific materials used in ARC layers include poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly (4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly (4,4'-hexafluoroisopropylidenebisphenol-co-epichlorohydrin), poly(4,4'-sulfonylbisphenol-co-epichlorohydrin), poly(bisphenol AF adipic ester), poly (bisphenol AF succinic ester), poly(4,4'-hexafluoroisopropylidenediphthalate-co-epichlorohydrin), poly(4,4'-hexafluoroisopropylidenediphthalate-co-poly(bisphenol AF), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-coepichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidene-bis[4-aminophenyl]-co-glycerol carbamate), poly(isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl endcapped poly(bisphenol A-co-epichlorohydrin), and silicon-containing anti-reflection coating A940 from Shin Etsu. Another more specific underlayer material comprises poly(styrene-co-epoxydicyclopentadiene methacrylate) random copolymer, P(S-r-EDCPMA):

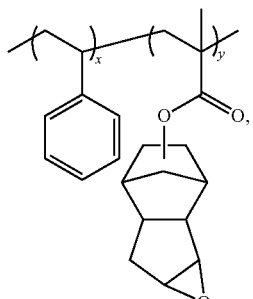

P(S-r-EDCPMA)

wherein x and y are each integers greater than 1.

Other underlayer materials include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane, poly(alpha-methyl styrene-co-methyl methacrylate), and poly(methyl glutarimide) (PMGI).

Other underlayer materials comprise polymer brush materials, including hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing materials.

Other underlayer materials include self-assembled monolayers.

A layer comprising an underlayer material can include a thin dielectric material having a thickness from 1 nm to 20 nm.

In an embodiment, the underlayer material is a polymer derived from methyl methacrylate. In another embodiment, the underlayer material is a brush methacrylate homopolymer (e.g., hydroxyl-terminated poly(methyl methacrylate) (PMMA)). In another embodiment, the underlayer material includes an etch-resistant material.

Underlayer surfaces possessing desirable characteristics can comprise: cross linked organic polymer including an epoxy-based homopolymer or copolymer, organic homopolymers or copolymers, self-assembled monolayers, polymer brushes, cross-linked organosilicates, random copolymer brushes, random cross-linked copolymers, mixtures of polymer brushes or cross-linked polymers, ARC materials, oxidized silicon, and combinations of the foregoing materials.

Polymer brushes can provide a modified surface that is non-preferential or preferential to the SA material. A modified surface can be formed by reactively modifying a surface to a desired thickness and surface properties using polymeric brush precursors having a desired composition, often followed by an additional rinse step to remove non-bound material. The composition of a random copolymer brush layer can be tuned to afford the desired surface properties. This can be accomplished in some instances by randomly copolymerizing two monomers, for example the same monomers used in the preparation of a block copolymer for self-assembly, in a precise ratio. In instances where otherwise useful self-assembling materials (i.e., those that can form domains) exist for which it is unfeasible to synthesize random copolymers of repeating units of each polymeric block components (such as where different polymerization mechanisms would be required), end-group functionalization or incorporation of reactive-group containing monomers can be used to functionalize polymers to provide grafting sites. Thermally crosslinkable underlayers based on, for example, vinyl benzocyclobutene, can also be used. Photo-patternable underlayers, based on random copolymers of the monomers of the self-assembling material with an appropriate functional monomer, for example, monomers having azide, glycidyl or acryloyl groups, can also be used.

The underlayer surface can also be a coating of a cross-linked epoxy-containing polymer prepared from monomers including glycidyl (meth)acrylate, 2,3-epoxycyclohexyl (meth)acrylate, (2,3-epoxycyclohexyl)methyl (meth)acrylate, 5,6-epoxynorbornene (meth)acrylate, epoxydicyclopentadienyl (meth)acrylate, and combinations including at least one of the foregoing. Herein, where "(meth)acrylate" is used, either an acrylate or methacrylate is contemplated unless otherwise specified. In some embodiments for example, specifically useful monomers include glycidyl methacrylate and epoxydicyclopentadienyl methacrylate.

Epoxy-containing polymers also include copolymers or terpolymers further containing at least one additional monomer in addition to the epoxy-containing monomer. Exemplary additional monomers include methyl (meth)acrylate, ethyl (meth)acrylate, butyl (meth)acrylate, hexyl (meth)acrylate, cyclohexyl (meth)acrylate, benzyl (meth)acrylate, ethylcyclopentyl (meth)acrylate, methylcyclopentyl (meth)acrylate, dicyclopentyl (meth)acrylate, 2-hydroxy ethyl (meth)acrylate, 2-hydroxy propyl (meth)acrylate, hydroxyadamantyl (meth)acrylate, adamantyl (meth)acrylate, methyladamantyl (meth)acrylate, ethyladamantyl (meth)acrylate, phenyladamantyl (meth)acrylate, hydroxyadamantyl (meth)acrylate, isobornyl (meth)acrylate, benzyl (meth)acrylate, gamma-butyrolactone (meth)acrylate, 5-methacryloxy-2,6-norbornane carbolactone, 5-acryloxy-2,6-norbornane carbolactone, 2,2,2-trifluoroethyl (meth)acrylate, 1,1,1,3,3,3-hexafluoroisopropyl (meth)acrylate, styrene, 4-methyl styrene, a-methyl styrene, 4-hydroxy styrene, 4-acetoxy styrene, ethylene, propylene, 1-butene, 1,3-butadiene, vinyl acetate, dihydropyran, norbornene, maleic anhydride, or a combination including at least one of the foregoing additional monomers. The composition of the epoxy-containing polymer can be adjusted by varying the ratios and identities of the comonomers and/or by selecting the structure and/or functionality of the pendant group(s) on the (meth)acrylates.

Specifically useful epoxy-containing polymers include poly(epoxydicyclopentadienyl methacrylate) homopolymer or poly(styrene-ran-epoxydicyclopentadienyl methacrylate), a random copolymer of styrene and epoxydicyclopentadienyl methacrylate.

Organosilicate or silicon oxide-based coatings of the substrate can also be used to provide an underlayer surface. Useful surfaces can be provided by deposition of silicon dioxide or organosilicate as a vapor-deposited layer, or as a spin-on layer (organic spin-on glass, abbreviated OSG). Organosilicones, organo- or hydridosilsesquioxanes, or hybrid systems of these materials can be used to provide the underlayer surface, where such organosilicate coatings are advantageously crosslinkable to form a solid underlayer surface. Useful organosilicates include those derived from the hydrolytic condensation, catalyzed by acid or base, of hydridotrialkoxysilanes, alkyltrialkoxysilanes, alkyltrihalosilanes, dialkyldialkoxysilanes, dialkyldihalosilanes, tetraalkoxysilanes, bis(alkylenetrialkoxysilanes), and the like. Exemplary alkoxysilanes useful for preparing organosilicates include hydridotrimethoxysilane, hydridotriethoxysilane, dimethyldimethoxysilane, dimethyldiethoxysilane, methyltrimethoxysilane, ethyltrimethoxysilane, ethyltriethoxysilane propyltrimethoxysilane, propyltriethoxysilane, cyclohexyltriethoxysilane, phenyltriethoxysilane, tetramethoxysilane, tetraethoxysilane (TEOS), 1,2-ethylene bis (triethoxysilane), vinyltrimethoxysilane, vinyltriethoxysilane, glycidoxypropyltrimethoxysilane, epoxycyclohexylethyltriethoxysilane, (meth)acryloxypropyltrimethoxypropylsilane, (meth)acryloxypropyltriethoxypropylsilane, combinations of these, and the like.

An underlayer can comprise an etch-resistant material including, but not limited to, a material selected from hydrogen silsesquioxane, methyl silsesquioxane, an alkyl silsesquioxane, an alkene silsesquioxane, an aryl silsesquioxane, an arylene silsesquioxane, a silicon-based resist, an inorganic resist, a silicon-based ARC, a metal-based ARC, silicon oxide, a silicon oxynitride, a silicon-based spin-on-dielectric, a metal, a metal oxide, a metal nitride, a metal oxynitride, and a metal carbide, provided that a suitable etch chemistry exists for removing some domains of a self-assembling material selectively to other domains and the etch-resistant material. In one embodiment, the etch-resistant material can include hydrogen silsesquioxane.

A layer of such etch-resistant material formed on the substrate can be deposited by any suitable method and is not particularly limited. Where the etch-resistant material is soluble in solutions, the application of an etch-resistant material layer to a surface of the substrate can be accomplished by a process including, for example, spin-casting, dip-coating, doctor blading, spray dispense, or other suitable coating method, which is compatible with the processes and equipment used in microelectronics fabrication assembly lines. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, or a combination of the foregoing casting solvents.

In another example, the etch-resistant material can be deposited from the vapor phase by a process including, chemical vapor deposition (CVD), plasma enhanced CVD, atomic layer deposition (ALD), sputtering, thermal evaporation, electron beam evaporation, pulsed laser deposition, or other suitable deposition method that is compatible with the processes and equipment used in microelectronics fabrication.

An underlayer material can be applied by any suitable method and is not particularly limited. Where polymer-based underlayer material is desired, the application of such layers to a surface of the substrate can be accomplished by a process including, for example, spin-casting, dip-coating, doctor blading, spray dispense, or other suitable coating method, which is compatible with the processes and equipment used in microelectronics fabrication assembly lines.

Solvents that can be used to cast underlayer materials on a substrate vary with the solubility requirements of these materials. Exemplary casting solvents include, but are not limited to: toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), and acetone.

The surface energy or composition required for an underlayer material depends on the application. For example, in order to form polystyrene (PS)-poly(methyl methacrylate) (PMMA) perpendicularly oriented lamellae, a poly(styrene-r-methyl methacrylate) random copolymer layer can be employed as a non-preferential underlayer material.

As another example, for an unpatterned surface, a brush composition can comprise 57-70% polystyrene (PS). However, the ideal underlayer material for a patterned surface (e.g., one having a chemo-epitaxial pre-pattern) can differ from that designed for an unpatterned surface, and the ideal underlayer material can depend upon the composition of the directing portion of the chemical pattern (e.g., PS or PMMA preferential) and the multiplication factor, as described in Liu, et al., "Chemical Patterns for Directed Self-Assembly of Lamellae-Forming Block Copolymers with Density Multiplication of Features", Macromolecules, 2013, 46, 1415-1424. The multiplication factor for spatial frequency multiplication refers to the ratio of the pitch of the chemo-epitaxial pre-pattern to the characteristic pitch (Lo) of a self-assembling material. The ideal underlayer material can be different for different BCP morphologies (e.g., perpendicular cylinders versus lamellae).

For a given underlayer material, the efficacy and the surface properties of the material can depend on various factors. For example, the efficacy and surface property of an underlayer-modified substrate can depend on the thickness of the underlayer material, the surfaces underneath the underlayer materials, the process condition of underlayers materials as well as the topography and pattern density of the substrate where the underlayer is applied for surface property control. The molecular architecture of the underlayer material can have an effect. For example, a polymer brush underlayer material can have a composition range different from that of a cross-linked underlayer material due to difference in mobility of the brush. For the same reason, a higher molecular weight brush can act differently compared to a lower molecular weight brush. Similar changes in the efficacy of the underlayer can be observed for cross-linked underlayer materials having the same composition but different molecular weights. The efficacy of the underlayer can also depend on the thickness of the self-assembly material layer above the underlayer according to the relative difference in surface free energies among the polymeric block components. The exact orientation of polymer domains at the air interface or the polymer/underlayer interface can be other than perpendicular to the substrate, even if the majority of each polymer domain is perpendicularly oriented.

Layered Structures

The substrate is a layered structure that comprises an underlayer. The underlayer can be formed by disposing on a first layered structure (first substrate) a solution containing an above-described underlayer material, a solvent, and optionally a member of the group consisting of thermal acid generators (TAGs), photo-acid generators (PAGs), catalysts, and combinations thereof, and removing the solvent (e.g., by a thermal bake and/or exposure to actinic light), thereby forming a second layered structure (second substrate) comprising a top layer, which is an underlayer for the SA layer. The underlayer preferably comprises a covalently bound form of the underlayer material linked to an underlying substrate layer. Optionally, the second layered structure can be rinsed with a solvent to remove any non-bound underlayer material. The thermal bake can be performed at a temperature between about 80° C. and about 250° C. for between about 1 second and about 24 hours, more preferably between about 120° C. and about 250° C. for between about 1 minute and about 15 minutes.

Also disclosed are compositions for preparing the SA layers. The compositions comprise a solvent and 0.1-5 wt % of a disclosed block copolymer in contact with the solvent (i.e., dissolved and/or dispersed in the solvent), wherein wt % is based on total weight of the composition. The compositions are suitable for forming a film layer (SA layer) comprising the block copolymer. The solution can be applied to an underlayer of a substrate using any suitable coating technique (e.g., spin coating) followed by removal of the solvent, thereby forming an initial film layer comprising the BCP. The initial BCP film layer has a top surface in contact with an atmosphere and a bottom surface in contact with an underlayer.

The following schematic diagrams illustrate methods of forming substrates comprising underlayers and their use in forming perpendicularly oriented lamellar domain patterns with the disclosed block copolymers.

FIGS. 5A to 5F are cross-sectional layer diagrams illustrating a process of directed self-assembly of an SA layer comprising a disclosed block copolymer, which produces perpendicularly oriented lamellar domains on an underlayer that is preferentially wetted by one domain of an otherwise identical self-assembled block copolymer in which all fluorines of L' are replaced by hydrogen. The process does not employ a lithographically prepared grapho-epitaxial or chemo-epitaxial pre-pattern. It should be understood that the layers and features are not drawn to scale.

Figure 5A:
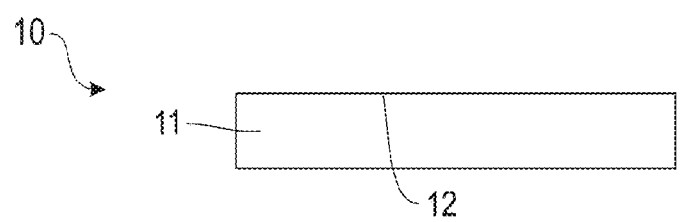
FIGS. 5A to 5F are cross-sectional layer diagrams showing a process of forming a perpendicularly oriented lamellar domain pattern using the disclosed BCPs comprising a fluorinated linking group L'. The underlayer can be preferential or non-preferential to the domains of an otherwise identical self-assembled BCP wherein all fluorines of L' are replaced by hydrogen.
Figure 5B:
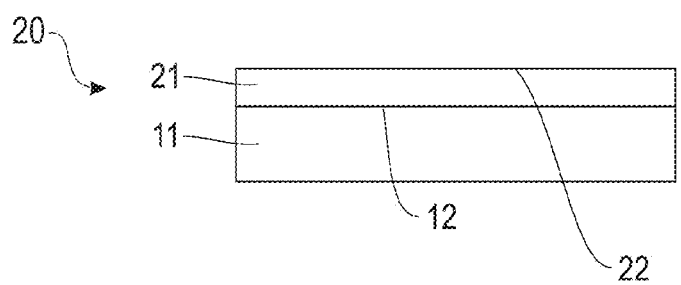

Layered structure 10 of FIG. 5A comprises substrate 11 having substrate surface 12. Substrate 11 can comprise one or more layers (not shown). A solution comprising a disclosed underlayer material (e.g., a poly(styrene-r-methyl methacrylate) brush homopolymer) dissolved in a suitable solvent is applied (e.g., by spin coating) to substrate surface 12. Removal of the solvent from the applied layer and an optional post-application bake (PAB) (e.g., 115° C. for 1 minute) forms layered structure 20 (FIG. 5B), also referred to as a "modified substrate". Layered structure 20 comprises underlayer 21, which comprises underlayer material bound by at least one covalent bond to substrate 11. Optionally, layered structure 20 can be rinsed with a solvent to remove any non-bound underlayer material.

Figure 5C:
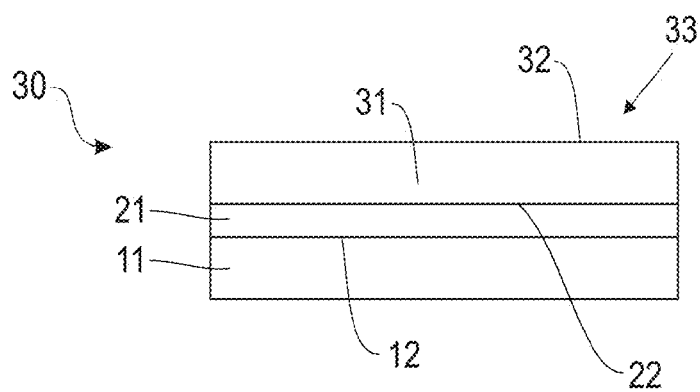

Underlayer 21 has underlayer surface 22. A solution comprising a disclosed high-chi block copolymer (e.g., comprising a poly(trimethylstyrene-r-styrene)-b-poly(MTC-Me) block copolymer comprising a disclosed perpendicular junction group L') and a solvent is applied to underlayer surface 22 using any suitable technique (e.g., spin coating). Removal of the solvent followed by an optional post-application bake (PAB) (e.g., 115° C. for 1 minute) produces layered structure 30 (FIG. 5C).

Layered structure 30 comprises SA layer 31 comprising the block copolymer, which is disposed on underlayer surface 22. Underlayer surface 22 can be non-preferential or preferential to the domains of an otherwise identical self-assembled block copolymer in which all fluorines of L' are replaced by hydrogen. In this non-limiting example, and for purposes of illustration only, underlayer surface 22 is preferentially wetted by the domain of higher surface energy (e.g., poly(MTC-Me) domain) when all fluorines of L' are replaced by hydrogen.

SA layer 31 has a top surface 32 in contact with an atmosphere interface 33. Atmosphere interface 33 can be non-preferential or preferential to the domains of an otherwise identical self-assembled block copolymer in which all fluorines of L' are replaced by hydrogen. In this non-limiting example, and for purposes of illustration only, atmosphere interface 33 is preferentially wetted by the domain of lower surface energy (e.g., P(TMSS-r-Sty) domain) when all fluorines of L' are replaced by hydrogen.

Figure 5D:
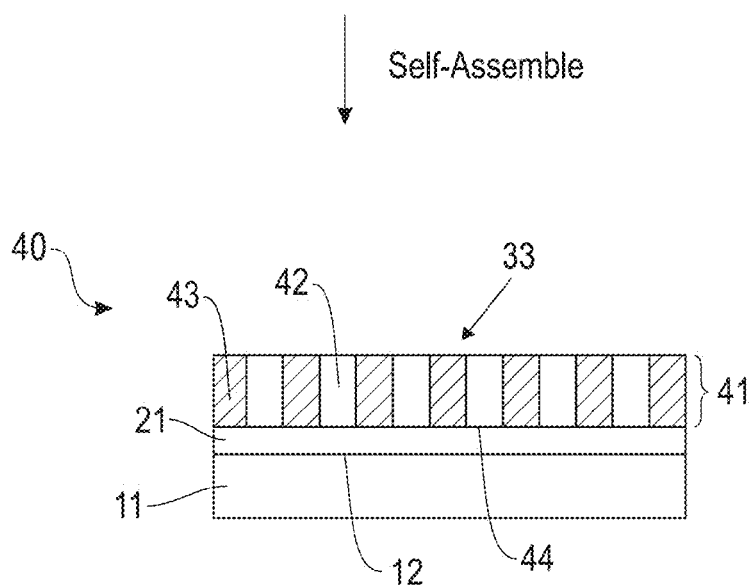

SA layer 31 is then allowed or induced to self-assemble by thermally treating SA layer 31 at a suitable temperature for a suitable period of time (e.g., annealing layered SA layer 31 at a temperature between about 80° C. and about 250° C. for between about 1 second and about 24 hours), thereby forming layered structure 40 (FIG. 5D). Structure 40 comprises perpendicularly oriented domain pattern 41 of the self-assembled block copolymer disposed on underlayer surface 44. Domain pattern 41 comprises first lamellar domain 43 comprising a first block of the block copolymer (e.g., block A, P(TMSS-r-Sty) domain) and second lamellar domain 42 comprising a polycarbonate block (e.g., block B) of the high-chi block copolymer. Lamellae of first lamellar domain 43 and lamellae of second lamellar domain 42 have a perpendicular orientation relative to a main plane of underlayer 21.

One of the domains can be selectively removed (e.g., etched) or modified in the presence of the other domain. As an example, dry etching using a suitable gas ($O_2$) or wet/chemical etching technique can be used to selectively etch second lamellar domain 42 (polycarbonate domain). As another example, first lamellar domain 43 (block A domain) can be selectively etched by modifying second lamellar domain 42 (block B domain) by i) sequential infiltration synthesis (SIS) to infuse a material (e.g., metal oxide precursor) or ii) by solution infiltration of second lamellar domain 42 with a material (e.g., metal salt), followed by ion-etching of first lamellar domain 43. Selective removal of one of the domains can also remove underlayer material (not shown).

Figure 5E:
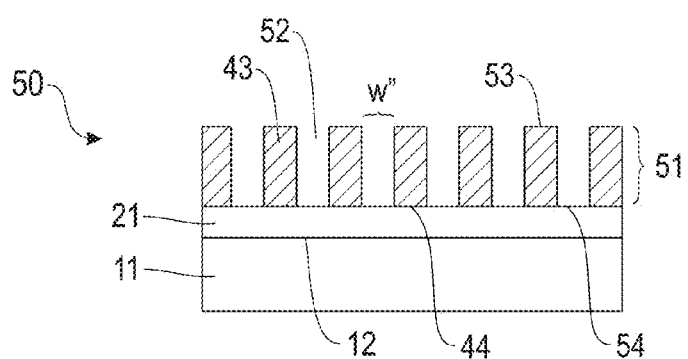
Figure 5F:
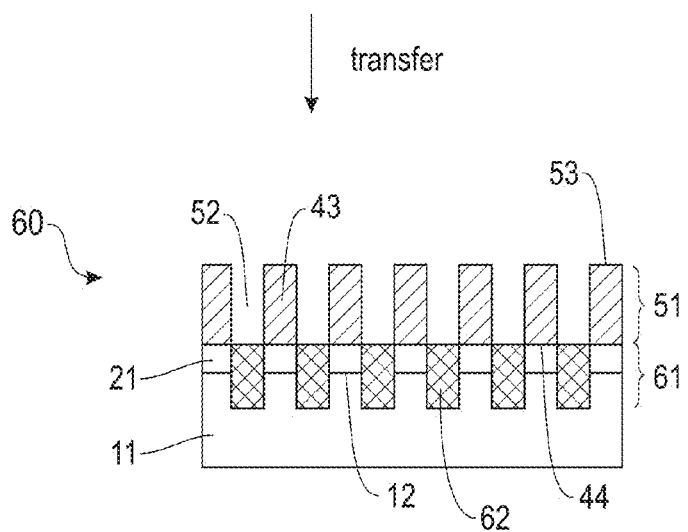

In the present example, second lamellar domain 42 is selectively removed, producing layered structure 50 (FIG. 5E). Layered structure 50 comprises etched domain pattern 51 comprising first lamellar domain 43 disposed on underlayer surface 44, and trenches 52 having bottom surface 54. Etched domain pattern 51 has a top surface 53 in contact with an atmosphere. The selective removal of second lamellar domain 42 can further remove material of underlayer 21 beneath second lamellar domain 42 (not shown).

Alternatively, first lamellar domain 43 can be selectively removed leaving second lamellar domain 42 (not shown).

Lamellae of first lamellar domain 43 can have different dimensions after removing second lamellar domain 42 compared to their dimensions before the selective removal.

Trenches 52 can have a width w" of about 0.5Lo (e.g., about 2 nm to about 40 nm, or for high-chi SA materials, w" is about 2 nm to about 10 nm).

The selective removal process can be carried out by any suitable process (e.g., a thermal bake for thermally decomposable materials, a reactive ion etch process, dissolution in a selective solvent, ultraviolet exposure, combinations of the foregoing). A chemical modification can be accomplished by a variety of known methods. For example, domains can be selectively reacted with silanes or silyl chlorides to introduce silicon content into a domain and thereby increase its plasma etch resistance. Alternatively, chemical agents can be used to bind or chemically couple to functional groups that are exclusively located in one type of self-assembled domain, to effect, for example, increased solubility property differences that can advantageously be used to selectively remove one domain in the presence of the other domain.

Etched domain pattern 51 can be transferred to substrate 11 using any suitable technique, thereby forming layered structure 60 (FIG. 5F) comprising transfer pattern 61. Patterned region 61 can be a pattern of lines, holes, pits, and/or a chemically altered state of the underlayer 21 and/or substrate 11, which are represented by areas 62. Patterned region 61 can extend into one or more layers, including the underlayer 21 and/or the substrate 11 (shown). The pattern transfer process can further comprise removal of first lamellar domain 43 (not shown).

Alternatively, etched domain pattern 51 can be transferred to substrate 11 using a tone inversion process (not shown). In this process, trenches 52 of etched domain pattern 51 are filled with a dielectric material (e.g., a metal oxide such as $TiO_2$, $Al_2O_3$, $HfO_2$), which can be disposed onto etched domain pattern 51 using any suitable technique (e.g., atomic layer deposition (ALD)) that causes minimal deformation or distortion of the etched domain pattern 51. Following the deposition and any preliminary etch to expose the top surface of the underlying lamellae of first lamellar domain 43, a selective etch can be performed to remove etched domain pattern 51, leaving an inverted relief pattern comprising protruding features composed of the dielectric material. The protruding features are separated by trenches formerly occupied by etched domain pattern 51. The inverted relief pattern can then be transferred further into one or more layers of substrate 11 using any suitable technique.

FIGS. 6A to 6E are cross-sectional layer diagrams illustrating a lithographic process utilizing a pre-formed graphoepitaxial pre-pattern with an SA layer that comprises a disclosed BCP comprising the perpendicular junction group L'. Layered structure 100 (FIG. 6A) comprises substrate 110 comprising underlayer 102 disposed on surface 103 of bottom layer 101 (e.g., silicon wafer). Grapho-epitaxial pre-pattern 104 is disposed on underlayer surface 105. Underlayer surface 105 can be non-preferential or preferential to the domains of an otherwise identical self-assembled BCP in which all fluorines of L' are replaced by hydrogen. Bottom layer 101 can comprise one or more sub-layers (not shown). Grapho-epitaxial pre-pattern 104 comprises topographic features 106 (e.g., resist features). Topographic features 106 have sidewalls 107 of height h', and mesas 108 of width w'. Topographic features 106 are separated by trenches 109 (recessed regions) which include bottom surfaces 112 comprising material of underlayer 102 in contact with an atmosphere. It should be understood that sidewalls 107, bottom surfaces 112 and mesas 108 represent the top surface of pre-pattern 104, which is in contact with an atmosphere. Pre-pattern 104 can be formed by any suitable lithographic technique. Topographic features 106 can comprise any suitable material 111 for directing self-assembly. For example, topographic features 106 can comprise a resist material, which can be a positive and/or negative tone resist material.

In the present invention, the topography of grapho-epitaxial pre-pattern 104 is not essential for perpendicular orientation control of the self-assembled lamellar domains of the high-chi block copolymer.

Figure 6A:
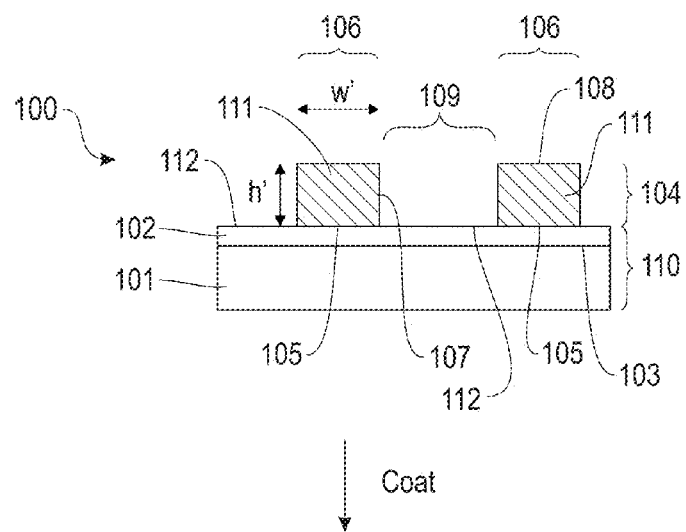
FIGS. 6A to 6E are cross-sectional layer diagrams showing a process of forming a perpendicularly oriented lamellar domain pattern with the disclosed BCPs comprising a fluorinated linking group L' using a grapho-epitaxial pre-pattern.
Figure 6B:
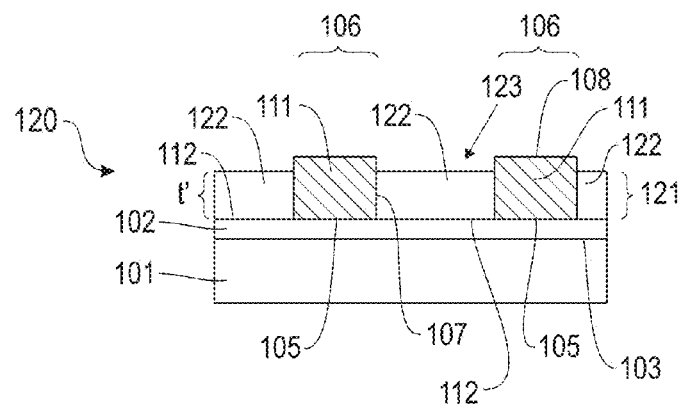
Figure 6C:
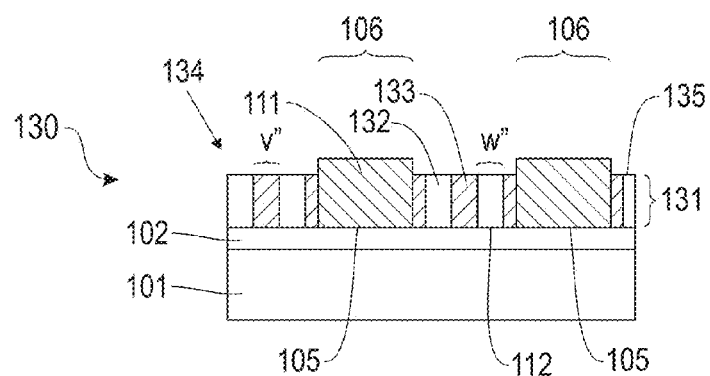

A coating mixture comprising the BCP comprising the L' group dissolved in a solvent is applied to pre-pattern 104 using any suitable technique (e.g., spin coating), thereby allocating the mixture substantially or exclusively in trench areas 109. Pre-pattern 104 is insoluble in or substantially insoluble in the solvent used to prepare the mixture. Removal of the solvent from the applied coating mixture provides layered structure 120 comprising SA layer 121 (FIG. 6B). SA layer 121 comprises regions 122 comprising the BCP. SA layer 121 is allocated substantially or wholly within trench areas 109 disposed on bottom surfaces 112 of trench areas 109. Height h' of features 106 is typically greater than or comparable to the thickness t' of the SA layer 121. Bottom surface 112 can be non-preferential or preferential to the domains of an otherwise identical self-assembled BCP in which all fluorines of L' are replaced by hydrogen, whereas atmosphere interface 123 is typically preferential to one of the domains of the otherwise identical self-assembled BCP in which all fluorines of L' are replaced by hydrogen. In this example, sidewalls 107 can be non-preferential or preferential to the domains of an otherwise identical self-assembled BCP in which all fluorines of L' are replaced by hydrogen, with the proviso that the surface properties of the sidewalls do not adversely affect self-assembly and orientation of the domains formed.

Self-assembly of SA layer 121 can be spontaneous and/or induced by thermally treating (annealing) SA layer 121 at a temperature between about 80° C. and about 250° C. for between about 1 second and about 24 hours. Self-assembly of the BCP comprising the L' group produces layered structure 130 (FIG. 6C) comprising perpendicularly oriented lamellar domain pattern 131. Domain pattern 131 comprises first lamellar domain 133 (e.g., PS domain, block A) having a width of v", and second lamellar domain 132 (e.g., polycarbonate domain, block B) having a width w". First lamellar domain 133 and second lamellar domain 132 are in contact with trench surface 112. Top surface 135 of domain pattern 131 is in contact with atmosphere interface 134, indicated by the arrow. In this example, sidewalls 107 of topographic features 106 are preferential to first lamellar domain 133. Therefore, lamellae of first lamellar domain 133 are positioned in contact with sidewalls 107. Lamellae of first lamellar domain 133 that are in contact with sidewalls 107 can have a width of about 0.5v". In an embodiment, v" and w" are about equal to 0.5Lo.

Figure 6D:
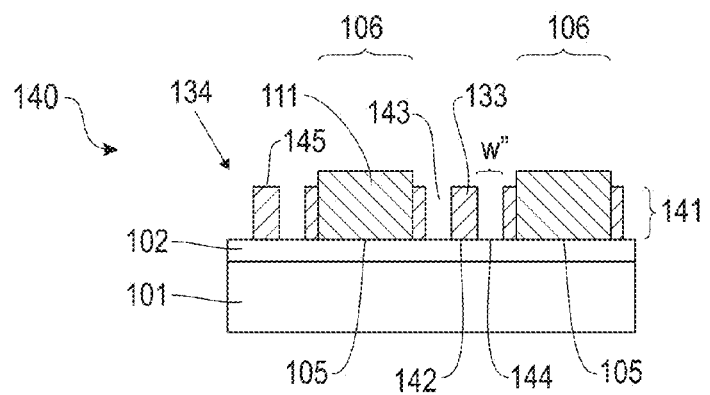

One of the domains, for example second lamellar domain 132 (e.g., block B, PMTC-Me block), can be selectively removed (e.g., ion-etched) or modified in the presence of the first lamellar domain 133 (e.g., block A, P(TMSS-r-Sty) block) to generate topographical or chemical contrast. Selective removal of one of the domains can also remove underlayer material (not shown), resulting in layered structure 140 comprising etched domain pattern 141 (FIG. 6D). Etched domain pattern 141 comprises first lamellar domain 133 disposed on underlayer surface 142, openings 143 having bottom surface 144, and topographic features 106. First lamellar domain 133 has top surface 145. Openings 142 can have a width w" of about 0.5Lo (e.g., about 2 nm to about 40 nm, or for a high-chi block copolymer about 2 nm to about 10 nm). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 106 (not shown).

Figure 6E:
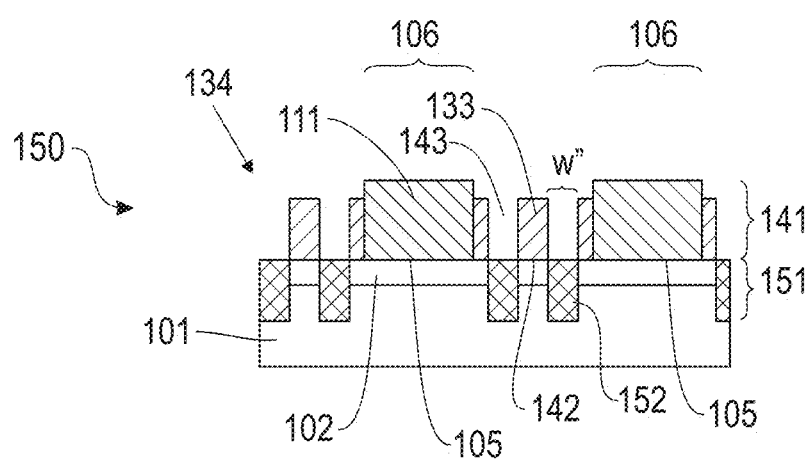

Finally, etched domain pattern 141 can be transferred to underlayer 102 and/or bottom layer 101, thereby forming layered structure 150 comprising patterned region 151 (FIG. 6E). Patterned region 151 can be a pattern of lines, holes, pits, and/or a chemically altered state of the substrate material represented by altered areas 152. Patterned region 151 can extend into one or more layers of substrate 110. The pattern transfer can be accomplished, for example, by using a reactive ion etch process. Features 106 and first lamellar domain 133 can be removed concomitantly or subsequently to formation of altered areas 152. The height of etched domain pattern 141 after the transfer can be less than the height of etched domain pattern 141 before the transfer.

Alternatively, etched domain pattern 141 can be transferred to substrate 110 using a tone inversion process as described further above (not shown).

FIGS. 7A to 7E are cross-sectional layer diagrams illustrating a lithographic process utilizing a pre-formed chemo-epitaxial pre-pattern with an SA layer that comprises a disclosed BCP comprising the L' group. Layered structure 200 (FIG. 7A) comprises substrate 210 comprising underlayer 202 disposed on surface 203 of bottom layer 201 (e.g., silicon wafer). Chemo-epitaxial pre-pattern 204 can be a material disposed on underlayer surface 205 (shown), can be a region of underlayer 202 whose surface properties differ from another region of underlayer 202 (not shown), or can include a mixture of the foregoing. Underlayer surface 205 can be non-preferential or preferential to the domains of an otherwise identical self-assembled BCP in which all fluorines of L' are replaced by hydrogen. Bottom layer 201 can comprise one or more sub-layers (not shown). In this example, chemo-epitaxial pre-pattern 204 comprises topographic features 206 (e.g., resist features). Topographic features 206 have sidewalls 207 of height h", and mesas 208 of width r". Topographic features 206 are separated by trenches 209 (recessed regions) which include bottom surfaces 212 comprising material of underlayer 202 in contact with an atmosphere. It should be understood that sidewalls 207, bottom surfaces 212 and mesas 208 represent the top surface of pre-pattern 204, and the top surface of pre-pattern 204 is in contact with an atmosphere. Pre-pattern 204 can be formed by any suitable lithographic technique. Topographic features 206 can comprise any suitable material 211 for directing self-assembly. For example, topographic features 206 can comprise a resist material, which can be a positive and/or negative tone resist material.

In the present invention, the topography of chemo-epitaxial pre-pattern 204 is not essential for perpendicular orientation control of the self-assembled lamellar domains of the high-chi block copolymer.

Figure 7A:
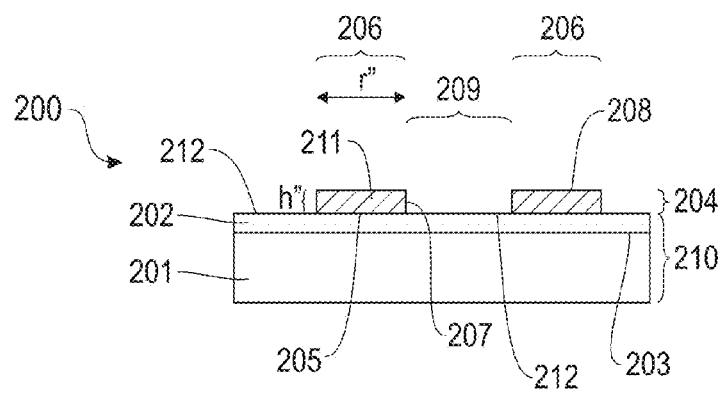
Figure 7B:
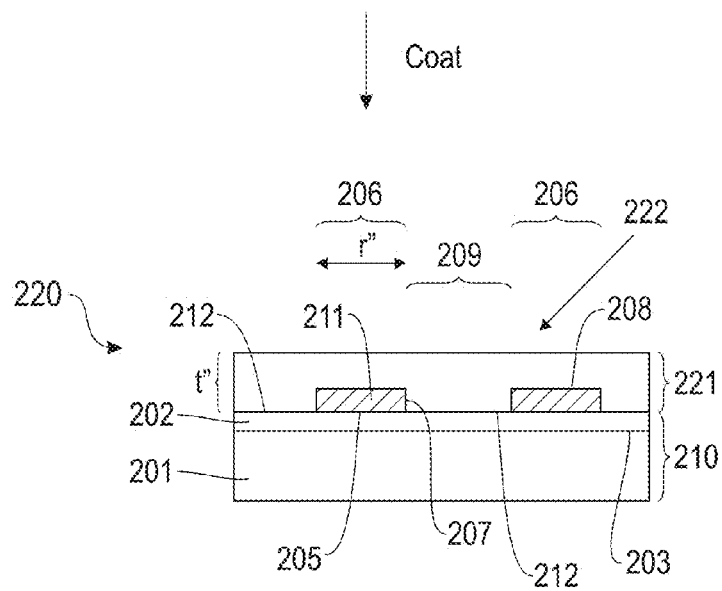

A coating mixture comprising the BCP dissolved in a solvent is applied to pre-pattern 204 using any suitable technique (e.g., spin coating). Pre-pattern 204 is insoluble in or substantially insoluble in the solvent used to prepare the mixture. Removal of the solvent from the applied coating mixture provides layered structure 220 comprising SA layer 221 (FIG. 7B). In this example, the SA layer is disposed on the top surface of pre-pattern 204 in contact with sidewalls 207, bottom surfaces 212 and mesas 208. That is, height h" of features 206 is less than the thickness t" of SA layer 221. Bottom surface 212 can be non-preferential or preferential to the domains of an otherwise identical self-assembled BCP in which all fluorines of L' are replaced by hydrogen. Mesas 208 can be non-preferential or preferential to the domains of an otherwise identical self-assembled BCP in which all fluorines of L' are replaced by hydrogen. Sidewalls 207 can be non-preferential or preferential to the domains of an otherwise identical self-assembled BCP in which all fluorines of L' are replaced by hydrogen, with the proviso that the surface properties of the sidewalls do not adversely affect self-assembly and orientation of the domains formed. Atmosphere interface 222 is typically preferential to the domains of an otherwise identical self-assembled BCP in which all fluorines of L' are replaced by hydrogen.

Self-assembly of the BCP comprising the fluorinated L' group produces layered structure 240 (FIG. 7C), which comprises perpendicularly oriented lamellar domain pattern 241. Self-assembly can be spontaneous and/or induced by thermally treating of SA layer 221 (e.g., annealing SA layer 221 at a temperature between about 80° C. and about 250° C. for between about 1 second and about 24 hours). Domain pattern 241 comprises first lamellar domain 242 (e.g., PS domain) having a width of v", and second lamellar domain 243 (e.g., polycarbonate domain) having a width w". First lamellar domain 242 and second lamellar domain 243 are in contact with trench surface 212 and mesas 208. Top surface 244 of domain pattern 241 is in contact with atmosphere interface 245, indicated by the arrow. In this example, sidewalls 207 of topographic features 206 are preferential to second lamellar domain 243. Therefore, lamellae of second lamellar domain 243 are positioned in contact with sidewalls 207. In this example, lamellae of second lamellar domain 243 that are in contact with sidewalls 207 have a width of about w". In an embodiment, v" and w" are about equal to 0.5Lo.

One of the domains, for example second lamellar domain 243 (e.g., block B, PMTC-Me), can be selectively removed (e.g., ion-etched) or modified in the presence of the first lamellar domain 242 (e.g., block A, P(TMSS-r-Sty) block) to generate topographical or chemical contrast. Selective removal of one of the domains can also remove underlayer material (not shown), resulting in layered structure 250 comprising etched domain pattern 251 (FIG. 7D). Etched domain pattern 251 has thickness a" and comprises i) first lamellar domain 242 disposed on underlayer surface 212 and mesas 208, ii) openings 253 having bottom surface 252, and iii) topographic features 206. First lamellar domain 242 has top surface 254. Openings 253 can have a width w" of about 0.5Lo (e.g., about 2 nm to about 40 nm, or for a high-chi block copolymer about 2 nm to about 10 nm). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 206 (not shown).

Figure 7E:
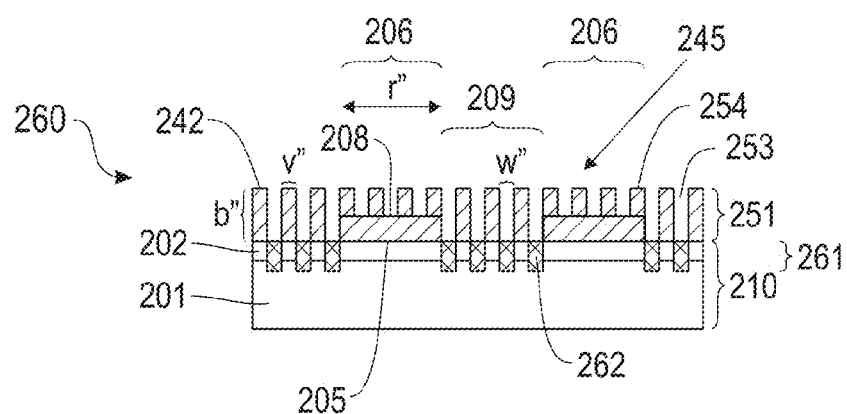

Lastly, etched domain pattern 251 can be transferred to underlayer 202 and/or bottom layer 201, thereby forming layered structure 260 comprising patterned region 261 (FIG. 7E). Patterned region 261 can be a pattern of lines, holes, pits, and/or a chemically altered state of the substrate material represented by altered areas 262. Patterned region 261 can extend into one or more layers of substrate 210. The pattern transfer can be accomplished, for example, by using a reactive ion etch process. Features 206 and first lamellar domain 242 can be removed concomitantly or subsequently to formation of altered areas 262. The height b" of etched domain pattern 251 after the transfer can be less than the height a" of etched domain pattern 251 before the transfer.

Alternatively, etched domain pattern 251 can be transferred to substrate 210 using a tone inversion process as described further above (not shown).

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, silicon nitride, titanium nitride, hafnium oxide, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have an anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

The morphology (e.g., shape, dimension, and orientation) of the self-assembled domains from block copolymer thin films is a function of block copolymer architecture (diblock, triblock), composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement), and linking group L'. By adjusting one or more parameters, the morphology can be adjusted to the need of a specific application.

Self-assembly of the SA layer can occur during film formation, during a post-application bake, or during a subsequent thermal annealing process. Thermal annealing processes include annealing at a constant temperature and thermal gradient annealing. More particularly, the SA layer comprising a high-chi block copolymer is thermally annealed at a temperature that is above the glass transition temperature ($T_g$) of the block copolymer but below the decomposition or degradation temperature ($T_d$) of the block copolymer. The thermal annealing step can be carried out at a temperature of between about 80° C. and about 250° C., more preferably between about 120° C. and about 250° C. The thermal annealing can be performed for a period between about 1 second and about 24 hours, and more particularly between about 1 minute to about 15 minutes. The thermally annealed block copolymer self-assembles to form ordered domains whose orientation is perpendicular to the underlying surface plane. For a given underlayer, block A composition, and block B composition, the L' group can shorten the annealing times to achieve perpendicular orientation compared to an otherwise identical block copolymer in which the fluorines of L' are replaced by hydrogen, thereby increasing manufacturing efficiency.

In general, the SA layer can have a thickness of 50 to 10000 angstroms, more particularly 100 to 5000 angstroms, and even more particularly 100 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of holes that can be transferred into the underlying substrate. Types of etching include any common etching applied in the manufacture of semiconductor devices, for example, dry-etching such as plasma etching, or wet-etching using selective solvents and/or vapors. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

The relief pattern of openings formed by selective removal of one of the domains can have a spatial frequency greater than that of a grapho-epitaxial pre-pattern or chemical pre-pattern used with the high-chi block copolymer.

Etch resistant materials can be applied to a substrate surface, underlayer surface, surface of a resist feature, and/or a domain pattern of the block copolymer for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

Also disclosed is a film comprising the self-assembled disclosed high-chi block copolymer, the film comprising lamellar domains having a perpendicular orientation relative to the main plane of the film. Further disclosed is a layered structure comprising a substrate that includes an underlayer and a film of the self-assembled disclosed high-chi block copolymer disposed on the underlayer, wherein the film comprises lamellar domains having a perpendicular orientation relative to the main plane of the substrate. In an embodiment, the layered structure is a semiconductor device.

The above-described processes can be used to form layered structures comprising metal wiring lines, holes for contacts or vias, insulation sections (e.g., damascene trenches or shallow trench isolation), and trenches for capacitor structures suitable for the design of integrated circuit devices. The method is especially useful in the context of creating patterned layers of oxides, nitrides or polysilicon.

The above-described methods advantageously allow self-assembled structures having reduced feature width and increased periodicity. The domain feature width can be from about 2 nm to about 40 nm, about 2 nm to about 20 nm, about 2 nm to about 15 nm, about 2 nm to about 10 nm, or more particularly between about 2 nm and about 9 nm.

The following examples illustrate the preparation of the disclosed block copolymers and their use in forming self-assembled layers. For purposes of demonstrating the present invention, the substrate can be a two layer structure comprising an underlayer disposed on a silicon wafer. The underlayer surface can be a planar surface having uniform surface properties (i.e., the underlayer surface can have no topographical or chemical patterning). The examples below utilize a planar underlayer of this type. The SA layer is disposed on the underlayer and has a top surface in contact with an atmosphere. The examples demonstrate that an SA layer comprising a high-chi BCP comprising a P(TMSS-r-Sty) block linked by a suitable L' group to a PMTC-Me block can self-assemble to form perpendicularly oriented lamellar domain pattern when the top surface of the SA layer has contact with the atmosphere and the SA layer comprises no other means of orientation control (e.g., use of a separate surface active agent, a grapho-epitaxial pre-pattern, a chemo-epitaxial pre-pattern, or a topcoat over the SA layer). Moreover, a domain pattern having a half pitch less than 10 nm can be selectively etched, leaving a relief pattern having improved critical dimension uniformity

EXAMPLES

Table 1 lists materials and source of the examples.

TABLE 1

| ABBREVIATION | DESCRIPTION | SUPPLIER |
|---|---|---|
| A940 | Silicon containing anti-reflective coating (SiARC) | Shin-Etsu Co. |
| AcCl | Acetyl Chloride | Sigma-Aldrich |
| AIBN | Azobisisobutyronitrile | Sigma-Aldrich |
| Anisole | Anisole | Sigma-Aldrich |
| BriBr | α-Bromoisobutyryl bromide | Sigma-Aldrich |
| BzOH | Benzyl alcohol | Sigma-Aldrich |
| CuBr | Copper (I) bromide | Sigma-Aldrich |
| DBU | 1,8-Diazabicyclo[5,4,0]undec-7-ene | Sigma-Aldrich |
| DCC | N,N'-Dicyclohexylcarbodiimide | Sigma-Aldrich |
| DCM | Dichloromethane | Sigma-Aldrich |
| DMAP | 4-Dimethylaminopyridine | Sigma-Aldrich |
| GMA | Glycidyl methacrylate, MW 142.2 | Sigma-Aldrich |
| HEBiB | 2-Hydroxyethyl 2-bromoisobutyrate | Sigma-Aldrich |
| Lac | D,L-lactide; 3,6-Dimethyl-1,4-dioxane-2,5-dione | Sigma-Aldrich |
| MeOH | Methanol | Sigma-Aldrich |
| PMDETA | N,N,N',N',N''-pentamethyldiethylenetriamine | Sigma-Aldrich |
| PGMEA | Propylene glycol monomethyl ether acetate | Sigma-Aldrich |
| Sty | Styrene, MW 104.15 | Sigma-Aldrich |
| TEA | Triethylamine | Sigma-Aldrich |
| THF | Tetrahydrofuran | Sigma-Aldrich |
| TMSS | p-Trimethylsilyl styrene MW 176.3 | Prepared below |
| Tol | Toluene | Sigma-Aldrich |

Herein, Mn is the number average molecular weight, Mw is the weight average molecular weight, and MW is the molecular weight of one molecule.

Cyclic carbonate monomer MTC-Me (MW=174) was prepared as previously reported (Y. ZHOU et al., Polymer, 45(16), 5459-5463; 2004).

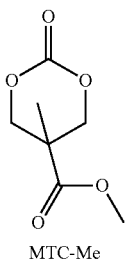

MTC-Me

Cyclic carbonate monomer MTC-Et (MW 188) was prepared according to the general procedure of J. Hedrick, et al., US 20110151566 A1, published Jun. 23, 2011.

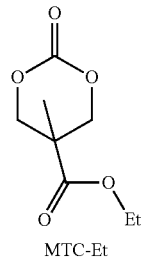

MTC-Et

4-Trimethylsilylstyrene was prepared according to the general procedure of J. Rathore, et al., "A Photocurable, Photoluminescent, Polycarbosilane Obtained by Acyclic Diene Metathesis (ADMET) Polymerization", Macromolecules, 2009, 42, 4614-4621.

The following commercially available fluorinated diol compounds (e.g., Synquest Laboratories) were used to prepare block copolymers containing linear fluorinated junction groups.

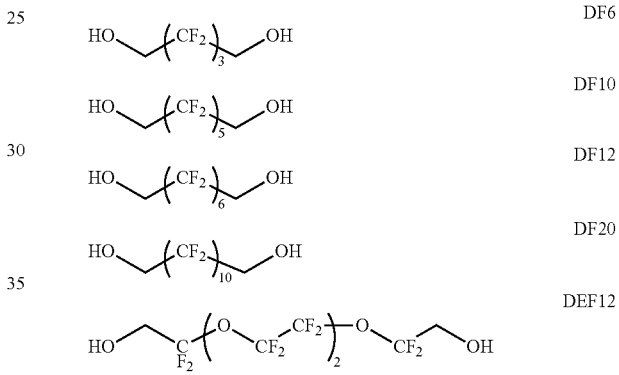

The following commercially available fluorinated mono-alcohol compounds were used to prepare block copolymers containing perpendicular fluorinated junction groups.

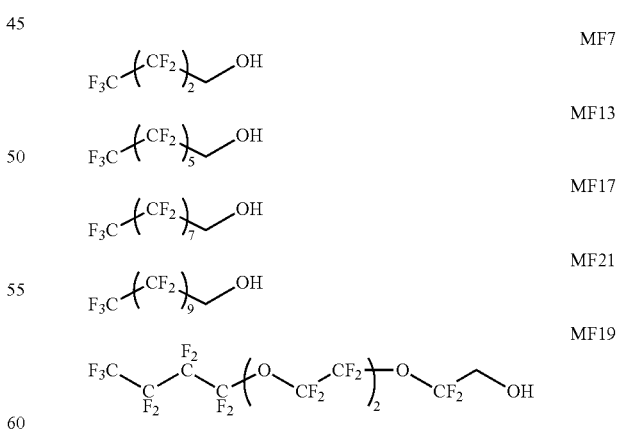

Preparation of ATRP Initiators

Example 1

Synthesis of mono-hydroxy functional ATRP initiator ATRP-1 (MW 715.2).

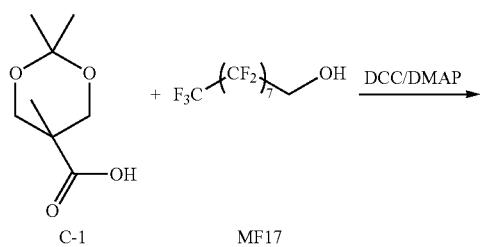

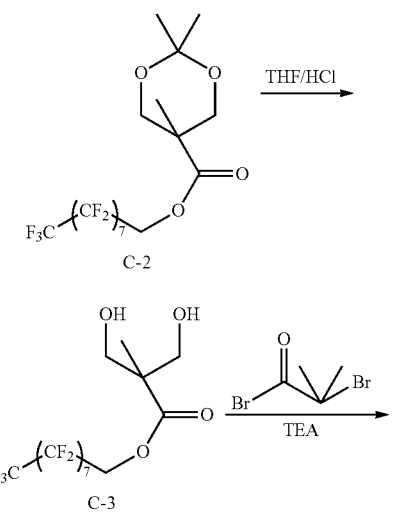

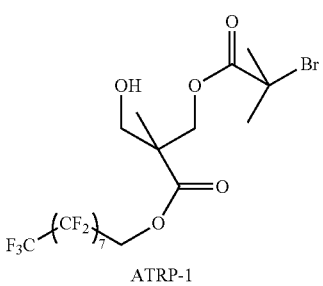

C-1 (0.58 g, 3.33 mmol), MF17 (1.0 g, 2.22 mmol), DMAP (0.271 g, 2.22 mmol), and DCM (30 mL) were added to a 100 ml round bottom flask (RBF) equipped with a magnetic stir bar. The reaction was stirred under $N_2$ for 10 minutes at room temperature after which point DCC (3.91 g, 18.96 mmol) in DCM (20 ml) was added dropwise over 20 minutes. The reaction was stirred for 24 hours and was stopped. The solution was filtered to remove the dicyclohexylurea, and the DCM was evaporated under vacuum. The resulting crude product was purified by passing through a silica gel column with hexane:EtOAc 85:15 v/v as the eluant to obtain the acetal-protected ester C-2. The product was confirmed by $^1$H NMR. 1H NMR (400 MHz, CDCl$_3$, 23° C.): delta 1.21 (3H), 1.46 (6H), 3.69 (2H), 4.20 (2H), and 4.71 (2H).

In the next step, C-2 (1.0 g) was added to THF (30 mL) in a 100 ml RBF equipped with a magnetic stir bar. To this solution, 1 M HCl (20 mL) was added, and the reaction was allowed to stir for 24 hours at room temperature. After this time, THF was removed under vacuum and EtOAC (50 ml) was added to the acidic water solution. The organic layer was washed with saturated $K_2CO_3$ and brine and dried over magnesium sulfate. Pure diol C-3 was collected by filtering the magnesium sulfate and evaporating the EtOAc under vacuum. The product was confirmed by 1H NMR. 1H NMR (400 MHz, CDCl$_3$, 23° C.): delta 1.14 (3H), 3.81 (2H), 3.97 (2H), and 4.71 (2H).

In the next step, C-3 (4.20 g 9.00 mmol) from the above step was dissolved in THF (40 mL) in a 250 ml RBF equipped with a magnetic stir bar. To this solution, TEA (0.41 g, 4.02 mmol) was added, and the reaction mixture was stirred under $N_2$ flow for 10 minutes at room temperature (r.t.). BriBr (0.58 g, 2.51 mmol) in DCM (10 mL) was then added dropwise over 30 minutes. The resulting mixture was further stirred at r.t. for 24 hours at which point the reaction was stopped by filtering the solution to remove the TEA.HCl salt. The filtrate was collected and washed once with saturated $K_2CO_3$, once with 1 M HCl, once with deionized water, and once with brine solution. The organic layer was collected over magnesium sulfate, and the crude product was obtained by filtering the DCM solution and evaporating the DCM layer under vacuum. The crude product was purified by column chromatography using a silica gel column with hexane: EtOAc 80:20 v/v as the eluant. The product ATRP-1 was confirmed by $^1$H NMR and $^{19}$F NMR. 1H NMR (400 MHz, CDCl$_3$, 23° C.): delta 1.32 (3H), 1.94 (6H), 2.24 (1H), 3.80 (2H), 4.37-4.46 (2H), 4.69 (2H). $^{19}$F NMR (400 MHz, CDCl$_3$, 23° C.): delta −199.41, −121.93, −122.72, −123.21, and −126.11.

Example 2

Synthesis of mono-hydroxy functional ATRP initiator ATRP-2.

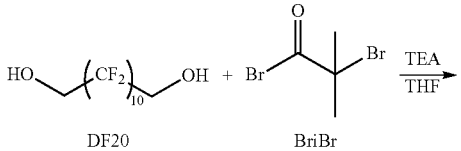

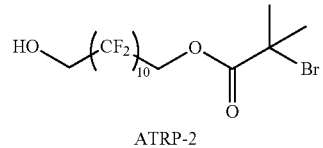

DF10 (2.5 g, 4.44 mmol) dissolved in dry THF (100 ml) was added to a 100 ml round bottom flask (RBF) equipped with a magnetic stir bar. To this solution, TEA (0.63 ml, 4.44 mmol) was added. The reaction was stirred under $N_2$ for 10 minutes at room temperature (r.t.), after which BriBr (0.25 ml, 2 mmol) was added dropwise over 10 minutes. The reaction was stirred for 24 hours, and the solution was filtered to remove the TEA.HCL salt. The THF was evaporated under vacuum and the resulting crude product was purified by passing through a silica gel column with hexane: EtOAc 80:20 v/v as the eluant to obtain the mono-hydroxy functional ATRP initiator ATRP-2 (~50% yield). The product was confirmed by $^1$H NMR and $^{19}$F NMR. $^1$H NMR (400 MHz, CDCl$_3$, 23° C.): delta 1.21 (3H), 1.46 (6H), 3.71 (2H), 4.21 (2H), and 4.69 (2H). $^{19}$F NMR (400 MHz, CDCl$_3$, 23° C.): delta −81.00, −120.48, −127.79.

Example 3

Synthesis of ATRP-3.

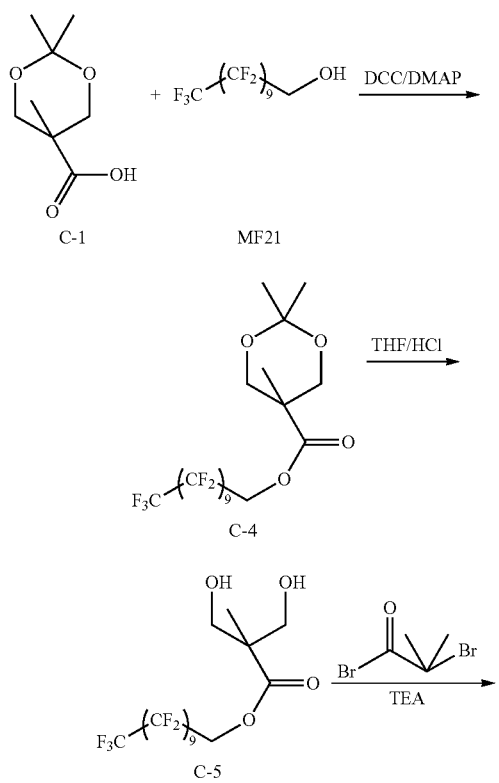

C-1 (3.0 g, 17.24 mmol), MF21 (6.32 g, 11.49 mmol), DMAP (1.40 g, 11.49 mmol), and DCM (300 mL) were added to a 500 ml round bottom flask (RBF) equipped with a magnetic stir bar. The reaction was stirred under $N_2$ for 10 minutes at room temperature, after which point DCC (3.55 g, 17.23 mmol) in DCM (20 ml) was added dropwise over 20 minutes. The reaction was stirred for 24 hours and was stopped. The solution was filtered to remove the dicyclohexylurea, and the DCM was evaporated under vacuum. The resulting crude product was purified by passing through a silica gel column with hexane:EtOAc 85:15 v/v as the eluant to obtain the acetal-protected ester C-4. The product was confirmed by $^1$H NMR. 1H NMR (400 MHz, CDCl$_3$, 23° C.): delta 1.21 (3H), 1.46 (6H), 3.69 (2H), 4.20 (2H), and 4.71 (2H).

In the next step, C-4 (1.0 g) was added to THF (30 mL) in a 100 ml RBF equipped with a magnetic stir bar. To this solution, 2 M HCl (20 mL) was added, and the reaction was allowed to stir for 24 hours at room temperature. After this time, THF was removed under vacuum, and EtOAC (50 ml) was added to the acidic water solution. The organic layer was washed with saturated $K_2CO_3$ and brine and dried over magnesium sulfate. Pure diol C-5 was collected by filtering the magnesium sulfate and evaporating the EtOAc under vacuum. The product was confirmed by 1H NMR. 1H NMR (400 MHz, CDCl$_3$, 23° C.): delta 1.14 (3H), 3.81 (2H), 3.97 (2H), and 4.71 (2H).

In the next step, C-5 (4.70 g 7.05 mmol) from the above step was dissolved in THF (300 mL) in a 500 ml RBF equipped with a magnetic stir bar. To this solution, TEA (1.42 g, 14.1 mmol) was added, and the reaction mixture was stirred under Na flow for 10 minutes at room temperature (r.t.). BriBr (0.65 g, 2.82 mmol) in DCM (10 mL) was then added dropwise over 30 minutes. The resulting mixture was further stirred at r.t. for 24 hours, at which point the reaction was stopped by filtering the solution to remove the TEA.HCl salt. The filtrate was collected and washed once with saturated $K_2CO_3$, once with 1 M HCl, once with deionized water, and once with brine solution. The organic layer was collected over magnesium sulfate and the crude product was obtained by filtering the DCM solution and evaporating the DCM layer under vacuum. The crude product ATRP-3 was purified by column chromatography using a silica gel column with hexane: EtOAc 80:20 v/v as the eluant. The product ATRP-3 was confirmed by $^1$H NMR and $^{19}$F NMR. 1H NMR (400 MHz, CDCl$_3$, 23° C.): delta 1.32 (3H), 1.94 (6H), 2.24 (1H), 3.80 (2H), 4.37-4.46 (2H), 4.69 (2H). $^{19}$F NMR (400 MHz, CDCl$_3$, 23° C.): delta −199.41, −121.93, −122.72, −123.21, and −126.11.

Preparation of ROP Macroinitiators

Example 4

Synthesis of ROP macroinitiator PSI-1.

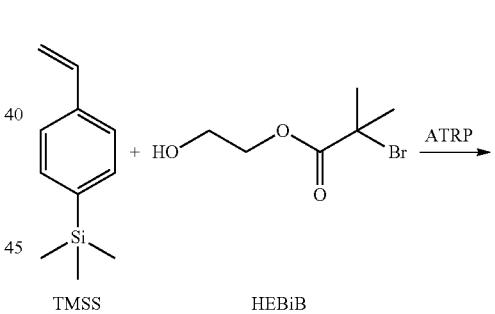

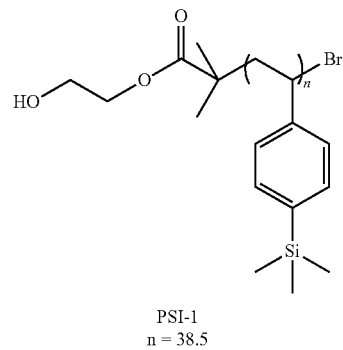

PSI-1
n = 38.5

Trimethylsilyl styrene (TMSS, 3.0 g, 17.01 mmol, MW 176.3), ATRP initiator HEBiB (72 mg, 0.340 mmol, MW 211.1), CuBr (49 mg, 0.340 mmol), and anisole (3.0 g) were added to a 50 ml Schlenk flask equipped with a stir bar. The flask was sealed with a rubber septum and was purged by bubbling nitrogen for one hour. At this point, PMDETA (59 mg, 0.340 mmol) was added, and the reaction flask was placed in an oil-bath set at 100° C. for 25 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-1, was collected in a frit funnel and was dried under vacuum for 24 hours at 50° C. Mn=7000, PDI=1.10.

Example 5

Synthesis of ROP macroinitiator PSI-2.

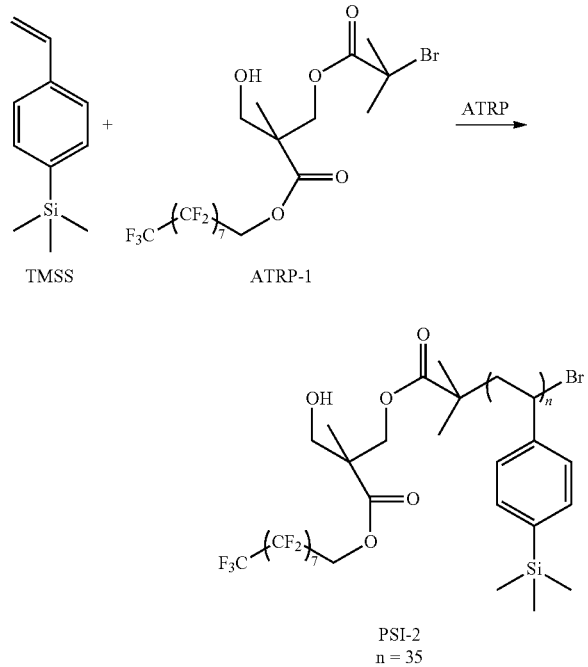

To a 50 ml Schlenk flask equipped with a stir bar, trimethylsilyl styrene (TMSS, 3.0 g, 17.01 mmol), ATRP initiator ATRP-1 (0.13 g, 0.170 mmol, MW 715.2), CuBr (25 mg, 0.170 mmol), and anisole (3.0 g) were added. The flask was sealed with a rubber septum and was purged by bubbling nitrogen for one hour. At this point, PMDETA (30 mg, 0.170 mmol) was added, and the reaction flask was placed in an oil-bath set at 100° C. for 30 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-2, was collected in a frit funnel and was dried under vacuum for 24 hours at 50° C. Mn=6800, PDI=1.09.

Example 6

Synthesis of ROP macroinitiator PSI-3.

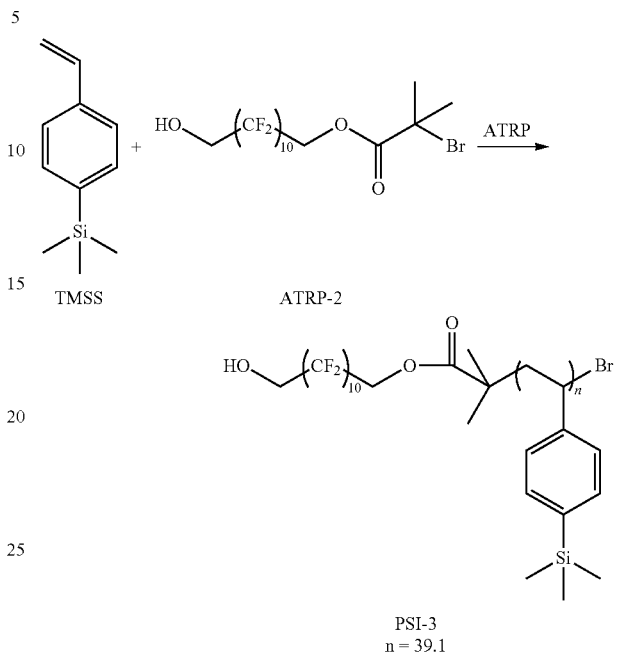

Trimethylsilyl styrene (TMSS, 4.0 g, 22.68 mmol), ATRP initiator ATRP-2 (0.16 g, 0.2268 mmol, MW 711.1), CuBr (25 mg, 0.2268 mmol), and anisole (4.0 g) were added to a 50 mL Schlenk flask equipped with a stir bar. The flask was sealed with a rubber septum and was purged by bubbling nitrogen for one hour. At this point, PMDETA (39 mg, 0.2268 mmol) was added, and the reaction flask was placed in an oil-bath set at 100° C. for 70 minutes. The reaction was stopped by placing the Schlenk flask in an ice-water bath. The flask was opened to air at which time the reaction mixture turned dark green. The mixture was diluted by adding THF (100 mL) and was passed through a short silica gel column to remove copper catalyst. The resulting solution was concentrated under vacuum and was precipitated twice in methanol from THF. The polymer, PSI-3, was collected in a frit funnel and was dried under vacuum for 24 hours at 50° C. Mn=7600, PDI=1.09.

Example 7

Synthesis of poly(trimethylsilyl styrene-r-styrene) ROP macroinitiator PSI-4, x=17.7, y=30.2.

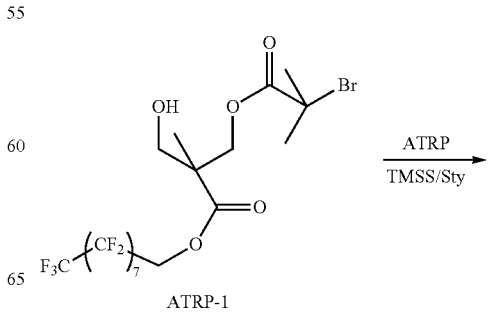

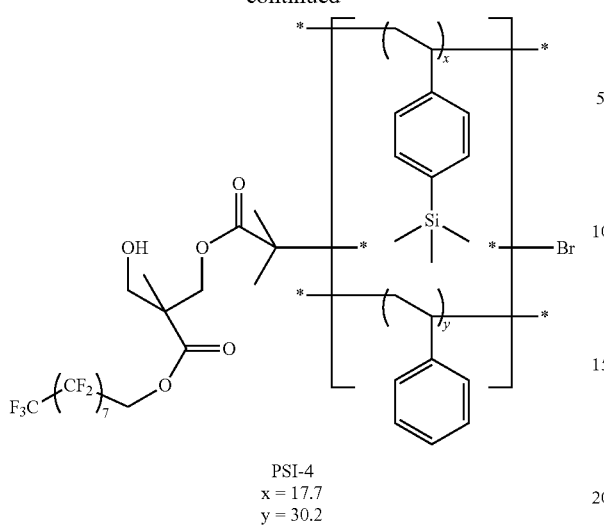

PSI-4
x = 17.7
y = 30.2

The vertical stacking of repeat units within the square brackets indicates a random copolymer chain of styrene and TMSS linked to the bromide and isobutyryl ester end groups.

TMSS (5.44 g, 30.87 mmol), styrene (Sty, 5.90 g, 57.33 mmol), ATRP initiator ATRP-1 (0.15 g, 0.196 mmol, MW 715.2), CuBr (28 mg, 0.196 mmol), and anisole (11.50 g) were added to a 50 ml Schlenk flask equipped with a stir bar. The flask was sealed with a rubber septum and was purged by bubbling nitrogen for one hour. At this point, PMDETA (34 mg, 0.196 mmol) was added, and the reaction flask was placed in an oil-bath set at 100° C. for 30 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-4, was collected in a frit funnel and was dried under vacuum for 24 hours at 50° C. Mn=7000, PDI=1.11. Molar ratio of TMSS:Sty as determined by $^1$H NMR=0.37:0.63. Si=8 wt % of block A.

Example 8

Synthesis of poly(trimethylsilyl styrene-r-styrene) ROP macroinitiator PSI-5, x=22.5, y=17.3.

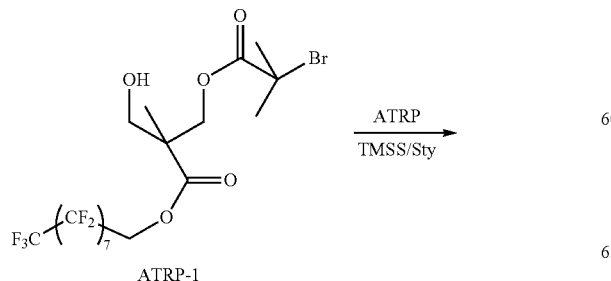

ATRP-1

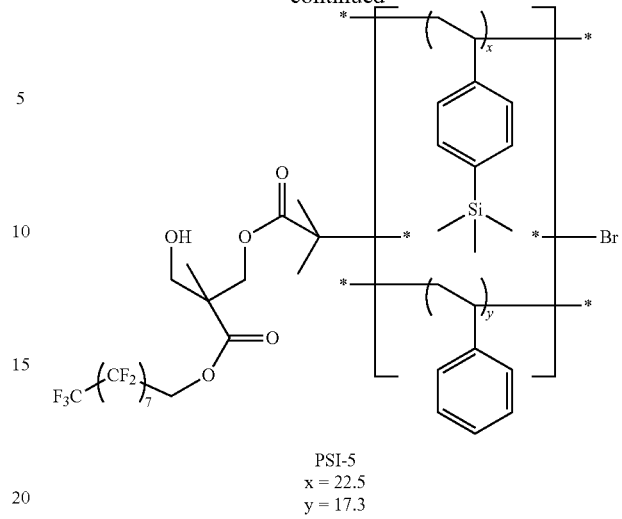

PSI-5
x = 22.5
y = 17.3

To a 50 ml Schlenk flask equipped with a stir bar, trimethylsilyl styrene (TMSS, 5.18 g, 29.40 mmol), Styrene (Sty, 3.06 g, 29.40 mmol), ATRP-1 (0.10 g, 0.130 mmol), CuBr (18 mg, 0.130 mmol), and anisole (8.50 g) were added. The flask was sealed with a rubber septum and was purged by bubbling nitrogen for one hour. At this point, PMDETA (22.5 mg, 0.130 mmol) was added, and the reaction flask was placed in an oil-bath set at 100° C. for 2.5 hours. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-5, was collected in a frit funnel and was dried under vacuum for 24 hours at 50° C. Mn=6500, PDI=1.06, molar ratio of TMSS:Sty as determined by $^1$H NMR=56.5:43.5. Si=10.9 wt % of block A.

Example 9

Synthesis of poly(trimethylsilyl styrene-r-styrene) ROP macroinitiator PSI-6, x=18.1, y=29.5.

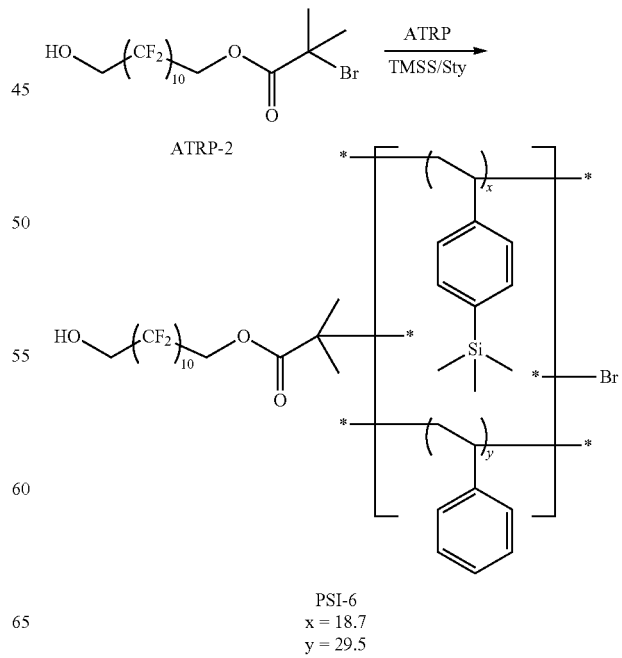

ATRP-2

PSI-6
x = 18.7
y = 29.5

To a 50 ml Schlenk flask equipped with a stir bar, trimethylsilyl styrene (TMSS, 2.14 g, 11.07 mmol), Styrene (Sty, 2.14 g, 20.56 mmol), ATRP initiator ATRP-2 (0.15 g, 0.2109 mmol), CuBr (30 mg, 0.130 mmol), and anisole (8.50 g) were added. The flask was sealed with a rubber septum and was purged by bubbling nitrogen for one hour. At this point, PMDETA (22.5 mg, 0.130 mmol) was added, and the reaction flask was placed in an oil-bath set at 100° C. for 2.5 hours. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-6, was collected in a frit funnel and was dried under vacuum for 24 hours at 50° C. Mn=7000, PDI=1.08 Molar ratio of TMSS:Sty as determined by 1H NMR=38:62. Si=8 wt % of block A.

Example 10

Synthesis of poly(trimethylsilyl styrene-r-styrene) ROP macroinitiator PSI-7, x=23.3, y=20.7.

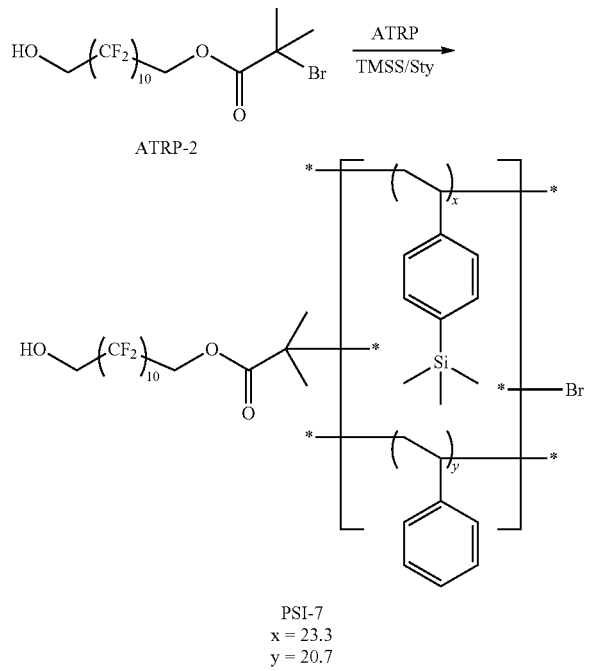

PSI-7
x = 23.3
y = 20.7

To a 50 ml Schlenk flask equipped with a stir bar, trimethylsilyl styrene (TMSS, 2.80 g, 15.80 mmol), styrene (Sty, 1.64 g, 15.80 mmol), ATRP initiator ATRP-2 (0.15 g, 0.2109 mmol), CuBr (30 mg, 0.130 mmol), and anisole (8.50 g) were added. The flask was sealed with a rubber septum and was purged by bubbling nitrogen for one hour. At this point, PMDETA (22.5 mg, 0.130 mmol) was added, and the reaction flask was placed in an oil-bath set at 100° C. for 2.15 hours. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-7, was collected in a frit funnel and was dried under vacuum for 24 hours at 50° C. Mn=7000, PDI=1.06 Molar ratio of TMSS:Sty as determined by $^1$H NMR=0.53:0.47. Si=10.4 wt % of block A.

Example 11

Synthesis of ROP macroinitiator PSI-8.

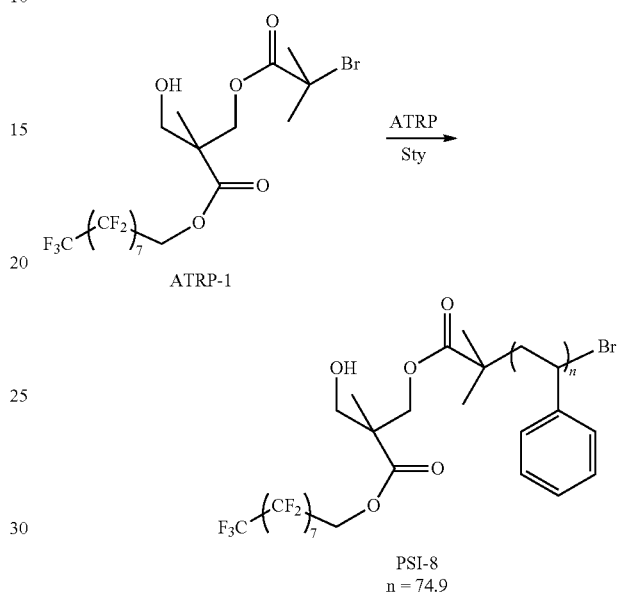

PSI-8
n = 74.9

To a 50 ml Schlenk flask equipped with a stir bar, styrene (Sty, 27.5 g, 266 mmol), ATRP initiator ATRP-1 (1.20 g, 156.8 mmol), CuBr (0.225 g, 156.8 mmol), and anisole (27.5 g) were added. The flask was sealed with a rubber septum and was purged by bubbling nitrogen for one hour. At this point, PMDETA (0.271 g, 156.8 mmol) was added, and the reaction flask was placed in an oil-bath set at 100° C. for 2.5 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer PSI-8 was collected in a fit funnel and was dried under vacuum for 24 hours at 50° C. Mn=8500, PDI=1.08.

Example 12

Synthesis of ROP macroinitiator PSI-9 (10.4 wt % Si in block A).

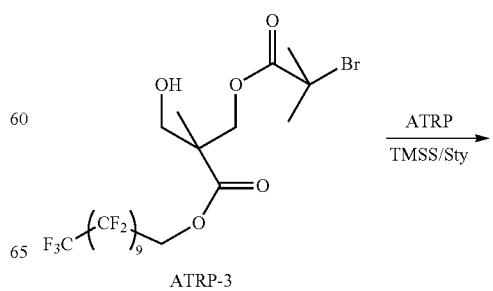

ATRP-3

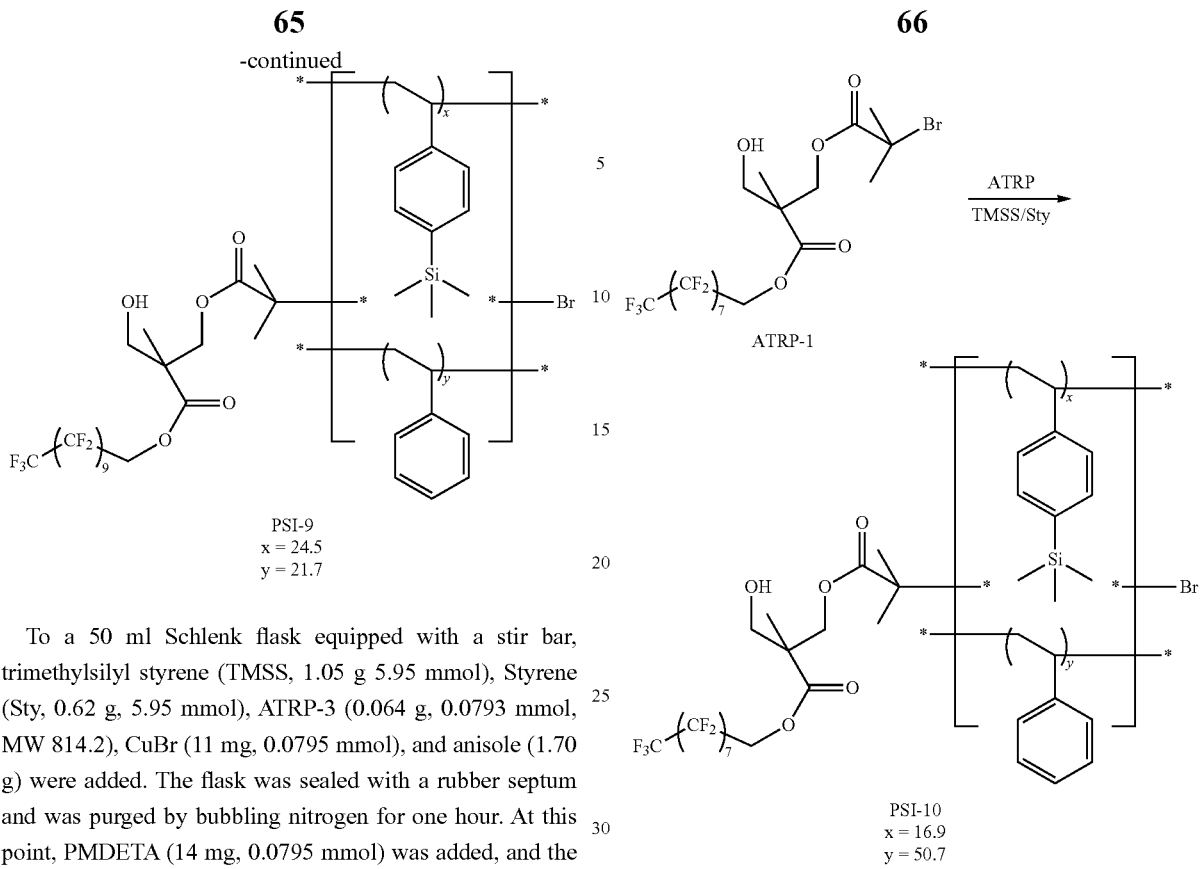

PSI-9
x = 24.5
y = 21.7

PSI-10
x = 16.9
y = 50.7

To a 50 ml Schlenk flask equipped with a stir bar, trimethylsilyl styrene (TMSS, 1.05 g 5.95 mmol), Styrene (Sty, 0.62 g, 5.95 mmol), ATRP-3 (0.064 g, 0.0793 mmol, MW 814.2), CuBr (11 mg, 0.0795 mmol), and anisole (1.70 g) were added. The flask was sealed with a rubber septum and was purged by bubbling nitrogen for one hour. At this point, PMDETA (14 mg, 0.0795 mmol) was added, and the reaction flask was placed in an oil-bath set at 100° C. for 70 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-9, was collected in a frit funnel and was dried under vacuum for 24 hours at 50° C. Mn=7400, PDI=1.09, molar ratio of TMSS:Sty as determined by $^1$H NMR=53.0:47.0. Si=10.4 wt %.

Example 13

Synthesis of ROP macroinitiator PSI-10 (5 wt % Si in block A, x=16.9, y=50.7).

To a 50 ml Schlenk flask equipped with a stir bar, trimethylsilyl styrene (TMSS, 3.11 g 17.6 mmol), styrene (Sty, 7.34 g, 70.50 mmol), ATRP-1 (0.15 g, 0.196 mmol), and CuBr (28 mg, 0.196 mmol), were added. The flask was sealed with a rubber septum and was purged by bubbling nitrogen for one hour. At this point, PMDETA (34 mg, 0.196 mmol) was added, and the reaction flask was placed in an oil-bath set at 100° C. for 35 minutes. The reaction was stopped by placing the Schlenk flask in an ice-water bath. The flask was opened to air at which time the reaction mixture turned dark green. The mixture was diluted by adding THF (100 ml) and was passed through a short silica-gel column to remove copper catalyst. The resulting solution was concentrated under vacuum and was precipitated twice in methanol from THF. The polymer, PSI-10, was collected in a frit funnel and was dried under vacuum for 24 hours at 50° C. Mn=9000, PDI=1.10, molar ratio of TMSS:Sty as determined by $^1$H NMR=25.0:75.0. Si=5 wt % of block A.

Table 2 summarizes the ROP macroinitiators formed in Examples 3-10.

TABLE 2

| Example | ROP Macro initiator Name | Feed TMSS (g, mmol) | Feed Sty (g, mmol) | ATRP Initiator | ATRP # Fluorines, (type) | TMSS DP (x) | Sty DP (y) | $^1$H NMR TMSS:Sty mole ratio | Si wt % of block A | GPC Mn | Mw | PDI |
|---|---|---|---|---|---|---|---|---|---|---|---|---|
| 4 | PSI-1 | 3.0, 17.01 | 0 | HEBIB | 0 | 38.5 | 0 | 100:0 | 16 | 7000 | 7700 | 1.10 |
| 5 | PSI-2 | 3.0, 17.01 | 0 | ATRP-1 | 17 (perp) | 35 | 0 | 100:0 | 16 | 6800 | 7480 | 1.09 |
| 6 | PSI-3 | 4.0, 22.68 | 0 | ATRP-2 | 20 (linear) | 39.1 | 0 | 100:0 | 16 | 7600 | 8284 | 1.09 |
| 7 | PSI-4 | 5.44, 30.87 | 5.90, 57.33 | ATRP-1 | 17 (perp) | 17.7 | 30.2 | 37:63 | 8 | 7000 | 7700 | 1.11 |

TABLE 2-continued

| Example | ROP Macro initiator Name | Feed TMSS (g, mmol) | Feed Sty (g, mmol) | ATRP Initiator | ATRP # Fluorines, (type) | TMSS DP (x) | Sty DP (y) | $^1$H NMR TMSS:Sty mole ratio | Si wt % of block A | GPC Mn | Mw | PDI |
|---|---|---|---|---|---|---|---|---|---|---|---|---|
| 8 | PSI-5 | 5.18, 29.40 | 3.06, 29.40 | ATRP-1 | 17 (perp) | 22.5 | 17.3 | 56.5:43.5 | 10.9 | 6500 | 6890 | 1.06 |
| 9 | PSI-6 | 2.14, 11.07 | 2.14, 20.56 | ATRP-2 | 20 (linear) | 18.1 | 29.5 | 38:62 | 8 | 6500 | 6890 | 1.06 |
| 10 | PSI-7 | 2.80, 15.8 | 1.64, 15.8 | ATRP-2 | 20 (linear) | 23.3 | 20.7 | 53:47 | 10.4 | 7000 | 7420 | 1.06 |
| 11 | PSI-8 | 0 | 27.5, 266 | ATRP-1 | 17 (perp) | 0 | 74.9 | 0:100 | 0 | 8500 | 9180 | 1.08 |
| 12 | PSI-9 | 1.05, 5.95 | 0.62, 5.95 | ATRP-3 | 21 (perp) | 24.5 | 21.7 | 53.0:47.0 | 10.4 | 7400 | 8066 | 1.09 |
| 13 | PSI-10 | 3.11, 17.6 | 7.34, 70.5 | ATRP-1 | 17 (perp) | 16.9 | 50.7 | 25:75 | 5.0 | 9000 | 9900 | 1.10 |

"perp" = perpendicular junction group
"linear" = linear junction group
"non-F" = non-fluorinated junction group Preparation of Block Copolymers Example 14 (Comparative)

Synthesis of non-fluorinated block polymer HBP-1 by ROP of MTC-Me initiated by PSI-1. HBP-1 exemplifies a non-fluorinated junction group.

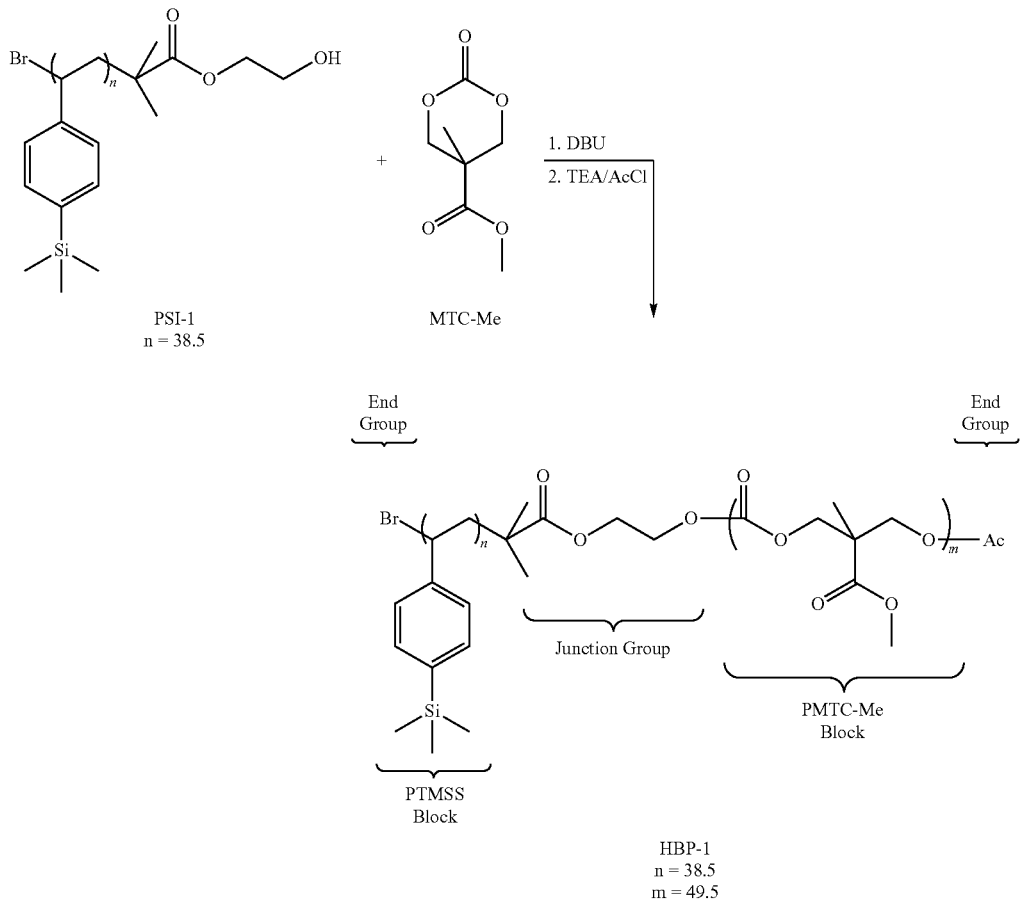

PSI-1 (0.15 g, 0.0214 mmol, Mn=7000, PDI=1.10), MTC-Me (0.50 g, 2.89 mmol), and dichloromethane (DCM, 2.9 mL) were added to an oven-dried 4 mL glass vial equipped with a magnetic stir bar. The reaction mixture was stirred until the PSI-1 macroinitiator and MTC-Me were completely dissolved in DCM, upon which catalyst (DBU, 3.3 mg, 0.0214 mmol, 10 wt % solution in toluene) was added. The reaction mixture was stirred at room temperature (r.t.) for 2.25 hours in a glove box. The reaction vial was brought out of the glove box and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting block polymer. The block polymer was dissolved in THF to form a 20 wt % solution and the polymer HBP-1 was precipitated in methanol:acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=15400, Mw=16800, PDI=1.09. Mn of each block: PTMSS block (GPC)=7000, PMTC-Me block (NMR)=8900. Based on Mn, n=38.5, m=49.5 in the above structure. The volume fraction of the PMTC-Me block ($Vf_{PMTC-Me}$)~0.50.

Example 15 (Comparative)

Synthesis of block copolymer BCP-1 by ROP of MTC-Me using macroinitiator PSI-2. BCP-1 exemplifies a "Perpendicular" Junction Group (all fluorines located on a side chain pendent to the polymer backbone).

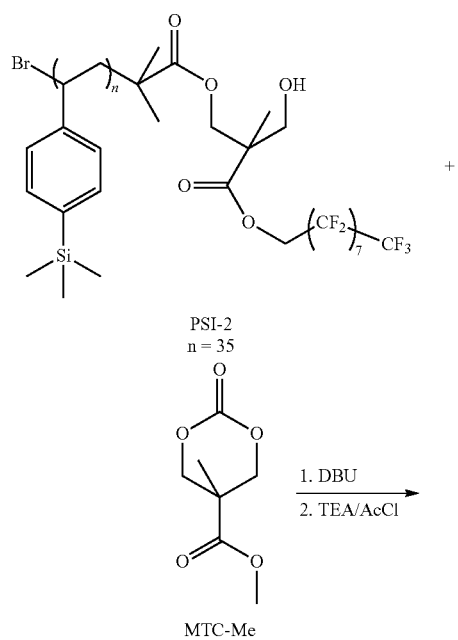

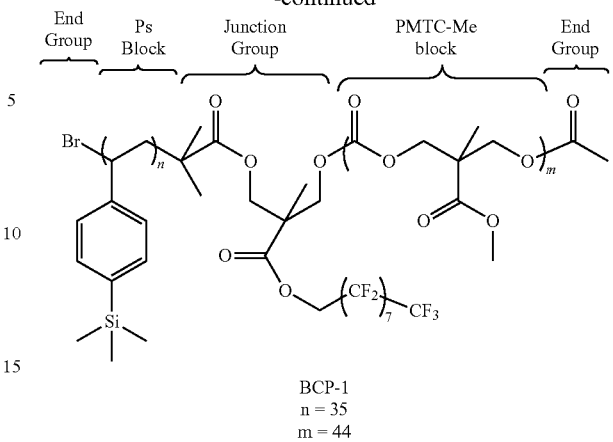

BCP-1
n = 35
m = 44

To an oven-dried 4 mL glass vial equipped with a magnetic stir bar were added PSI-2 (0.10 g, 0.0147 mmol, Mn=6800, PDI=1.09), MTC-Me (0.153 g, 0.882 mmol), and DCM (0.88 mL). The reaction mixture was stirred until the macroinitiator PSI-2 and MTC-Me were completely dissolved in DCM, upon which catalyst (DBU, 2.7 mg, 0.0147 mmol, 10 wt % solution in toluene) was added. The reaction mixture was stirred at room temperature (r.t.) for 1.75 hours in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a fit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol:acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=14.1k, Mw=15.1k, PDI=1.07; Mn of each block: PPTMSS block (GPC)=6800, PMTC-Me block (NMR)= 7622. Based on Mn, n=35, m=44 in the above structure. $Vf_{PMTC-Me}$~0.49.

Example 16 (Comparative)

Synthesis of BCP-2 by ROP of MTC-Me using macroinitiator PSI-3. BCP-1 exemplifies a "linear" junction group (all fluorines linked to atomic centers of the polymer backbone).

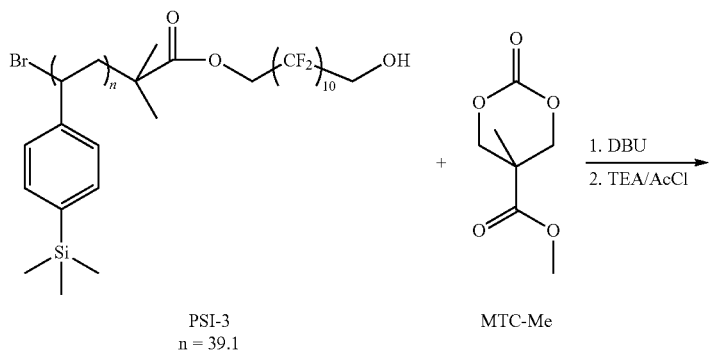

PSI-3
n = 39.1

MTC-Me

1. DBU
2. TEA/AcCl

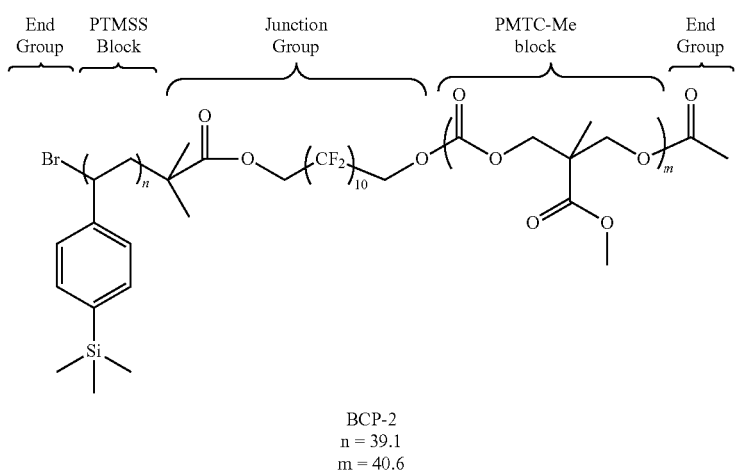

BCP-2
n = 39.1
m = 40.6

To an oven-dried 4 mL glass vial equipped with a magnetic stir bar were added PSI-3 (0.10 g, 0.01315 mmol, Mn=7600, PDI=1.09), MTC-Me (0.316 g, 1.81 mmol), and DCM (1.81 mL). The reaction mixture was stirred until the PSI-3 macroinitiator and MTC-Me were completely dissolved in DCM, upon which catalyst DBU (2.0 mg, 0.01315 mmol, 10 wt % solution in toluene) was added. The reaction mixture was stirred at room temperature (r.t.) for 3 hours in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a fit funnel by removing methanol under vacuum and the resulting solids were redissolved in THF to form a 20 wt % solution and reprecipitated in methanol. The solid was collected in a fit funnel and dried under vacuum at 40° C. for two hours to obtain the resulting compound. The resulting polymer was dissolved in THF to form a 20 wt % solution and the polymer was precipitated in methanol: acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=19.4k, Mw=21.2k, PDI=1.07; Mn of each block: PTMSS block (GPC)=7600, PMTC-Me block (NMR)=7075. Based on Mn, n=39.1, m=40.6 in the above structure. $Vf_{PMTC-Me}$~0.44.

Example 17

Synthesis of block copolymer BCP-3 by ROP of MTC-Me using macroinitiator PSI-4.

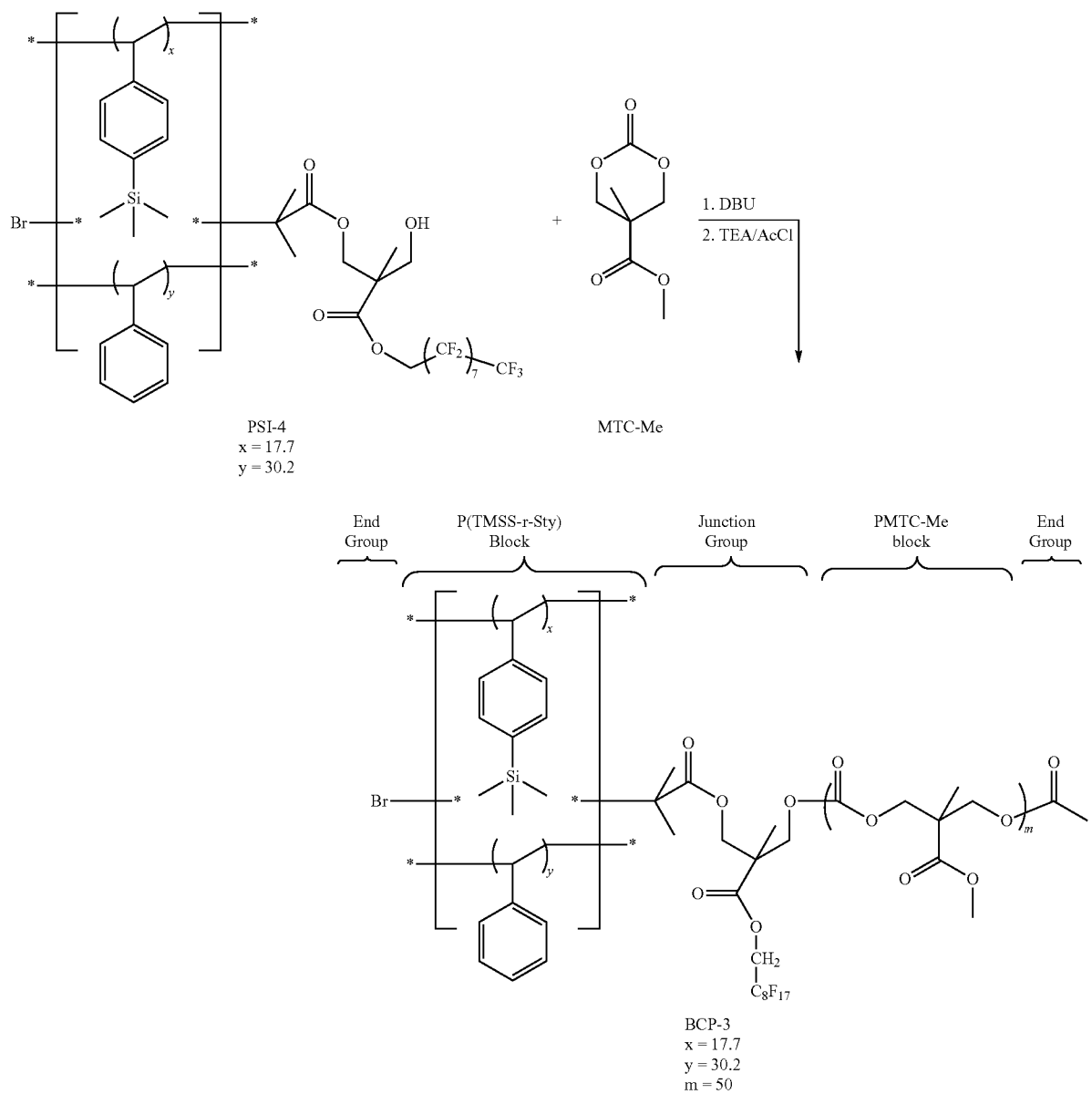

To an oven-dried 4 mL glass vial equipped with a magnetic stir bar were added macroinitiator PSI-4 (0.15 g, 0.0214 mmol, Mn=7000, PDI=1.11), MTC-Me (0.50 g, 2.89 mmol), and DCM (2.84 mL). The reaction mixture was stirred until the macroinitiator and MTC-Me were completely dissolved in DCM, upon which catalyst (DBU, 3.3 mg, 0.0215 mmol, 10 wt % solution in toluene) was added. The reaction mixture was stirred at room temperature (r.t.) for 1.75 hours in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol:acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=16.01k, Mw=17.01k, PDI=1.06; Mn of each block: P(TMSS-r-Sty) block (GPC)=7000, PMTC-Me block (NMR)=8700. Based on Mn, m=50 in the above structure. $Vf_{PMTC-Me}$~0.52.

Example 18

Synthesis of block copolymer BCP-4 by ROP of MTC-Me using macroinitiator PSI-5 (11 wt % Si). This reaction followed the general procedure of example 17 substituting PSI-4 with PSI-5 (x=22.5, y=17.3).

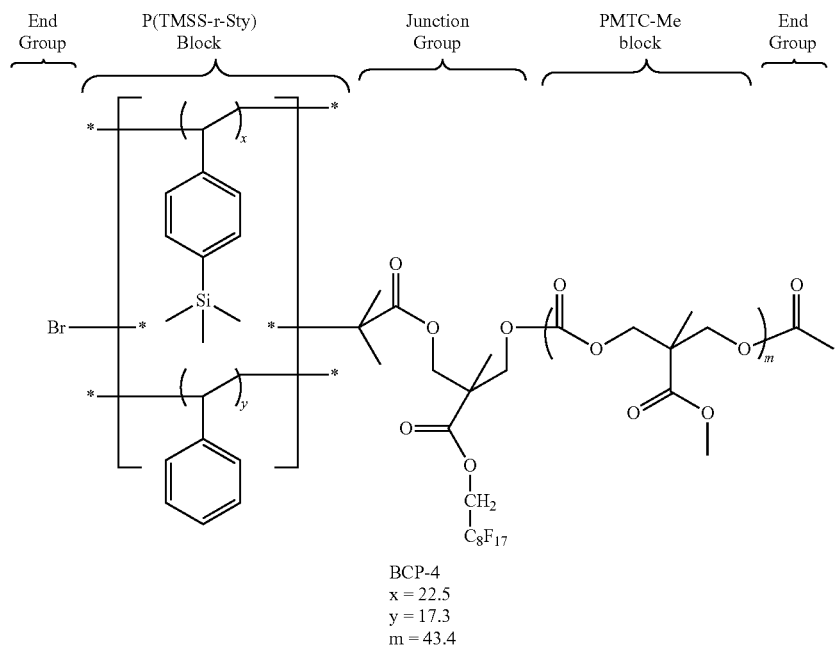

BCP-4
x = 22.5
y = 17.3
m = 43.4

To an oven-dried 4 mL glass vial equipped with a magnetic stir bar were added the macroinitiator PSI-5 (0.15 g, 0.0230 mmol, Mn=6500, PDI=1.06), MTC-Me (0.54 g, 3.105 mmol), and DCM (2.84 mL). The reaction mixture was stirred until the random copolymer macroinitiator and MTC-Me were completely dissolved in DCM, upon which catalyst (DBU, 3.5 mg, 0.02305 mmol, 10 wt % solution in toluene) was added. The reaction mixture was stirred at room temperature (r.t.) for 2.0 hours in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol: acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=16.2k, Mw=17.3k, PDI=1.06; Mn of each block by NMR: P(TMSS-r-Sty) block=6500, PMTC-Me block=7560. Based on Mn, m=43.4 in the above structure. $Vf_{PMTC-Me} \sim 0.5$ Example 19

Synthesis of BCP-5 by ROP of MTC-Me using macroinitiator PSI-6 (8 wt % Si). This reaction followed the general procedure of example 17 substituting PSI-4 with PSI-6 (x=18.1, y=29.5).

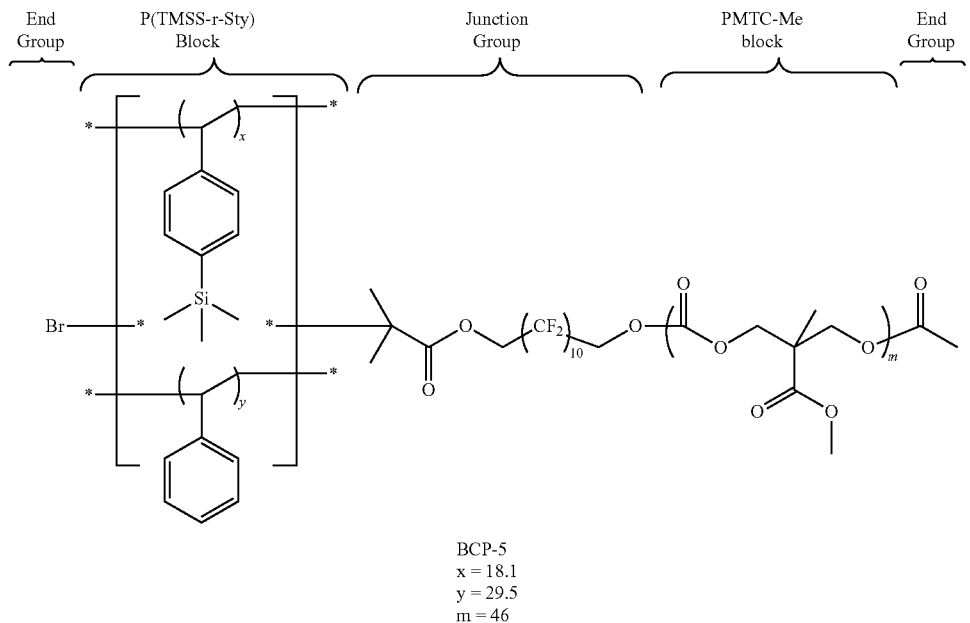

BCP-5
x = 18.1
y = 29.5
m = 46

To an oven-dried 4 mL glass vial equipped with a magnetic stir bar were added the macroinitiator PSI-5 (0.15 g, 0.0230 mmol, Mn=6500, PDI=1.06), MTC-Me (0.54 g, 3.105 mmol), and DCM (2.84 mL). The reaction mixture was stirred until the random copolymer macroinitiator and MTC-Me were completely dissolved in DCM, upon which catalyst (DBU, 3.5 mg, 0.02305 mmol, 10 wt % solution in toluene) was added. The reaction mixture was stirred at room temperature (r.t.) for 2.0 hours in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol: acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=22800, Mw=25000, PDI=1.10. Mn of each block: P(TMSS-r-Sty) block (GPC)=7000, PMTC-Me block (NMR)=8074. Based on Mn, m=46 in the above structure. Vf$_{PMTC-Me}$~50.

Example 20

Synthesis of BCP-6 by ROP of MTC-Me using macroinitiator PSI-7 (10 wt % Si).

To an oven-dried 4 mL glass vial equipped with a magnetic stir bar were added the macroinitiator PSI-7 (0.10 g, 0.01428 mmol, Mn=7000, PDI=1.06), MTC-Me (0.256 g, 1.47 mmol), and DCM (1.47 mL). The reaction mixture was stirred until the random copolymer macroinitiator and MTC-Me were completely dissolved in DCM, upon which catalyst (DBU, 2.20 mg, 0.01428 mmol, 10 wt % solution in toluene) was added. The reaction mixture was stirred at room temperature (r.t.) for 50 minutes in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol: acetonitrile (20 mL, 70:30 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=20700, Mw=22800, PDI=1.10; Mn of each block: P(TMSS-r-Sty) block (GPC)=7000, PMTC-Me block (NMR)=7800. Based on Mn, m=45 in the above structure. Vf$_{PMTC-Me}$~0.49.

Example 21 (Comparative)

Synthesis of BCP-7 by ROP of MTC-Me using macroinitiator PSI-8.

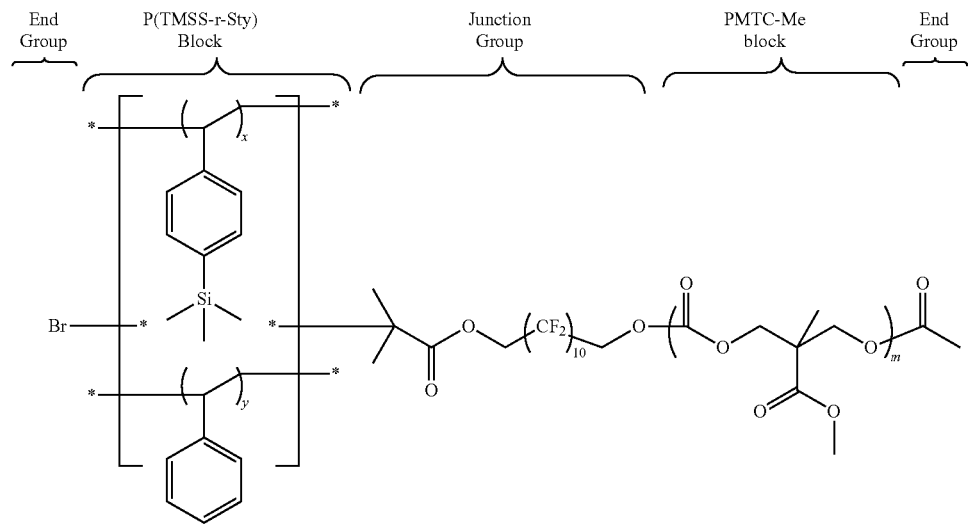

BCP-6
x = 23.3
y = 20.7
m = 45

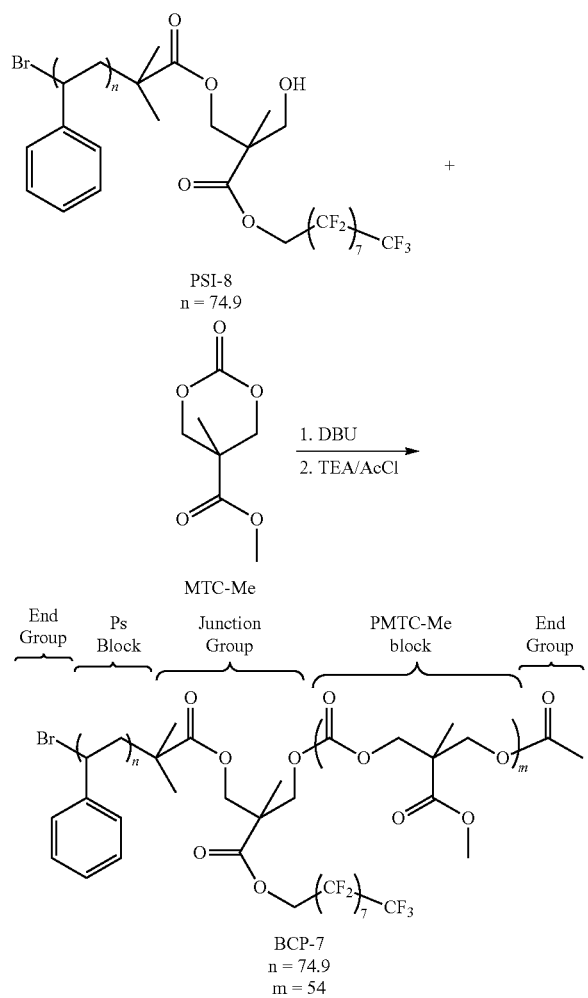

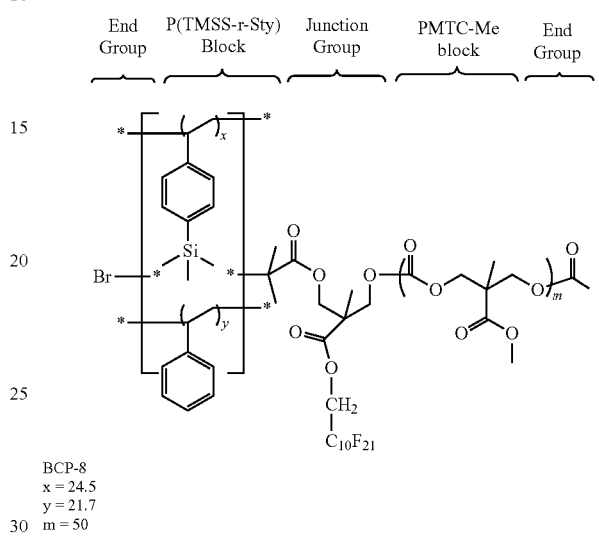

BCP-8
x = 24.5
y = 21.7
m = 50

To an oven-dried 20 mL glass vial equipped with a magnetic stir bar were added PSI-8 (0.25 g, 0.0294 mmol, Mn=8500, PDI=1.08), MTC-Me (0.80 g, 4.60 mmol), and DCM (5.50 mL). The reaction mixture was stirred until the macroinitiator PSI-8 and MTC-Me were completely dissolved in DCM, upon which catalyst (DBU, 4.5 mg, 0.0294 mmol, 10 wt % solution in toluene) was added. The reaction mixture was stirred at room temperature (r.t.) for 1.75 hours in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol:acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=17200, Mw=18500, PDI=1.07; Mn of each block: PS block (GPC)=8500, PMTC-Me block (NMR)= 9360. Based on Mn, m=54 in the above structure. $Vf_{PMTC-Me}$~0.49.

Example 22

Synthesis of BCP-8 by ROP of MTC-Me using macroinitiator PSI-9 (10 wt % Si in block A).

To an oven-dried 4 mL glass vial equipped with a magnetic stir bar were added PSI-9 (0.15 g, 0.0202 mmol, Mn=7400, PDI=1.09), MTC-Me (0.380 g, 2.19 mmol), and DCM (2.18 mL). The reaction mixture was stirred until the macroinitiator PSI-9 and MTC-Me were completely dissolved in DCM, upon which catalyst (DBU, 3.1 mg, 0.0202 mmol, 10 wt % solution in toluene) was added. The reaction mixture was stirred at room temperature (r.t.) for 1.50 hours in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol:acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=18400, Mw=20100, PDI=1.09. Mn of each block: P(TMSS-r-Sty) block (GPC)=7400, PMTC-Me block (NMR)=8630. Based on Mn, n=35, m=50 in the above structure. $Vf_{PMTC-Me}$~0.50.

Example 23

Synthesis of BCP-9 by ROP of MTC-Me using macroinitiator PSI-10 (5 wt % Si in block A).

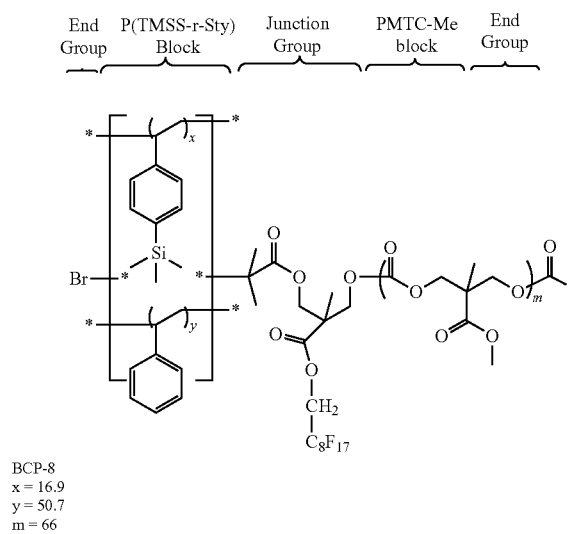

BCP-8
x = 16.9
y = 50.7
m = 66

To an oven-dried 4 mL glass vial equipped with a magnetic stir bar were added PSI-10 (0.10 g, 0.11 mmol, Mn=9000, PDI=1.10), MTC-Me (0.290 g, 1.66 mmol), and DCM (1.5 mL). The reaction mixture was stirred until the macroinitiator PSI-10 and MTC-Me were completely dissolved in DCM, upon which catalyst (DBU, 3.4 mg, 0.0222 mmol, 10 wt % solution in toluene) was added. The reaction mixture was stirred at room temperature (r.t.) for 1.0 hour in a glove box. The reaction vial was brought out of the glove box, and the reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol:acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=19600, Mw=21700, PDI=1.11. Mn of each block: P(TMSS-r-Sty) block (GPC)=9000, PMTC-Me block (NMR)=11600. Based on Mn, n=35, m=66 in the above structure. $Vf_{PMTCV-Me}$~0.53.

Table 3 summarizes the block copolymers prepared in Examples 11-18. Junction groups A (non-fluorinated), B (perpendicular, 17 fluorines), C (linear, 20 fluorines), and D (perpendicular, 21 fluorines) referenced in Table 3 are shown below.

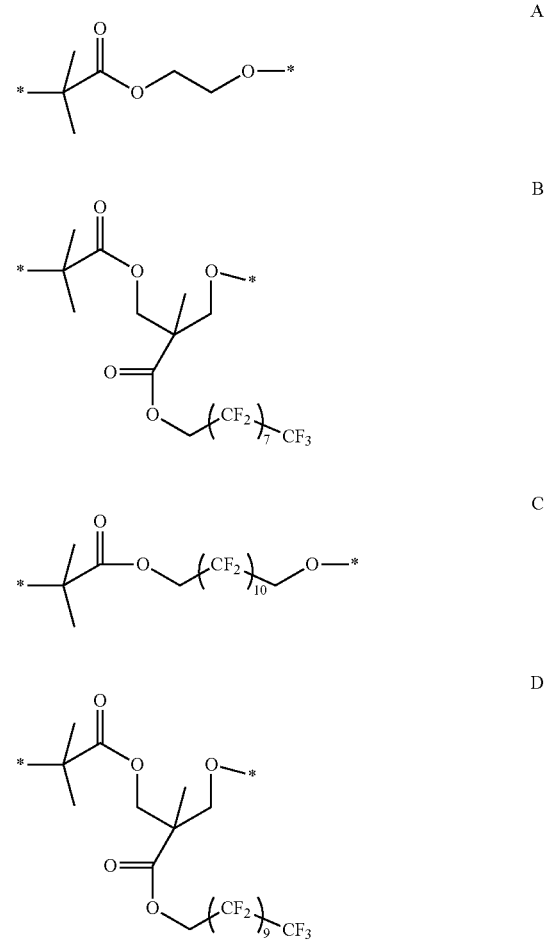

TABLE 3

| Example | Block Polymer Name | Block A Monomer(s), DP (x:y) | Block A mol % TMSS | Block B Monomer, DP (m) | Junction Group | Number of Fluorines | Si wt % of Block A | GPC Mn (kDa) | Mw (kDa) | PDI |
|---|---|---|---|---|---|---|---|---|---|---|
| 14 (comp) | HBP-1 | TMSS (38.5) | 100 | MTC-Me (49.5) | A (non-F) | 0 | 16 | 15.4 | 16.8 | 1.09 |
| 15 (comp) | BCP-1 | TMSS (35) | 100 | MTC-Me (44) | B (perp) | 17 | 16 | 14.1 | 15.1 | 1.07 |
| 16 (comp) | BCP-2 | TMSS (39.1) | 100 | MTC-Me (40.6) | C (linear) | 20 | 16 | 19.4 | 21.2 | 1.07 |
| 17 | BCP-3 | TMSS:Sty (17.7:30.2) | 37 | MTC-Me (50) | B (perp) | 17 | 8 | 16.01 | 17.01 | 1.06 |
| 18 | BCP-4 | TMSS:Sty (22.5:17.3) | 55 | MTC-Me (43.4) | B (perp) | 17 | 11 | 16.2 | 17.3 | 1.06 |
| 19 | BCP-5 | TMSS:Sty (18.1:29.5) | 37 | MTC-Me (46) | C (linear) | 20 | 8 | 22.8 | 25.0 | 1.10 |

TABLE 3-continued

| Example | Block Polymer Name | Block A Monomer(s), DP (x:y) | Block A mol % TMSS | Block B Monomer, DP (m) | Junction Group | Number of Fluorines | Si wt % of Block A | GPC Mn (kDa) | Mw (kDa) | PDI |
|---|---|---|---|---|---|---|---|---|---|---|
| 20 | BCP-6 | TMSS:Sty (23.3:20.7) | 53 | MTC-Me (45) | B (perp) | 17 | 10.4 | 20.7 | 22.8 | 1.10 |
| 21 (comp) | BCP-7 | Sty (75) | 0 | MTC-Me (54) | B (perp) | 17 | 0 | 17.2 | 18.5 | 1.07 |
| 22 | BCP-8 | TMSS:Sty (24.5:21.7) | 53 | MTC-Me (50) | D (perp) | 21 | 10.4 | 18.4 | 20.1 | 1.09 |
| 23 | BCP-9 | TMSS:Sty (16.9:50.7) | 25 | MTC-Me (66) | B (perp) | 17 | 5 | 19.6 | 21.7 | 1.11 |

"perp" = perpendicular junction group
"linear" = linear junction group
"non-F" = non-fluorinated junction group Example 24

Synthesis of poly(styrene-r-methyl methacrylate-r-glycidyl methacrylate) underlayer SMMA-1, Sty:MMA:GMA=22:76:2 (mole ratio). Styrene (Sty, 1.61 g, 15.46 mmol, MW 104.2), methyl methacrylate (MMA, 5.34 g, 53.43 mmol, MW 100.12), glycidyl methacrylate (GMA, 0.2 g, 1.40 mmol, MW 142.2), THF (22 g), and azobisisobutyronitrile (AIBN, 0.46 g, 2.8 mmol, 4 mol % based on total moles of vinyl monomers) were combined in a 250 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours to give SMMA-1. Mn=9400, Mw=12400, PDI=1.31.

Examples 25-28

Preparation of random graft copolymers SMMA-2 to SMMA-5 for underlayer orientation control. These polymers were prepared using the general procedure of Example 24 at various Sty:MMA:GMA molar ratios.

Table 4 summarizes the preparation of underlayer polymers.

Underlayer Film Preparations

Examples 29-33

The following general procedure was used to prepare a thin film underlayer (UL) on a silicon wafer with random copolymers SMMA1-SMMA5, respectively. A 1.0 wt % solution based on total dry solids was prepared by dissolving the random graft copolymer (95 parts by weight) and p-nitrobenzylsulphonic acid triflate salt (p-NBT, 5 parts by weight) in propylene glycol monomethyl ether acetate (PGMEA, 10,000 parts by weight). p-NBT is a thermal acid generator and was added to promote the grafting and partial crosslinking of a thin film of the random graft copolymer on the silicon wafer substrate when baked (annealed). The solutions were passed through a 0.2 mm polytetrafluoroethylene (PTFE) filter prior to spin coating the solution onto a silicon wafer at 2000 rpm spin rate. After forming the thin film, the coated wafer was baked at 200° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the

TABLE 4

| Examples | Random Graft Polymer Name | Sty (g, mmol) | MMA (g, mmol) | GMA (g, mmol) | AIBN (g, mmol) | THF (g) | Temp (° C.) | Time (hours) | Feed Mole Ratio Sty:MMA:GMA | Mn (kDa) | Mw (kDa) | PDI |
|---|---|---|---|---|---|---|---|---|---|---|---|---|
| 24 | SMMA-1 | 1.61, 15.46 | 5.34, 53.43 | 0.20, 1.40 | 0.46, 2.80 | 22 | 70 | 18 | 22:76:2 | 9.3 | 12.4 | 1.31 |
| 25 | SMMA-2 | 2.05, 19.68 | 4.90, 49.20 | 0.2, 1.40 | 0.46, 2.80 | 22 | 70 | 18 | 28:70:2 | 9.2 | 12.3 | 1.32 |
| 26 | SMMA-3 | 2.34, 22.5 | 4.63, 46.4 | 0.20, 1.40 | 0.46, 2.80 | 22 | 70 | 18 | 32:66:2 | 7.6 | 10.6 | 1.38 |
| 27 | SMMA-4 | 2.63, 25.31 | 4.36, 43.6 | 0.20, 1.40 | 0.46, 2.80 | 23 | 70 | 18 | 36:62:2 | 6.5 | 9.2 | 1.40 |
| 28 | SMMA-5 | 3.15, 30.24 | 3.85, 38.5 | 0.20, 1.40 | 0.46, 2.80 | 23 | 70 | 18 | 43:55:2 | 5.3 | 8.1 | 1.53 | treated wafer at 2000 rpm for 30 seconds. The rinse was intended to remove any excess random graft copolymer that was not crosslinked or grafted to the wafer surface. The final film thickness of the underlayer was 10 nm after the solvent rinse.

Table 5 summarizes the underlayer coated silicon wafers of Examples 29-33.

TABLE 5

| Example | UL Name | Random Copolymer | Feed Mole Ratio Sty:MMA:GMA |
|---|---|---|---|
| 29 | UL-1 | SMMA-1 | 22:76:2 |
| 30 | UL-2 | SMMA-2 | 28:70:2 |
| 31 | UL-3 | SMMA-3 | 32:66:2 |
| 32 | UL-4 | SMMA-4 | 36:62:2 |
| 33 | UL-5 | SMMA-5 | 43:55:2 |

Coating Formulations

Examples 34-44

Preparation of coating formulations for self-assembly. The following general procedure is representative. The block copolymer (0.01 g) was dissolved in PGMEA or amyl acetate (0.823 g) to form a 1.2 wt % solution of the block copolymer. The solution was filtered through 0.2 micrometer PTFE filter. Table 6 summarizes the block copolymer coating formulations.

Thin film self-assembly of formulated block copolymer compositions.

Examples 45-68

The following general procedure was used to prepare thin films of formulated block copolymers on UL-1 to UL-5 coated substrates (silicon wafers). A selected coating formulation was spin coated on a selected underlayer coated substrate at a selected spin rate. The coated wafer was then baked (annealed) at a temperature of 170° C. or 170° C. for 5 minutes and immediately cooled to room temperature. The block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively.

Table 7 summarizes the block polymer thin film coatings for self-assembly.

TABLE 6

| Example | Formulation Name | Formulation solvent | Block Polymer Name | Block A Monomer(s) DP (x:y) | Block A mol % TMSS | Block B Monomer | Block B DP (m) | Junction Group | Number of Fluorines | Si wt % of Block A |
|---|---|---|---|---|---|---|---|---|---|---|
| 34 | F-1 | Amyl acetate | HBP-1 | TMSS (38.5) | 100 | MTC-Me | 49.5 | A (non-F) | 0 | 16 |
| 35 | F-2 | Amyl acetate | BCP-1 | TMSS (35) | 100 | MTC-Me | 44 | B (perp) | 17 | 16 |
| 36 | F-3 | Amyl acetate | BCP-2 | TMSS (39.1) | 100 | MTC-Me | 40.6 | C (linear) | 20 | 16 |
| 37 | F-4 | PGMEA | BCP-3 | TMSS:Sty (17.7:30.2) | 37 | MTC-Me | 50 | B (perp) | 17 | 8 |
| 38 | F-5 | PGMEA | BCP-4 | TMSS:Sty (22.5:17.3) | 55 | MTC-Me | 43.4 | B (perp) | 17 | 11 |
| 39 | F-6 | PGMEA | BCP-5 | TMSS:Sty (18.1:29.5) | 37 | MTC-Me | 46 | C (linear) | 20 | 8 |
| 40 | F-7 | PGMEA | BCP-6 | TMSS:Sty (23.3:20.7) | 53 | MTC-Me | 45 | B (perp) | 17 | 10.4 |
| 41 | F-8 | PGMEA | BCP-7 | Sty (75) | 0 | MTC-Me | 54 | B (perp) | 17 | 0 |
| 42 | F-9 | PGMEA | BCP-8 | TMSS:Sty (24.5:21.7) | 53 | MTC-Me | 50 | D (perp) | 21 | 10.4 |
| 43 | F-10 | Amyl acetate | BCP-8 | TMSS:Sty (24.5:21.7) | 53 | MTC-Me | 50 | D (perp) | 21 | 10.4 |
| 44 | F-11 | PGMEA | BCP-9 | TMSS:Sty (16.9:50.7) | 25 | MTC-Me | 66 | B (perp) | 17 | 5 |

"perp" = perpendicular junction group
"linear" = linear junction group
"non-F" = non-fluorinated junction group

TABLE 7

| Film Example | Underlayer Name | Formulation | Spin Speed RPM | Spin time Sec | Annealing Temp ° C. | Annealing Time (min) |
|---|---|---|---|---|---|---|
| 45 | UL-1 | F-1 | 2000 | 30 | 170 | 5 |
| 46 | UL-2 | F-1 | 2000 | 30 | 170 | 5 |
| 47 | UL-3 | F-1 | 2000 | 30 | 170 | 5 |
| 48 | UL-1 | F-2 | 2000 | 30 | 170 | 5 |
| 49 | UL-2 | F-2 | 2000 | 30 | 170 | 5 |
| 50 | UL-3 | F-2 | 2000 | 30 | 170 | 5 |
| 51 | UL-1 | F-3 | 2000 | 30 | 170 | 5 |
| 52 | UL-2 | F-3 | 2000 | 30 | 170 | 5 |
| 53 | UL-3 | F-3 | 2000 | 30 | 170 | 5 |
| 54 | UL-1 | F-4 | 2000 | 30 | 170 | 5 |
| 55 | UL-2 | F-4 | 2000 | 30 | 170 | 5 |
| 56 | UL-3 | F-4 | 2000 | 30 | 170 | 5 |
| 57 | UL-2 | F-5 | 2000 | 30 | 170 | 5 |
| 58 | UL-3 | F-5 | 2000 | 30 | 170 | 5 |
| 59 | UL-4 | F-5 | 2000 | 30 | 170 | 5 |
| 60 | UL-1 | F-6 | 2000 | 30 | 170 | 5 |
| 61 | UL-2 | F-6 | 2000 | 30 | 170 | 5 |
| 62 | UL-3 | F-7 | 2000 | 30 | 170 | 5 |
| 63 | UL-4 | F-7 | 2000 | 30 | 170 | 5 |
| 64 | UL-5 | F-7 | 2000 | 30 | 170 | 5 |
| 65 | UL-2 | F-8 | 2000 | 30 | 170 | 5 |
| 66 | UL-4 | F-9 | 2000 | 30 | 170 | 5 |
| 67 | UL-4 | F-10 | 2000 | 30 | 170 | 5 |
| 68 | UL-4 | F-11 | 2000 | 30 | 170 | 5 |

Table 8 summarizes the atomic force microscopy (AFM) height images obtained with the self-assembled films of Examples 45-68. "I/H" means islands/holes (not desirable). "Partially ⊥ lamellae" means about 20% to less than 70% of the regions of the film contained perpendicular lamellae (not desirable). "⊥ lamellae" means 95% to 100% of the regions of the film contained perpendicular lamellae (most desirable).

TABLE 8

| Film Example | Underlayer Name | Formulation Name | Block Polymer Name | Block A Monomer(s) (DP) | Block A mol % TMSS | Block B Monomer (DP) | Junction Group | Number of Fluorines | Si wt % | Thin Film Morphology |
|---|---|---|---|---|---|---|---|---|---|---|
| 45 | UL-1 | F-1 | HBP-1 | TMSS (39) | 100 | MTC-Me (49.5) | A (non-F) | 0 | 16 | I/H |
| 46 | UL-2 | F-1 | HBP-1 | TMSS (39) | 100 | MTC-Me (49.5) | A (non-F) | 0 | 16 | I/H |
| 47 | UL-3 | F-1 | HBP-1 | TMSS (39) | 100 | MTC-Me (49.5) | A (non-F) | 0 | 16 | I/H |
| 48 | UL-1 | F-2 | BCP-1 | TMSS (35) | 100 | MTC-Me (44) | B (perp) | 17 | 16 | I/H |
| 49 | UL-2 | F-2 | BCP-1 | TMSS (35) | 100 | MTC-Me (44) | B (perp) | 17 | 16 | I/H |
| 50 | UL-3 | F-2 | BCP-1 | TMSS (35) | 100 | MTC-Me (44) | B (perp) | 17 | 16 | I/H |
| 51 | UL-1 | F-3 | BCP-2 | TMSS (39) | 100 | MTC-Me (40.6) | C (linear) | 20 | 16 | I/H |
| 52 | UL-2 | F-3 | BCP-2 | TMSS (39) | 100 | MTC-Me (40.6) | C (linear) | 20 | 16 | I/H |
| 53 | UL-3 | F-3 | BCP-2 | TMSS (39) | 100 | MTC-Me (40.6) | C (linear) | 20 | 16 | I/H |
| 54 | UL-1 | F-4 | BCP-3 | TMSS:Sty (17.7:30.2) | 37 | MTC-Me (50) | B (perp) | 17 | 8 | Partially⊥ Lamellae |
| 55 | UL-2 | F-4 | BCP-3 | TMSS:Sty (17.7:30.2) | 37 | MTC-Me (50) | B (perp) | 17 | 8 | ⊥Lamellae |
| 56 | UL-3 | F-4 | BCP-3 | TMSS:Sty (17.7:30.2) | 37 | MTC-Me (50) | B (perp) | 17 | 8 | ⊥Lamellae |
| 57 | UL-2 | F-5 | BCP-4 | TMSS:Sty (22.5:17.3) | 55 | MTC-Me (43.4) | B (perp) | 17 | 11 | I/H |
| 58 | UL-3 | F-5 | BCP-4 | TMSS:Sty (22.5:17.3) | 55 | MTC-Me (43.4) | B (perp) | 17 | 11 | I/H |
| 59 | UL-4 | F-5 | BCP-4 | TMSS:Sty (22.5:17.3) | 55 | MTC-Me (43.4) | B (perp) | 17 | 11 | I/H |
| 60 | UL-1 | F-6 | BCP-5 | TMSS:Sty (18.1:29.5) | 37 | MTC-Me (46) | C (linear) | 20 | 8 | I/H |
| 61 | UL-2 | F-6 | BCP-5 | TMSS:Sty (18.1:29.5) | 37 | MTC-Me (46) | C (linear) | 20 | 8 | I/H |
| 62 | UL-3 | F-7 | BCP-6 | TMSS:Sty (23.3:20.7) | 53 | MTC-Me (45) | B (perp) | 17 | 10.4 | I/H |

TABLE 8-continued

| Film Example | Underlayer Name | Formulation Name | Block Polymer Name | Block A Monomer(s) (DP) | Block A mol % TMSS | Block B Monomer (DP) | Junction Group | Number of Fluorines | Si wt % | Thin Film Morphology |
|---|---|---|---|---|---|---|---|---|---|---|
| 63 | UL-4 | F-7 | BCP-6 | TMSS:Sty (23.3:20.7) | 53 | MTC-Me (45) | B (perp) | 17 | 10.4 | I/H |
| 64 | UL-5 | F-7 | BCP-6 | TMSS:Sty (23.3:20.7) | 53 | MTC-Me (45) | B (perp) | 17 | 10.4 | I/H |
| 65 | UL-2 | F-8 | BCP-7 | Sty (75) | 0 | MTC-Me (54) | B (perp) | 17 | 0 | ⊥Lamellae |
| 66 | UL-4 | F-9 | BCP-8 | TMSS:Sty (24.5:21.7) | 53 | MTC-Me (50) | D (perp) | 21 | 10.4 | Partially⊥ Lamellae |
| 67 | UL-4 | F-10 | BCP-8 | TMSS:Sty (24.5:21.7) | 53 | MTC-Me (50) | D (perp) | 21 | 10.4 | ⊥Lamellae |
| 68 | UL-4 | F-11 | BCP-9 | TMSS:Sty (16.9:50.7) | 25 | MTC-Me (66) | B (perp) | 17 | 5 | ⊥Lamellae |

Figure 10:
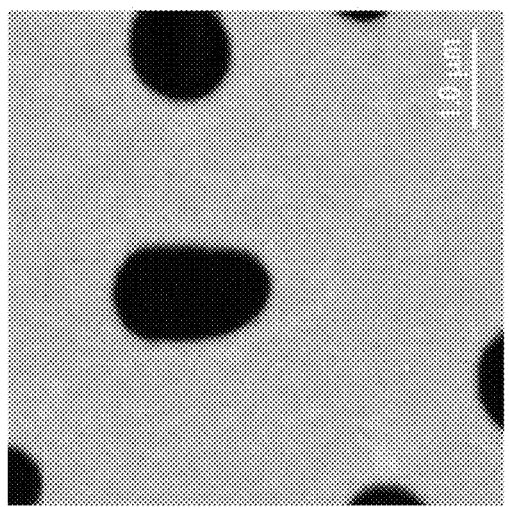
FIGS. 8-10 are AFM top down images of the island/hole morphology of Examples 46, 49, and 52, respectively.
Figure 9:
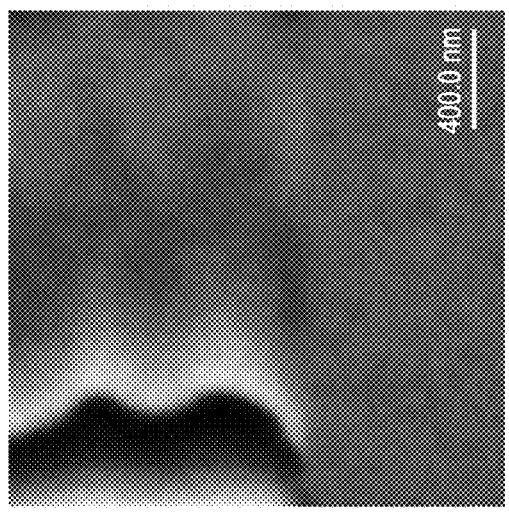
Figure 8:
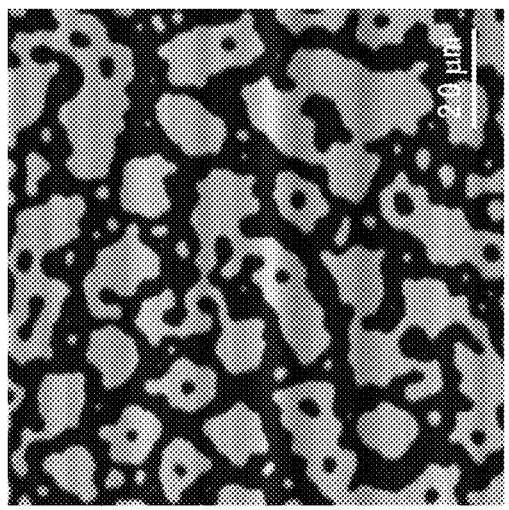
Figure 11:
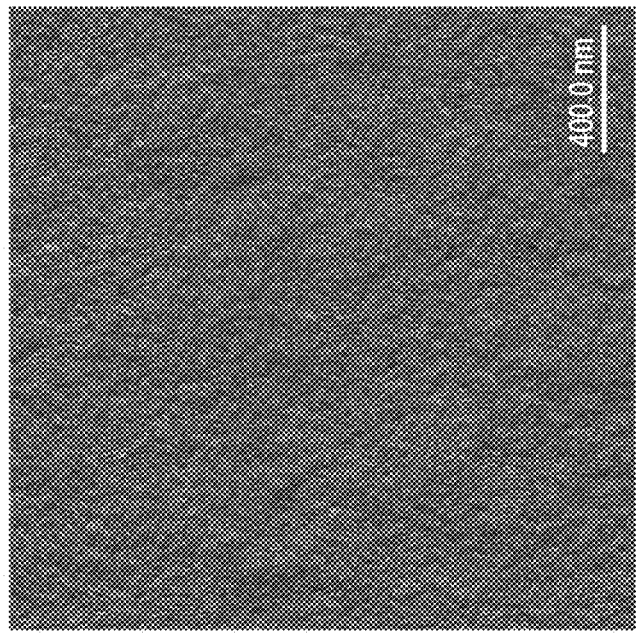
FIGS. 11-13 are AFM top down images of the perpendicular lamellae morphology of Examples 54-56, respectively.
Figure 12:
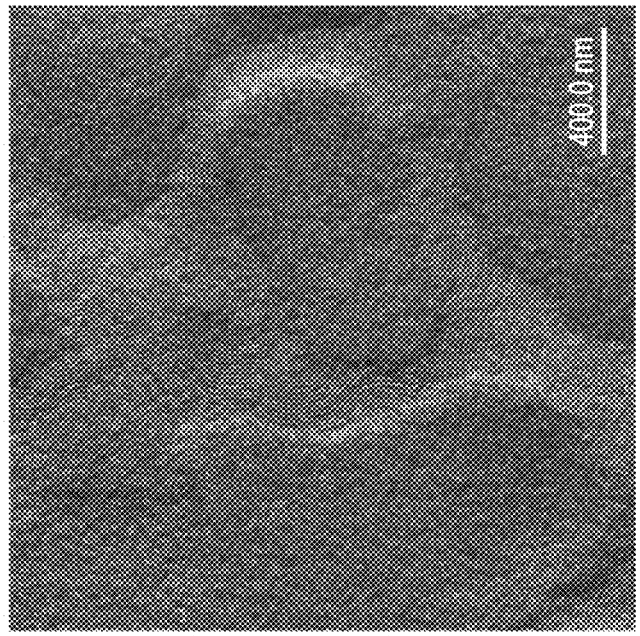
Figure 14:
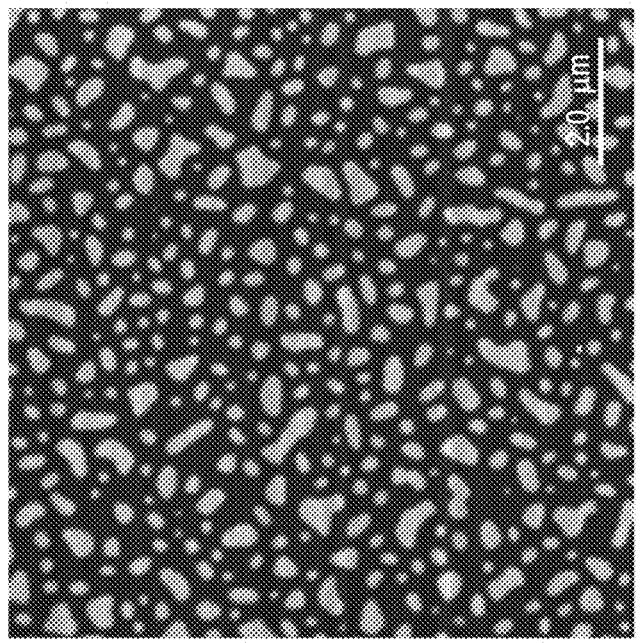
FIG. 14 is a top down AFM image of the island/hole morphology of Example 61.
Figure 13:
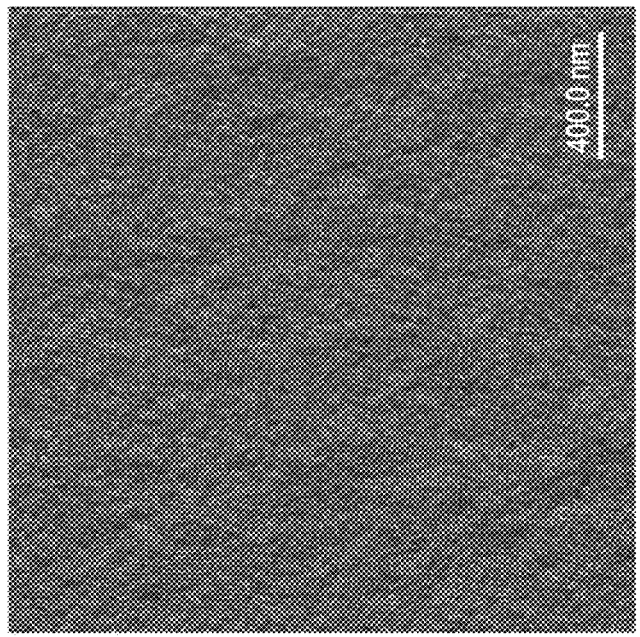
Figure 16A:
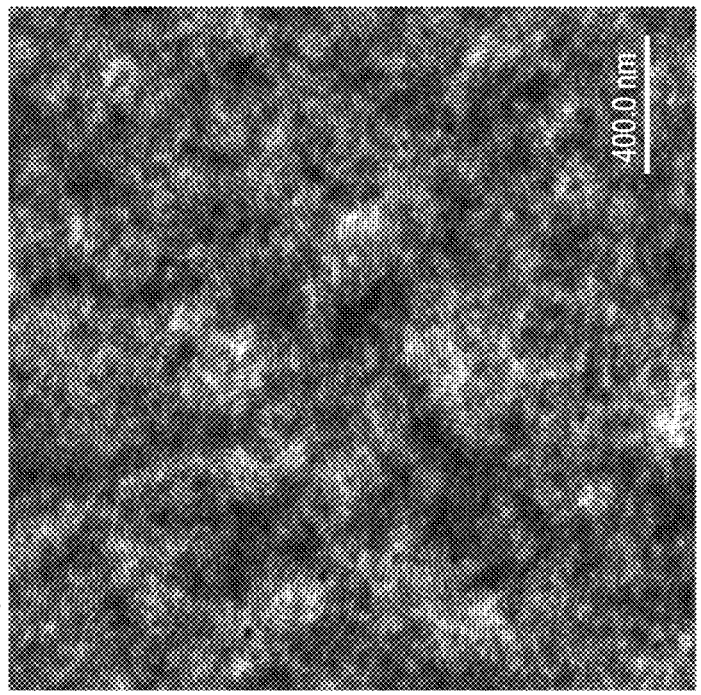
FIGS. 16A-16B are AFM and SEM top down views, respectively, of the perpendicular lamellae of Example 67.
Figure 15:
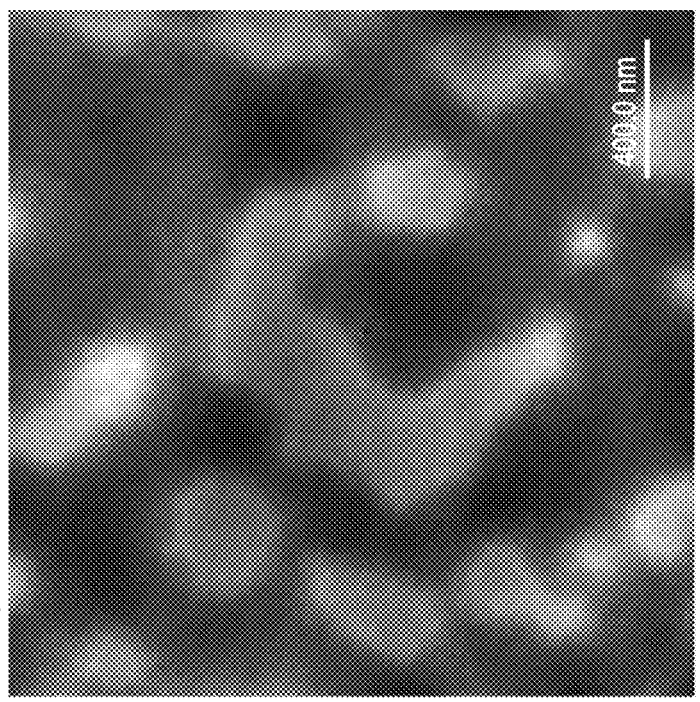
FIG. 15 is a top down AFM image of the partially perpendicular morphology of Example 66.
Figure 17:
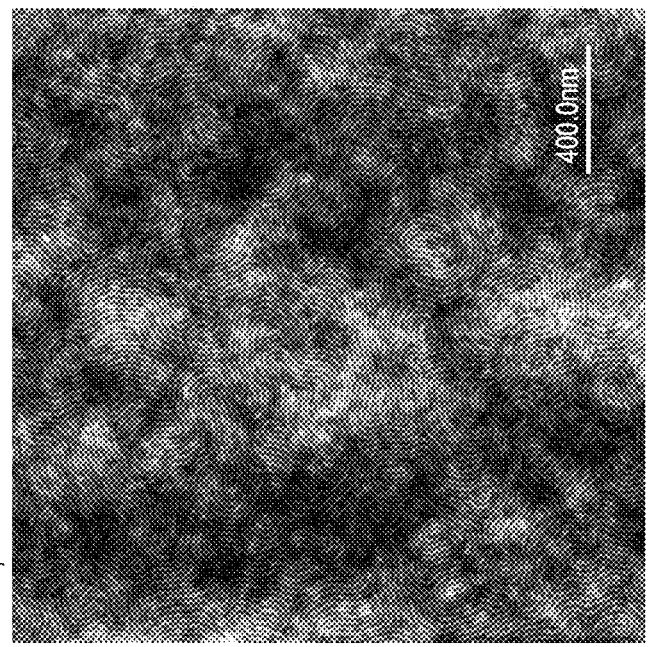
FIG. 17 is a top down AFM image of the perpendicular lamellae of Example 68.
Figure 16B:
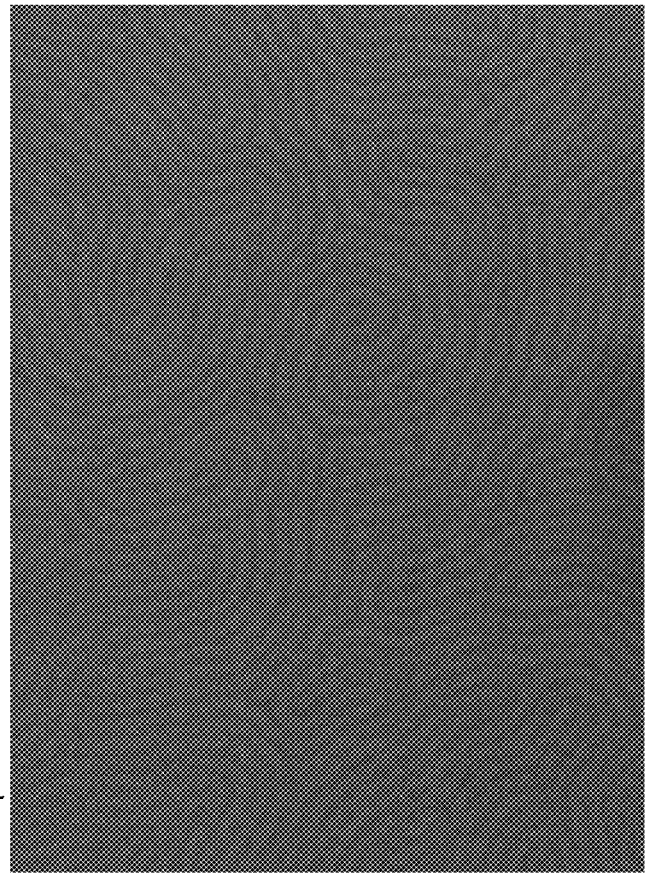

"perp" = perpendicular junction group
"linear" = linear junction group
"non-F" = non-fluorinated junction group FIGS. 8-10 are AFM top down images of the island/hole morphology of Examples 46, 49, and 52, respectively. FIGS. 11-13 are AFM top down images of the perpendicular lamellae morphology of Examples 54-56, respectively. FIG. 14 is a top down AFM image of the island/hole morphology of Example 61. FIG. 15 is a top down AFM image of the partially perpendicular morphology of Example 66. FIGS. 16A-16B are AFM and SEM top down views, respectively, of the perpendicular lamellae of Example 67. FIG. 17 is a top down AFM image of the perpendicular lamellae of Example 68.

It is desirable to have a TMSS content of block A as high as possible in order to maximize the chi parameter and the etch contrast. The results indicate that when the TMSS content of block A was more than about 53 mol % (Examples 45-53 and 57-59), the block polymer was not able to self-assemble to form perpendicularly oriented lamellae on any of the underlayers, using junction groups containing 0 fluorines (Examples 45-47), 17 fluorines on a side chain (type B, perpendicular, Examples 48-50), or 20 fluorines linked to backbone carbons (type C, linear, Examples 51-53). The results indicate that for self-assembly to produce perpendicular lamellae with good etch capability, the block copolymer can comprise i) a block A comprising TMSS:Sty molar ratio of about 25:75 to 60:40, more specifically about 25:75 to 53:47, and ii) a perpendicular junction group L' having 15 to about 25 fluorines (Examples 55-56 and 66-68). The results also show that block A can comprise TMSS in an amount of about 8-11 wt % based on total weight of block A.

Etch Uniformity

Example 69

The etchable domain (PMTC-Me) of the self-assembled layer of Example 55 (formulation F-4 on UL-2, block copolymer BCP-3, ~15 nm pitch (7.5 nm half-pitch), 8 wt % silicon in block A, junction group B) was etched away in a Lam Research 4520 XLe dielectric etch tool for 5 seconds under the following conditions: pressure=500 mT, oxygen flow rate=136 sccm, lower electrode power=50 W, upper electrode power=0 W, and the gap between the electrodes was 2.25 cm. FIGS. 18A-18B are SEMs showing a top-down view and cross-sectional view, respectively, of the results of the etch, demonstrating the small feature size/pitch.

Example 70

Figure 19A:
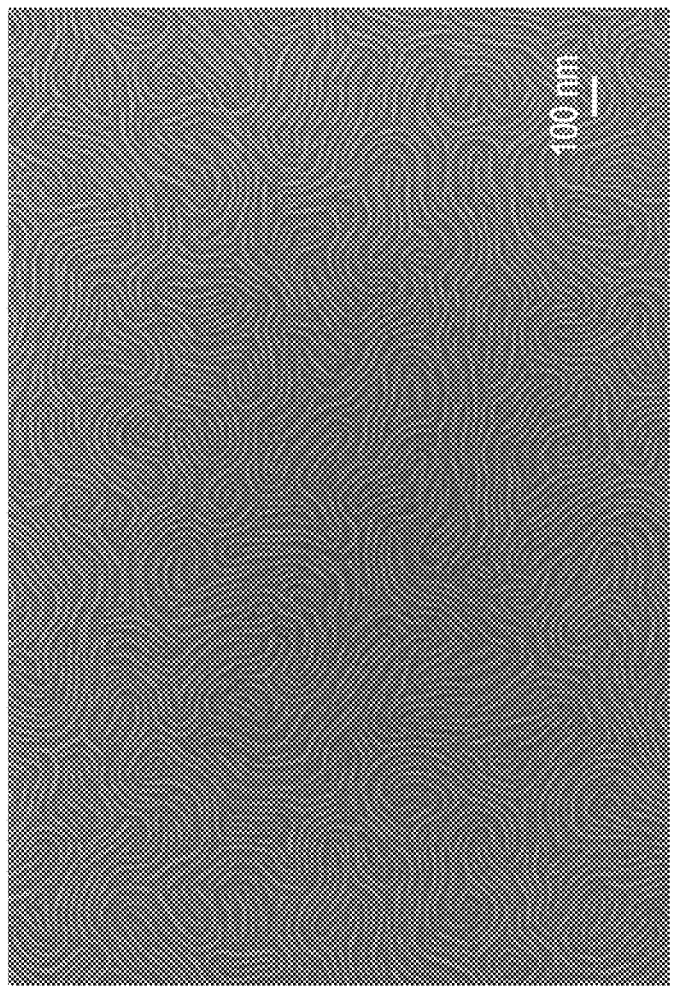

For comparison, the etchable domain (PMTC-Me) of the self-assembled layer of Example 65 (formulation F-8 on UL-2, block copolymer BCP-7, ~16 nm pitch (8 nm half-pitch), 0 wt % silicon in block A, junction group B) was etched in the Lam Research 4520 XLe dielectric etcher for 7 seconds under the same conditions described above in Example 58, except at a pressure of 300 mT. The result of this etch, shown in FIGS. 19A-19B (SEM top down views at different magnification) and FIG. 19C (cross-sectional view), respectively, demonstrates the collapse of the poly (styrene) domain at a 16 nm pitch when no silicon is present.

Example 71

Figures 20A, 20B:
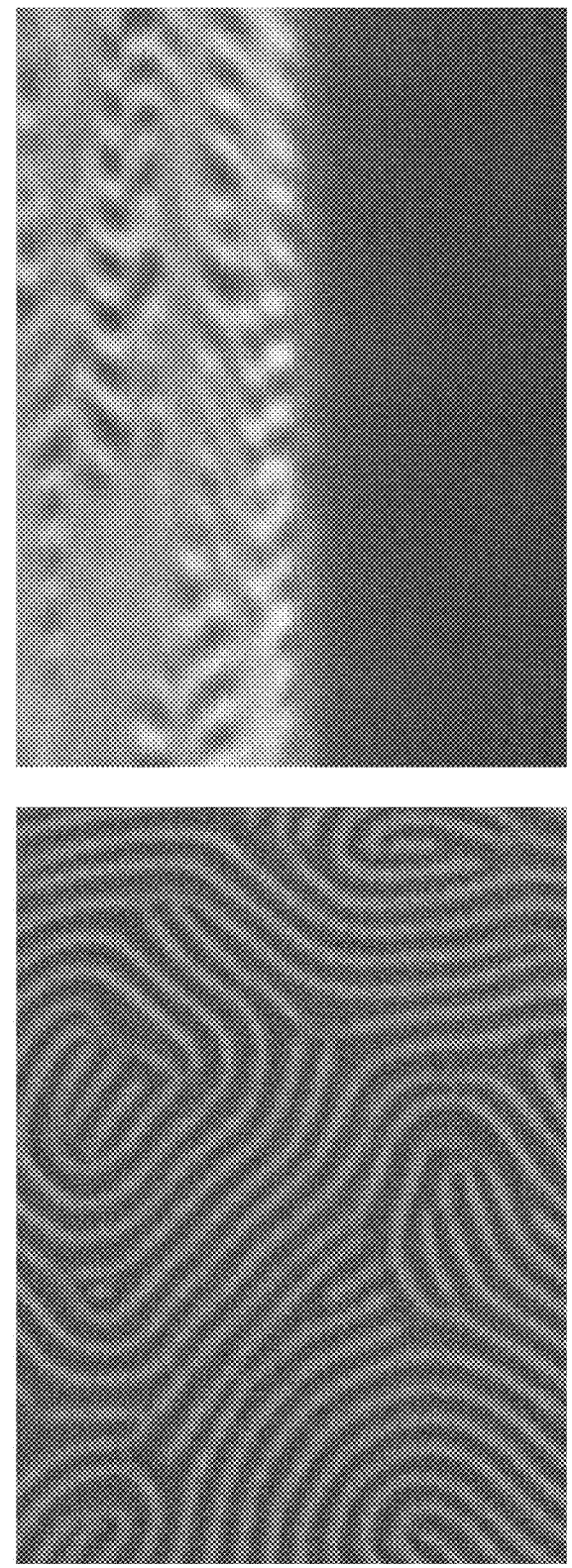
FIGS. 20A-20B are top-down and cross-sectional views of scanning electron micrograph (SEM) images of the etched domain pattern of thin film Example 67 (10 wt % silicon in block A) after selective removal of the polycarbonate domain, described in Example 71.

The etchable domain (PMTC-Me) of the self-assembled layer of Example 67 (formulation F-10 on UL-4, block copolymer BCP-8, ~18 nm pitch (9 nm half-pitch), 10.4 wt % silicon in block A, junction group D) was etched away in a Lam Research 4520 XLe dielectric etch tool for 5 seconds under the following conditions: pressure=500 mT, oxygen flow rate=136 sccm, lower electrode power=50 W, upper electrode power=0 W, and the gap between the electrodes was 2.25 cm. FIGS. 20A-20B are SEMs showing a top-down view and cross-sectional view, respectively, of the results of the etch, demonstrating the small uniform feature size/pitch.

The results indicate that for good etch and perpendicular lamellae formation, block A can contain 5-11 wt %, preferably 8-11 wt % of TMSS, based on total weight of block A.

GISAXS Analysis

Examples 72-77

The film samples for grazing incidence small angle x-ray scattering (GISAXS) were prepared as described above. GISAXS is a versatile tool to characterize morphology and orientation of domains in thin films as it combines features from traditional small angle x-ray scattering and x-ray reflectivity. GISAXS was collected at the Advanced Light Source (ALS) at Lawrence Berkeley National Laboratory (LBNL) at beam line 7.3.3 (A. Hexemer, et al., "A SAXS/WAXS/GISAXS Beamline with Multilayer Monochromator", J. Phys. Conf. Ser. 2010, 247, 012007). The incident X-ray energy was 10 keV and the sample to detector distance was 4 meters. The grazing incidence angle was chosen to be between the critical angle of the polymer and the substrate, thereby creating standing waves within the films which amplify the scattering and ensure full penetration of the film. A Pilatus 2M area detector was used to record the scattered intensity of the x-rays over a range of exit angles and scattering angles. Data were normalized for incoming x-ray intensity, film thickness and wafer size, averaged, and integrated along the scattering in-plane at $q_x=0.028$ Å$^{-1}$ using the IRENA package, developed by I. Ilaysky, et al., "Irena: tool suite for modeling and analysis of small-angle scattering", J. Appl. Cryst. (2009), 42(2), pages 347-353. The intensity distribution along this scattering plane provides information about the ordering normal to the surface of the thin film. The scattering profiles were analyzed by fitting a series of Voigt peaks and an exponential background to the 1D data. The morphology within the thin film can be extracted from the sequence of the observed Bragg peaks as only certain reflections from specific hkl lattices are allowed depending on the space group of the structure. Reflections from the (100), (200), (300), (400) etc. lattices are observed for lamellar structures with the space group Pm. The position of the 1$^{st}$ order Bragg peak is directly correlated to the spacing of the lattice by $d=2\pi/q$ and was used to calculate the BCP pitch. The orientation with respect to the substrate was determined by the appearance and intensity of the higher order Bragg peaks as the scattering along the in-plane only originates from perpendicular structures while parallel structures contribute to out-of-plane scattering. The GISAXS results are summarized in Table 9.

TABLE 9

| | | | | | GISAXS Results | |
| --- | --- | --- | --- | --- | --- | --- |
| GISAXS Example | Thin Film Example | Underlayer Name | Formulation | Morphology | Perpendicular Orientation Yes/No | BCP Pitch [nm] |
| 72 | 54 | UL-1 | F-4 | Lamellae | Yes | 15.1 |
| 73 | 55 | UL-2 | F-4 | Lamellae | Yes | 15.1 |
| 74 | 56 | UL-3 | F-4 | Lamellae | Yes | 15.1 |
| 75 | 57 | UL-2 | F-5 | Lamellae | No | 16.3 |
| 76 | 58 | UL-3 | F-5 | * | No | 16.3 |
| 77 | 59 | UL-4 | F-5 | * | No | * |

Figure 21:
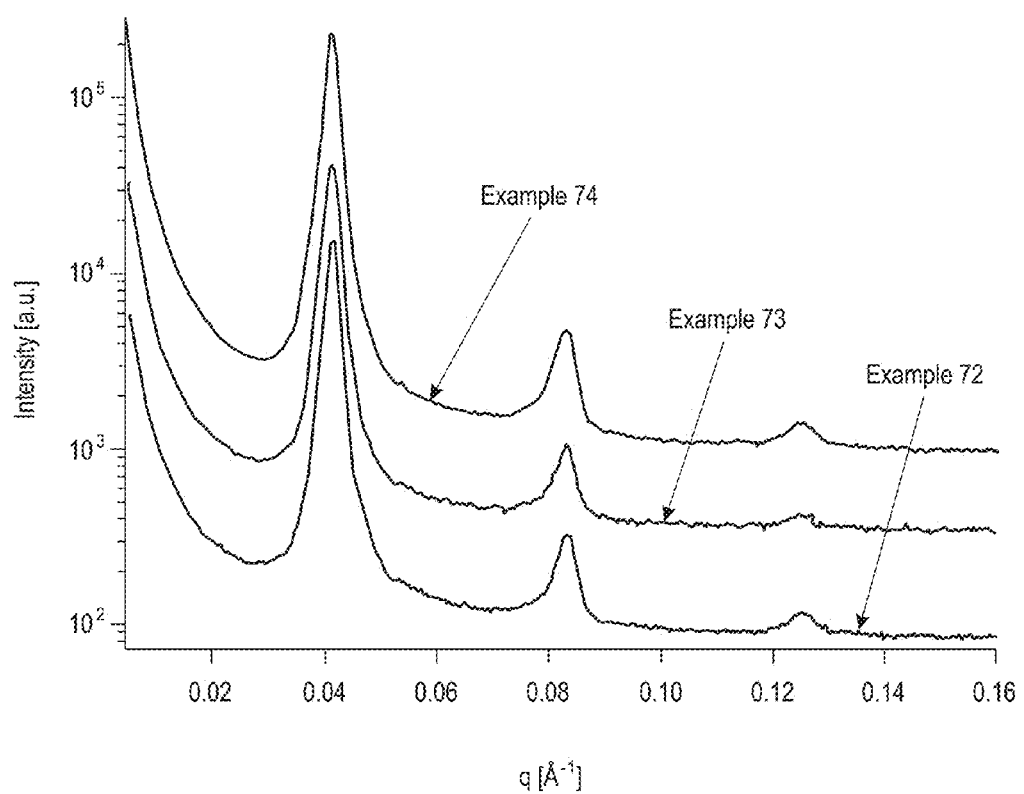
FIG. 21 is a graph showing the GISAXS results for Examples 72-74 of Table 9.
Figure 22:
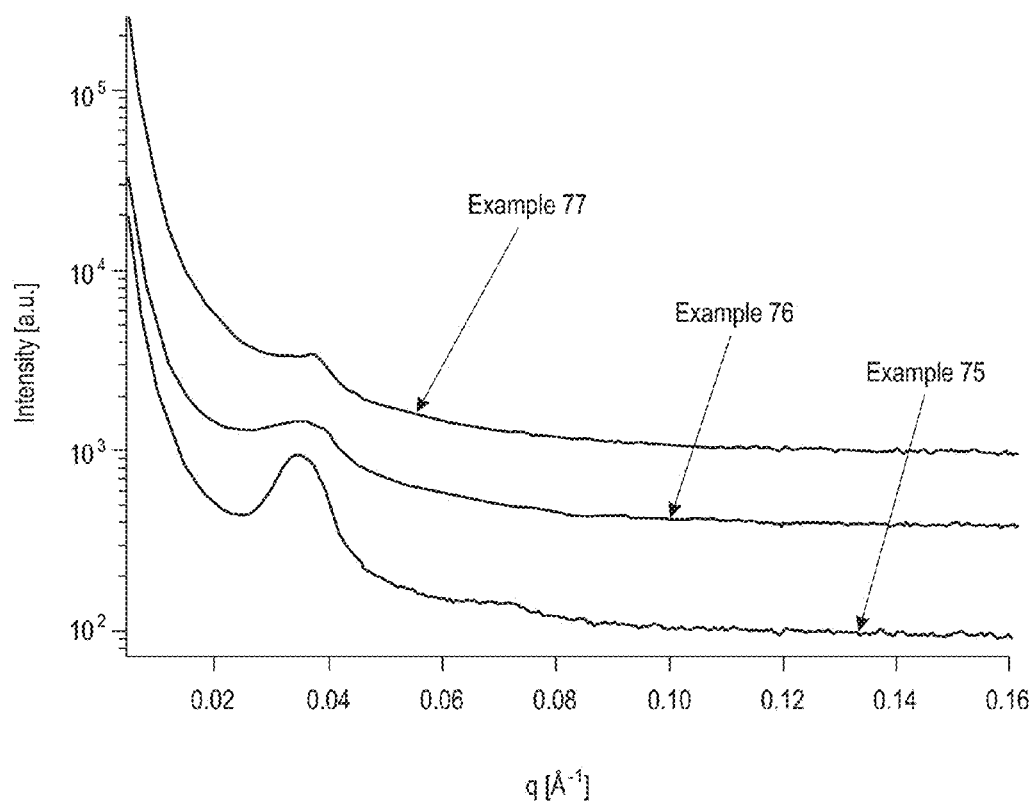
FIG. 22 is a graph showing the GISAXS results for Examples 75-77 of Table 9.

* in-plane scattered intensity not sufficient to determine morphology and/or BCP pitch FIG. 21 is a graph showing the GISAXS results for Examples 72-74 of Table 9. FIG. 22 is a graph showing the GISAXS results for Examples 75-77 of Table 9. All plots show in-plane scattering profiles. Peaks in the in-plane direction originate from perpendicular structures in the thin film. Thus, if a strong first order peak and additionally a second and/or third order peak are observed, the film morphology is mainly perpendicular lamellae. First, second and third order peaks are visible in the plots of FIG. 21 corresponding to thin film Examples 54-56, which self-assembled to form perpendicularly oriented lamellae. Only weak first order peaks are seen in FIG. 22 corresponding to thin film Examples 57-59, which did not self-assemble to form perpendicular lamellae. The sequence of the peaks gives an indication of the morphology. If the peak positions are at ratios of 1:2:3, then the morphology is lamellar as explained in the paragraph above. The pitch was calculated from the position of the first order peak (lowest q).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A linear block copolymer comprising:
a first block (block A), wherein block A is a random copolymer chain comprised of about 37-55 mol % of first repeat units of structure (A-2):

(A-2)

and
about 63-45 mol % of second repeat units of structure (A-3):

(A-3)

wherein the first repeat units and the second repeat units are covalently linked in block A;
a second block (block B) comprising covalently linked aliphatic repeat units selected from the group consisting of aliphatic carbonate repeat units, aliphatic ester repeat units, aliphatic ether repeat units, and combinations thereof; and a divalent linking group L' (junction group) which covalently joins an end repeat unit of block A to an end repeat unit of block B;

wherein the block copolymer has a polymer backbone that includes the atomic centers 1 and 2 of both (A-2) and (A-3), one or more atomic centers of the aliphatic repeat unit of block B, and one or more atomic centers of L', L' comprises 1-25 fluorines, wherein none of the fluorines of L' is linked to an atomic center of the polymer backbone, and the block copolymer is capable of self-assembly to form a domain pattern comprising phase-segregated perpendicularly oriented alternating domains, the domains comprising respective chemically distinct blocks of the block copolymer.

2. The block copolymer of claim 1, wherein 90 mol % to 100 mol % of block B is comprised of aliphatic carbonate repeat units of structure (A-4):

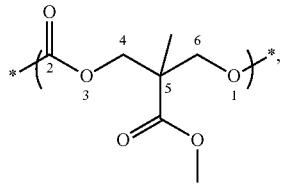

(A-4)

wherein atomic centers 1-6 are atomic centers of the polymer backbone.

3. The block polymer of claim 2, wherein block B is a homopolymer chain of structure (A-4).

4. The block copolymer of claim 1, wherein L' comprises 15-25 fluorines.

5. The block copolymer of claim 1, wherein the domain pattern has a bulk periodicity (Lo) of between about 4 nm and about 28 nm.

6. The block copolymer of claim 1, wherein L' has a lower surface energy than block A and a lower surface energy than block B.

7. The block polymer of claim 1, wherein L' has a surface energy between 0 and 30 mN/m.

8. The block polymer of claim 1, wherein the mol % of the first repeat unit (A-2) of block A plus the mol % of the second repeat unit (A-3) of block A is 100 mol %.

9. The block polymer of claim 1, wherein L' has a structure according to formula (A-5):

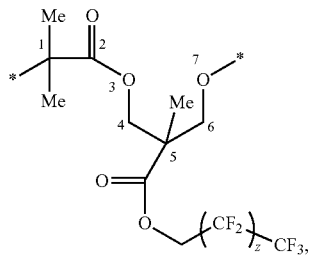

(A-5)

wherein z is a positive integer having a value of 0 to 11, and the numbered atomic centers of L' are atomic centers of the backbone of the block copolymer.

10. The block polymer of claim 9, wherein z is 7.

11. The block polymer of claim 9, wherein z is 9.

12. The block polymer of claim 1, wherein L' has a structure according to (A-6):

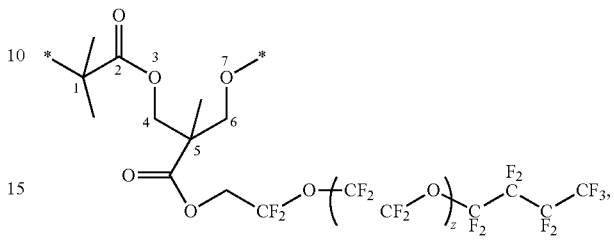

(A-6)

wherein z is a positive integer having a value of 1-7, and the numbered atomic centers are atomic centers of the backbone of the block copolymer.

13. A composition, comprising:
a solvent; and
the block copolymer of claim 1 in contact with the solvent;

wherein
the composition is capable of forming a film layer comprising the block copolymer, wherein the film layer is capable of self-assembling when thermally annealed, thereby forming a pattern of phase-segregated perpendicularly oriented alternating domains comprising respective chemically distinct blocks of the block copolymer.

14. A method, comprising:
providing a first layered structure comprising an underlayer;

forming a film layer comprising the block copolymer of claim 1 disposed on the underlayer, wherein the film layer has a top surface in contact with an atmosphere interface; and thermally annealing the film layer, thereby forming a second layered structure comprising a self-assembled domain pattern of the block copolymer, the domain pattern comprising phase-segregated perpendicularly oriented alternating domains comprising respective chemically distinct blocks of the block copolymer and having a characteristic pitch (Lo).

15. The method of claim 14, wherein the domain pattern comprises lamellar domains.

16. The method of claim 14, wherein the domain pattern comprises cylindrical domains.

17. The method of claim 14, wherein Lo is between 4 nm and 28 nm.

18. The method of claim 14, wherein the underlayer is preferentially wetted by one of the domains.

19. The method of claim 14, wherein the underlayer is a poly(styrene-r-methyl methacrylate) random copolymer brush.

20. The method of claim 14, wherein the atmosphere interface is preferentially wetted by one of the domains.

21. The method of claim 14, wherein said inducing the block copolymer of the film layer to self-assemble using a thermal treatment comprises baking the film layer at a temperature between about 80° C. and about 250° C. for a time period between about 1 second and about 24 hours.

22. The method of claim 14, comprising selectively etching one of the domains, thereby forming a third layered structure comprising an etched domain pattern comprising one or more remaining domains of the self-assembled block copolymer.

23. The method of claim 22, comprising transferring the etched domain pattern to the substrate.

24. The method of claim 23, wherein said transferring the etched domain pattern to the substrate is performed using a tone inversion process with respect to the etched domain pattern.

25. A linear block copolymer for self-assembly, comprising:
a first block (block A), wherein block A is a random copolymer chain comprised of about 37-55 mol % of first repeat units of structure (A-2):

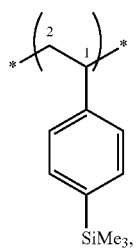

(A-2)

and
about 63-45 mol % of a second repeat units of structure (A-3):

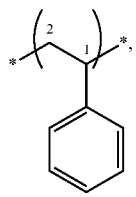

(A-3)

wherein the first repeat units and the second repeat units are covalently linked in block A;
a second block (block B) of which 90-100 mol % is aliphatic carbonate repeat units of structure (A-4):

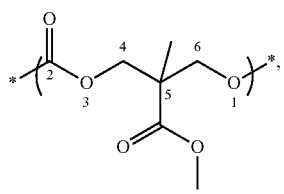

(A-4)

wherein the carbonate repeat units are covalently linked in block B; and
a divalent linking group L' (junction group) which covalently joins an end repeat unit of block A to an end repeat unit of block B, wherein L' is selected from the group consisting of

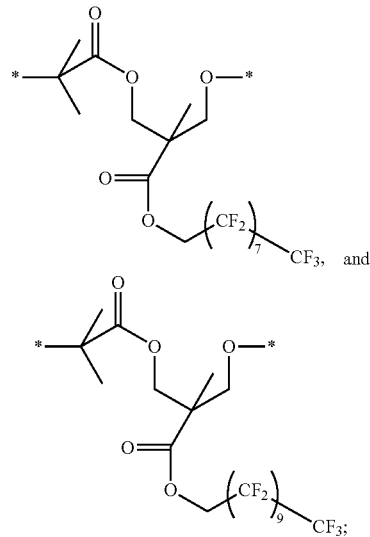

wherein
the block copolymer has a backbone that includes the atomic centers 1 and 2 of both (A-2) and (A-3), the atomic centers 1-6 of (A-4), and one or more atomic centers of L',
none of the fluorines of L' is linked to an atomic center of the backbone of the block copolymer, and
the block copolymer is capable of self-assembly to form a domain pattern comprising phase-segregated perpendicularly oriented alternating domains, the domains comprising respective chemically distinct blocks of the block copolymer.

26. A method, comprising:
providing a first multi-layered structure comprising a top surface having a pre-pattern for directing self-assembly of the block copolymer of claim 1;
forming a film layer comprising the block copolymer disposed on the top surface of pre-pattern, the film layer comprising a top surface in contact with an atmosphere interface, and the film layer comprising a bottom surface in contact with the top surface of the pre-pattern; and
inducing the block copolymer of the film layer to self-assemble using a thermal treatment, thereby forming a second multi-layered structure comprising a domain pattern of phase-segregated perpendicularly oriented self-assembled domains of the block copolymer, the domains comprising respective chemically distinct blocks of the block copolymer, the domains disposed on the top surface of the pre-pattern.

* * * * *